United States Patent
Suzuki et al.

(10) Patent No.: US 6,788,239 B2
(45) Date of Patent: Sep. 7, 2004

(54) A/D CONVERTER CIRCUIT AND CURRENT SUPPLY CIRCUIT

(75) Inventors: Hisao Suzuki, Kasugai (JP); Shogo Itoh, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/426,636

(22) Filed: May 1, 2003

(65) Prior Publication Data

US 2003/0218559 A1 Nov. 27, 2003

(30) Foreign Application Priority Data

| May 27, 2002 | (JP) | ........................................ 2002-152053 |
| Oct. 21, 2002 | (JP) | ........................................ 2002-305613 |
| Oct. 28, 2002 | (JP) | ........................................ 2002-312668 |

(51) Int. Cl.[7] .............................................. H03M 1/36
(52) U.S. Cl. ......................... 341/159; 341/101; 341/155
(58) Field of Search ................................. 341/159, 155, 341/101, 100

(56) References Cited

U.S. PATENT DOCUMENTS

| 4,987,417 A | | 1/1991 | Buckland |
| 5,499,028 A | * | 3/1996 | Kuwano et al. ............. 341/159 |
| 5,736,953 A | | 4/1998 | Yamaguchi |
| 5,745,066 A | | 4/1998 | Hirooka et al. |
| 5,757,302 A | | 5/1998 | Hino |
| 6,091,353 A | * | 7/2000 | Ariel et al. ................... 341/159 |
| 6,288,668 B1 | * | 9/2001 | Tsukamoto et al. .......... 341/159 |
| 6,362,762 B1 | * | 3/2002 | Jensen et al. ................ 341/141 |
| 6,453,309 B1 | * | 9/2002 | Kananen et al. ............. 341/155 |
| 6,608,582 B2 | * | 8/2003 | Casper et al. ................ 341/155 |
| 6,707,412 B2 | * | 3/2004 | Suzuki ......................... 341/156 |

FOREIGN PATENT DOCUMENTS

| JP | 55-115724 | 9/1980 |
| JP | 56-089128 | 7/1981 |
| JP | 2000-341124 | 12/2000 |

* cited by examiner

*Primary Examiner*—Michael Tokar
*Assistant Examiner*—Lam T. Mai
(74) *Attorney, Agent, or Firm*—Arent Fox PLLC

(57) ABSTRACT

It is intended to provide an A/D converter circuit with which, by using a clock signal, on the basis of an analog voltage inputted a predetermined time past, it is possible to select suitably comparators to be operated and comparators to be rested, and which has small consumed power. A parallel-type A/D-converter circuit 200 converts an analog voltage VIN to a digital value DOUT at intervals of a predetermined period by means of a clock signal CLK using chopper-type comparators 1–7. The comparators 1–7 can each be set by first and second setting signals CONT1A etc. to either of an operating state and a resting state. A comparator control circuit section 211 performs logical processing on the comparator outputs OUT1–OUT7 in the preceding conversion to generate the first and second setting signals CONT1A etc., and brings some of the comparators to the operating state and holds the remaining comparators in the resting state.

49 Claims, 42 Drawing Sheets

EXPLANATORY VIEW SHOWING OUTLINE OF COMPARISON SECTION OF A/D CONVERTER CIRCUIT DIRECTED TO EMBODIMENT 3

FIG. 2 EXPLANATORY VIEW SHOWING OUTLINE OF COMPARISON SECTION OF A/D CONVERTER CIRCUIT DIRECTED TO EMBODIMENT 1

FIG. 3

TABLE SHOWING RELATIONSHIP OF INPUT VOLTAGE OUTPUTS OF CONVERSION COMPARATORS AND OUTPUT CODES IN A/D CONVERTER CIRCUIT DIRECTED TO EMBODIMENTS 1 AND 2

| INPUT VOLTAGE (VIN VOLTAGE) | OUTPUT OF EACH CONVERSION COMPARATOR (OUT1~OUT7) | | | | | | | OUTPUT CODE |
|---|---|---|---|---|---|---|---|---|
| | 1 | 2 | 3 | 4 | 5 | 6 | 7 | |
| VRL~V1 | L | L | L | L | L | L | L | 0 |
| V1~V2 | H | L | L | L | L | L | L | 1 |
| V2~V3 | H | H | L | L | L | L | L | 2 |
| V3~V4 | H | H | H | L | L | L | L | 3 |
| V4~V5 | H | H | H | H | L | L | L | 4 |
| V5~V6 | H | H | H | H | H | L | L | 5 |
| V6~V7 | H | H | H | H | H | H | L | 6 |
| V7~VRH | H | H | H | H | H | H | H | 7 |

FIG. 4

TABLE SHOWING RELATIONSHIP OF INPUTTED VOLTAGE OF PREDETERMINED PAST OUTPUTS OF SETTING COMPARATORS AND SET STATES OF CONVERSION COMPARATORS IN A/D CONVERTER CIRCUIT DIRECTED TO EMBODIMENT 1

| INPUT VOLTAGE (VIN VOLTAGE) | OUTPUT OF EACH SETTING COMPARATOR (OP1~OP7) | | | | | | | SET STATE OF EACH CONVERSION COMPARATOR | | | | | | |
|---|---|---|---|---|---|---|---|---|---|---|---|---|---|---|
| | P1 | P2 | P3 | P4 | P5 | P6 | P7 | 1 | 2 | 3 | 4 | 5 | 6 | 7 |
| VRL~V1 | L | L | L | L | L | L | L | O | Δ/L | Δ/L | Δ/L | Δ/L | Δ/L | Δ/L |
| V1~V2 | H | L | L | L | L | L | L | O | O | Δ/L | Δ/L | Δ/L | Δ/L | Δ/L |
| V2~V3 | H | H | L | L | L | L | L | Δ/H | O | O | Δ/L | Δ/L | Δ/L | Δ/L |
| V3~V4 | H | H | H | L | L | L | L | Δ/H | Δ/H | O | O | Δ/L | Δ/L | Δ/L |
| V4~V5 | H | H | H | H | L | L | L | Δ/H | Δ/H | Δ/H | O | O | Δ/L | Δ/L |
| V5~V6 | H | H | H | H | H | L | L | Δ/H | Δ/H | Δ/H | Δ/H | O | O | Δ/L |
| V6~V7 | H | H | H | H | H | H | L | Δ/H | Δ/H | Δ/H | Δ/H | Δ/H | O | O |
| V7~VRH | H | H | H | H | H | H | H | Δ/H | Δ/H | Δ/H | Δ/H | Δ/H | Δ/H | O |

O : OPERATING STATE
Δ : RESTING STATE
Δ/H : RESTING STATE AND "H" OUTPUT
Δ/L : RESTING STATE AND "L" OUTPUT

EXPLANATORY VIEW SHOWING CONSTRUCTION OF MAIN PART OF CHOPPER-TYPE CONVERSION COMPARATOR

TABLE SHOWING RELATIONSHIP OF OPERATIONS AND SWITCHES OF MAIN PART OF CHOPPER-TYPE CONVERSION COMPARATOR SHOWN IN FIG.5

| OPERATION | SWA | SWB | SWC |
|---|---|---|---|
| FETCH VIN VOLTAGE | ON | OFF | ON |
| COMPARE (RESTING STATE) | OFF | ON | OFF |

CIRCUIT DIAGRAM SHOWING CIRCUIT CONSTRUCTION OF INVERTER ELEMENT

GRAPH SHOWING RELATIONSHIP OF INPUT VOLTAGE AND DRAIN CURRENT OF INVERTER ELEMENT IN FIG.7

FIG. 9 EXPLANATORY VIEW SHOWING CONSTRUCTION OF CHOPPER-TYPE CONVERSION COMPARATOR

FIG. 10  EXPLANATORY VIEW SHOWING CONSTRUCTION OF DIFFERENTIAL-TYPE SETTING COMPARATOR

EXPLANATORY VIEW SHOWING RELATIONSHIP OF CLOCK SIGNAL CLK AND THIRD CLOCK SIGNAL CLK3 OF CASE WHERE SETTING COMPARATORS ARE DRIVEN BY THIRD CLOCK SIGNAL CLK3 DIFFERENT FROM CLOCK SIGNAL CLK

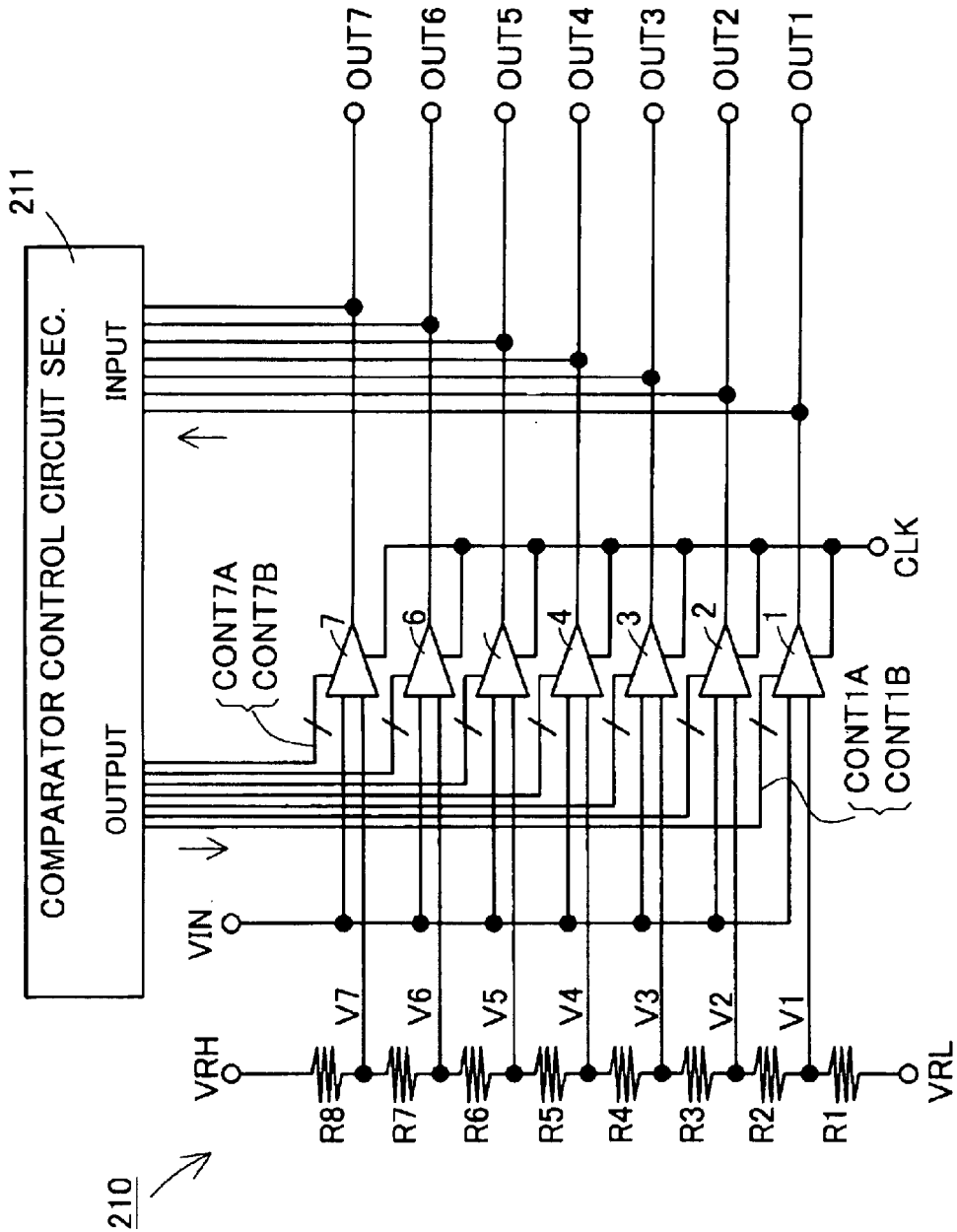
FIG. 12 EXPLANATORY VIEW SHOWING OUTLINE OF COMPARISON SECTION OF A/D CONVERTER CIRCUIT DIRECTED TO EMBODIMENT 2

FIG. 13

TABLE SHOWING RELATIONSHIP OF INPUT VOLTAGE USED IN PRECEDING CONVERSION OUTPUTS OF COMPARATORS OUTPUT CODES AND SET STATES OF COMPARATORS FOR PRESENT CONVERSION IN A/D CONVERTER CIRCUIT DIRECTED TO EMBODIMENT 2 AND VARIANT 1

| INPUT VOLTAGE (VIN VOLTAGE) | OUTPUT OF EACH COMPARATOR (OUT1~OUT7) | | | | | | | OUTPUT CODE DOUT | SET STATE OF EACH COMPARATOR | | | | | | |
|---|---|---|---|---|---|---|---|---|---|---|---|---|---|---|---|
| | 1 | 2 | 3 | 4 | 5 | 6 | 7 | | 1 | 2 | 3 | 4 | 5 | 6 | 7 |
| VRL~V1 | L | L | L | L | L | L | L | 0 | O | O | △/L | △/L | △/L | △/L | △/L |
| V1~V2 | H | L | L | L | L | L | L | 1 | O | O | O | △/L | △/L | △/L | △/L |
| V2~V3 | H | H | L | L | L | L | L | 2 | △/H | O | O | O | △/L | △/L | △/L |
| V3~V4 | H | H | H | L | L | L | L | 3 | △/H | △/H | O | O | O | △/L | △/L |
| V4~V5 | H | H | H | H | L | L | L | 4 | △/H | △/H | △/H | O | O | O | △/L |
| V5~V6 | H | H | H | H | H | L | L | 5 | △/H | △/H | △/H | △/H | O | O | O |
| V6~V7 | H | H | H | H | H | H | L | 6 | △/H | △/H | △/H | △/H | △/H | O | O |
| V7~VRH | H | H | H | H | H | H | H | 7 | △/H | △/H | △/H | △/H | △/H | △/H | O |

O : OPERATING STATE
△ : RESTING STATE
△/H : RESTING STATE AND "H" OUTPUT
△/L : RESTING STATE AND "L" OUTPUT

EXPLANATORY VIEW ILLUSTRATING OPERATION OF A/D CONVERTER CIRCUIT OF EMBODIMENT 2 WHEN INPUTTING VOLTAGE WAVEFORM IN WHICH LARGE VOLTAGE CHANGES AND SMALL VOLTAGE CHANGES OCCUR ALTERNATELY

FIG. 15 EXPLANATORY VIEW SHOWING CONSTRUCTION OF DIFFERENTIAL-TYPE CONVERSION COMPARATOR USED IN A/D CONVERTER CIRCUIT DIRECTED TO VARIANT 1

EXPLANATORY VIEW SHOWING OUTLINE OF COMPARISON SECTION OF A/D CONVERTER CIRCUIT DIRECTED TO EMBODIMENT 3

FIG. 17

TABLE SHOWING RELATIONSHIP OF INPUT VOLTAGE AND COMPARATOR OUTPUTS AND OUTPUT CODES IN A/D CONVERTER CIRCUIT DIRECTED TO EMBODIMENT 3

| INPUT VOLTAGE (VIN VOLTAGE) | OUTPUT OF EACH COMPARATOR (OUT1~OUT15) | | | | | | | | | | | | | | | OUTPUT CODE DOUT |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | |
| VRL~V1 | L | L | L | L | L | L | L | L | L | L | L | L | L | L | L | 0 |
| V1~V2 | H | L | L | L | L | L | L | L | L | L | L | L | L | L | L | 1 |
| V2~V3 | H | H | L | L | L | L | L | L | L | L | L | L | L | L | L | 2 |
| V3~V4 | H | H | H | L | L | L | L | L | L | L | L | L | L | L | L | 3 |
| V4~V5 | H | H | H | H | L | L | L | L | L | L | L | L | L | L | L | 4 |
| V5~V6 | H | H | H | H | H | L | L | L | L | L | L | L | L | L | L | 5 |
| V6~V7 | H | H | H | H | H | H | L | L | L | L | L | L | L | L | L | 6 |
| V7~V8 | H | H | H | H | H | H | H | L | L | L | L | L | L | L | L | 7 |
| V8~V9 | H | H | H | H | H | H | H | H | L | L | L | L | L | L | L | 8 |
| V9~V10 | H | H | H | H | H | H | H | H | H | L | L | L | L | L | L | 9 |
| V10~V11 | H | H | H | H | H | H | H | H | H | H | L | L | L | L | L | 10 |
| V11~V12 | H | H | H | H | H | H | H | H | H | H | H | L | L | L | L | 11 |
| V12~V13 | H | H | H | H | H | H | H | H | H | H | H | H | L | L | L | 12 |
| V13~V14 | H | H | H | H | H | H | H | H | H | H | H | H | H | L | L | 13 |
| V14~V15 | H | H | H | H | H | H | H | H | H | H | H | H | H | H | L | 14 |
| V15~VRH | H | H | H | H | H | H | H | H | H | H | H | H | H | H | H | 15 |

FIG. 18

TABLE SHOWING RELATIONSHIP OF INPUT VOLTAGE USED IN PRECEDING CONVERSION SET STATES OF COMPARATORS BELONGING TO GROUPS AND RANGE OF OUTPUT CODES POSSIBLE IN PRESENT CONVERSION IN A/D CONVERTER CIRCUIT DIRECTED TO EMBODIMENT 3

| INPUT VOLTAGE (VIN VOLTAGE) | SET STATE OF EACH GROUP ||||||||  POSSIBLE OUTPUT CODE RANGE |
|---|---|---|---|---|---|---|---|---|---|
| | G1 | G2 | G3 | G4 | G5 | G6 | G7 | G8 | |
| VRL~V1 | ○ | ○ | △/L | △/L | △/L | △/L | △/L | △/L | 0~3 |
| V1~V2 | ○ | ○ | △/L | △/L | △/L | △/L | △/L | △/L | 0~3 |
| V2~V3 | ○ | ○ | ○ | △/L | △/L | △/L | △/L | △/L | 0~5 |
| V3~V4 | ○ | ○ | ○ | △/L | △/L | △/L | △/L | △/L | 0~5 |
| V4~V5 | △/H | △/H | ○ | ○ | △/L | △/L | △/L | △/L | 2~7 |
| V5~V6 | △/H | △/H | ○ | ○ | △/L | △/L | △/L | △/L | 2~7 |
| V6~V7 | △/H | △/H | ○ | ○ | ○ | △/L | △/L | △/L | 4~9 |
| V7~V8 | △/H | △/H | ○ | ○ | ○ | △/L | △/L | △/L | 4~9 |
| V8~V9 | △/H | △/H | △/H | ○ | ○ | ○ | △/L | △/L | 6~11 |
| V9~V10 | △/H | △/H | △/H | ○ | ○ | ○ | △/L | △/L | 6~11 |
| V10~V11 | △/H | △/H | △/H | △/H | ○ | ○ | ○ | △/L | 8~13 |
| V11~V12 | △/H | △/H | △/H | △/H | ○ | ○ | ○ | △/L | 8~13 |
| V12~V13 | △/H | △/H | △/H | △/H | △/H | ○ | ○ | ○ | 10~15 |
| V13~V14 | △/H | △/H | △/H | △/H | △/H | ○ | ○ | ○ | 10~15 |
| V14~V15 | △/H | △/H | △/H | △/H | △/H | △/H | ○ | ○ | 12~15 |
| V15~VRH | △/H | △/H | △/H | △/H | △/H | △/H | ○ | ○ | 12~15 |

○ : OPERATING STATE
△ : RESTING STATE
△/H : RESTING STATE AND "H" OUTPUT
△/L : RESTING STATE AND "L" OUTPUT

FIG. 19

TABLE SHOWING RELATIONSHIP OF INPUT VOLTAGE USED IN PRECEDING CONVERSION SET STATES OF COMPARATORS AND RANGE OF OUTPUT CODES POSSIBLE IN PRESENT CONVERSION IN A/D CONVERTER CIRCUIT DIRECTED TO EMBODIMENT 3

| INPUT VOLTAGE (VIN VOLTAGE) | SET STATE OF EACH COMPARATOR | | | | | | | | | | | | | | | POSSIBLE OUTPUT CODE RANGE |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | |
| VRL~V1 | O | O | O | △/L | △/L | △/L | △/L | △/L | △/L | △/L | △/L | △/L | △/L | △/L | △/L | 0~3 |
| V1~V2 | O | O | O | △/L | △/L | △/L | △/L | △/L | △/L | △/L | △/L | △/L | △/L | △/L | △/L | 0~3 |
| V2~V3 | O | O | O | O | O | △/L | △/L | △/L | △/L | △/L | △/L | △/L | △/L | △/L | △/L | 0~5 |
| V3~V4 | O | O | O | O | O | △/L | △/L | △/L | △/L | △/L | △/L | △/L | △/L | △/L | △/L | 0~5 |
| V4~V5 | △/H | O | O | O | O | O | O | △/L | △/L | △/L | △/L | △/L | △/L | △/L | △/L | 2~7 |
| V5~V6 | △/H | △/H | O | O | O | O | O | △/L | △/L | △/L | △/L | △/L | △/L | △/L | △/L | 2~7 |
| V6~V7 | △/H | △/H | △/H | O | O | O | O | O | O | △/L | △/L | △/L | △/L | △/L | △/L | 4~9 |
| V7~V8 | △/H | △/H | △/H | △/H | O | O | O | O | O | △/L | △/L | △/L | △/L | △/L | △/L | 4~9 |
| V8~V9 | △/H | △/H | △/H | △/H | △/H | O | O | O | O | O | O | △/L | △/L | △/L | △/L | 6~11 |
| V9~V10 | △/H | △/H | △/H | △/H | △/H | △/H | O | O | O | O | O | △/L | △/L | △/L | △/L | 6~11 |
| V10~V11 | △/H | △/H | △/H | △/H | △/H | △/H | △/H | O | O | O | O | O | O | △/L | △/L | 8~13 |
| V11~V12 | △/H | △/H | △/H | △/H | △/H | △/H | △/H | O | O | O | O | O | O | △/L | △/L | 8~13 |
| V12~V13 | △/H | △/H | △/H | △/H | △/H | △/H | △/H | △/H | △/H | O | O | O | O | O | O | 10~15 |
| V13~V14 | △/H | △/H | △/H | △/H | △/H | △/H | △/H | △/H | △/H | O | O | O | O | O | O | 10~15 |
| V14~V15 | △/H | △/H | △/H | △/H | △/H | △/H | △/H | △/H | △/H | △/H | △/H | O | O | O | O | 12~15 |
| V15~VRH | △/H | △/H | △/H | △/H | △/H | △/H | △/H | △/H | △/H | △/H | △/H | O | O | O | O | 12~15 |

O : OPERATING STATE
△ : RESTING STATE
△/H : RESTING STATE AND "H" OUTPUT
△/L : RESTING STATE AND "L" OUTPUT

EXPLANATORY VIEW SHOWING OUTLINE OF COMPARISON SECTION OF A/D CONVERTER CIRCUIT DIRECTED TO EMBODIMENT 4

FIG. 21

TABLE SHOWING RELATIONSHIP OF INPUT VOLTAGE OF PREDETERMINED TIME PAST OUTPUTS OF SETTING COMPARATORS AND SET STATES OF COMPARATORS BELONGING TO GROUPS IN A/D CONVERTER CIRCUIT DIRECTED TO EMBODIMENT 4

| INPUT VOLTAGE (VIN VOLTAGE) | OUTPUT OF EACH SETTING COMPARATOR | | | | | | | | SET STATE OF EACH CONVERSION COMPARATOR | | | | | | | |
|---|---|---|---|---|---|---|---|---|---|---|---|---|---|---|---|---|
| | P2 | P4 | P6 | P8 | P10 | P12 | P14 | | G1 | G2 | G3 | G4 | G5 | G6 | G7 | G8 |
| VRL~V2 | L | L | L | L | L | L | L | | ○ | ○ | △/L | △/L | △/L | △/L | △/L | △/L |
| V2~V4 | H | L | L | L | L | L | L | | ○ | ○ | ○ | △/L | △/L | △/L | △/L | △/L |
| V4~V6 | H | H | L | L | L | L | L | | △/H | ○ | ○ | ○ | △/L | △/L | △/L | △/L |
| V6~V8 | H | H | H | L | L | L | L | | △/H | △/H | ○ | ○ | ○ | △/L | △/L | △/L |
| V8~V10 | H | H | H | H | L | L | L | | △/H | △/H | △/H | ○ | ○ | ○ | △/L | △/L |
| V10~V12 | H | H | H | H | H | L | L | | △/H | △/H | △/H | △/H | ○ | ○ | ○ | △/L |
| V12~V14 | H | H | H | H | H | H | L | | △/H | △/H | △/H | △/H | △/H | ○ | ○ | ○ |
| V14~VRH | H | H | H | H | H | H | H | | △/H | △/H | △/H | △/H | △/H | △/H | ○ | ○ |

○ : OPERATING STATE
△ : RESTING STATE
△/H : RESTING STATE AND "H" OUTPUT
△/L : RESTING STATE AND "L" OUTPUT

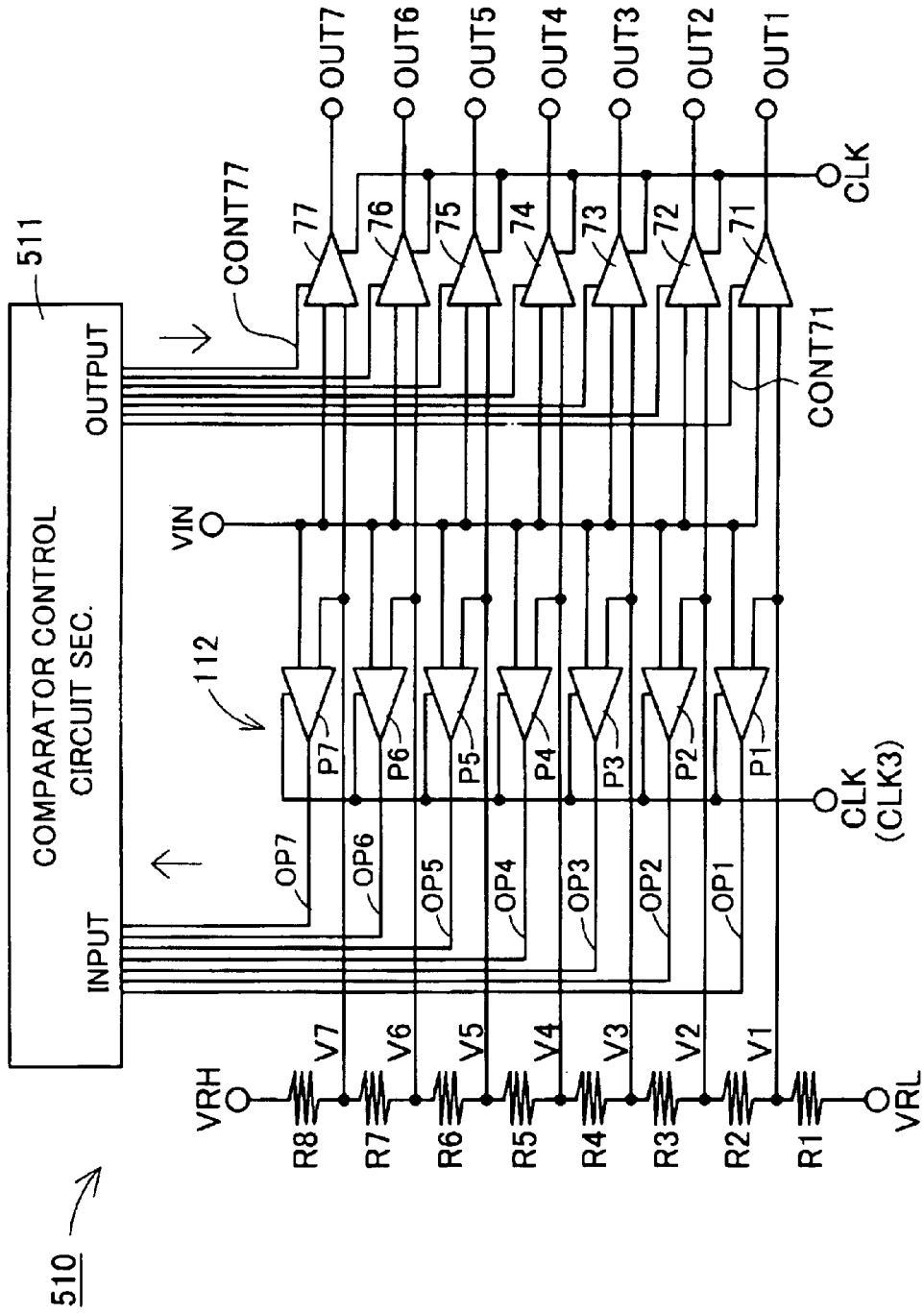
FIG. 22 EXPLANATORY VIEW SHOWING OUTLINE OF COMPARISON PART OF A/D CONVERTER CIRCUIT DIRECTED TO EMBODIMENT 5

FIG. 23

TABLE SHOWING RELATIONSHIP OF INPUT VOLTAGE OUTPUTS OF CONVERSION COMPARATORS AND OUTPUT CODES IN A/D CONVERTER CIRCUIT DIRECTED TO EMBODIMENTS 5 AND 6

| INPUT VOLTAGE (VIN VOLTAGE) | OUTPUT OF EACH CONVERSION COMPARATOR (OUT1~OUT7) | | | | | | | OUTPUT CODE DOUT |
|---|---|---|---|---|---|---|---|---|
| | 71 | 72 | 73 | 74 | 75 | 76 | 77 | |
| VRL~V1 | L | L | L | L | L | L | L | 0 |
| V1~V2 | H | L | L | L | L | L | L | 1 |
| V2~V3 | H | H | L | L | L | L | L | 2 |
| V3~V4 | H | H | H | L | L | L | L | 3 |
| V4~V5 | H | H | H | H | L | L | L | 4 |
| V5~V6 | H | H | H | H | H | L | L | 5 |
| V6~V7 | H | H | H | H | H | H | L | 6 |
| V7~VRH | H | H | H | H | H | H | H | 7 |

FIG. 24

TABLE SHOWING RELATIONSHIP OF INPUT VOLTAGE OF PREDETERMINED TIME PAST OUTPUTS OF SETTING COMPARATORS AND SET STATES OF CONVERSION COMPARATORS IN A/D CONVERTER CIRCUIT DIRECTED TO EMBODIMENT 5

| INPUT VOLTAGE (VIN VOLTAGE) | OUTPUT OF EACH SETTING COMPARATOR (OP1~OP7) | | | | | | | SET STATE OF EACH CONVERSION COMPARATOR | | | | | | |
|---|---|---|---|---|---|---|---|---|---|---|---|---|---|---|
| | P1 | P2 | P3 | P4 | P5 | P6 | P7 | 71 | 72 | 73 | 74 | 75 | 76 | 77 |
| VRL~V1 | L | L | L | L | L | L | L | ○ | ○ | △ | △ | △ | △ | △ |
| V1~V2 | H | L | L | L | L | L | L | ○ | ○ | ○ | △ | △ | △ | △ |
| V2~V3 | H | H | L | L | L | L | L | ○ | ○ | ○ | ○ | △ | △ | △ |
| V3~V4 | H | H | H | L | L | L | L | △ | ○ | ○ | ○ | ○ | △ | △ |
| V4~V5 | H | H | H | H | L | L | L | △ | △ | ○ | ○ | ○ | ○ | △ |
| V5~V6 | H | H | H | H | H | L | L | △ | △ | △ | ○ | ○ | ○ | ○ |
| V6~V7 | H | H | H | H | H | H | L | △ | △ | △ | △ | ○ | ○ | ○ |
| V7~VRH | H | H | H | H | H | H | H | △ | △ | △ | △ | △ | ○ | ○ |

○ : NORMAL OPERATING STATE
△ : LOW POWER OPERATING STATE

EXPLANATORY VIEW SHOWING CONSTRUCTION OF INVERTER PART OF CONVERSION COMPARATOR USED IN EMBODIMENTS 5 THROUGH 8

EXPLANATORY VIEW SHOWING ANOTHER CONSTRUCTION OF INVERTER PART OF CONVERSION COMPARATOR USED IN EMBODIMENTS 5 THROUGH 8

EXPLANATORY VIEW SHOWING ANOTHER CONSTRUCTION OF INVERTER PART OF CONVERSION COMPARATOR USED IN EMBODIMENTS 5 THROUGH 8

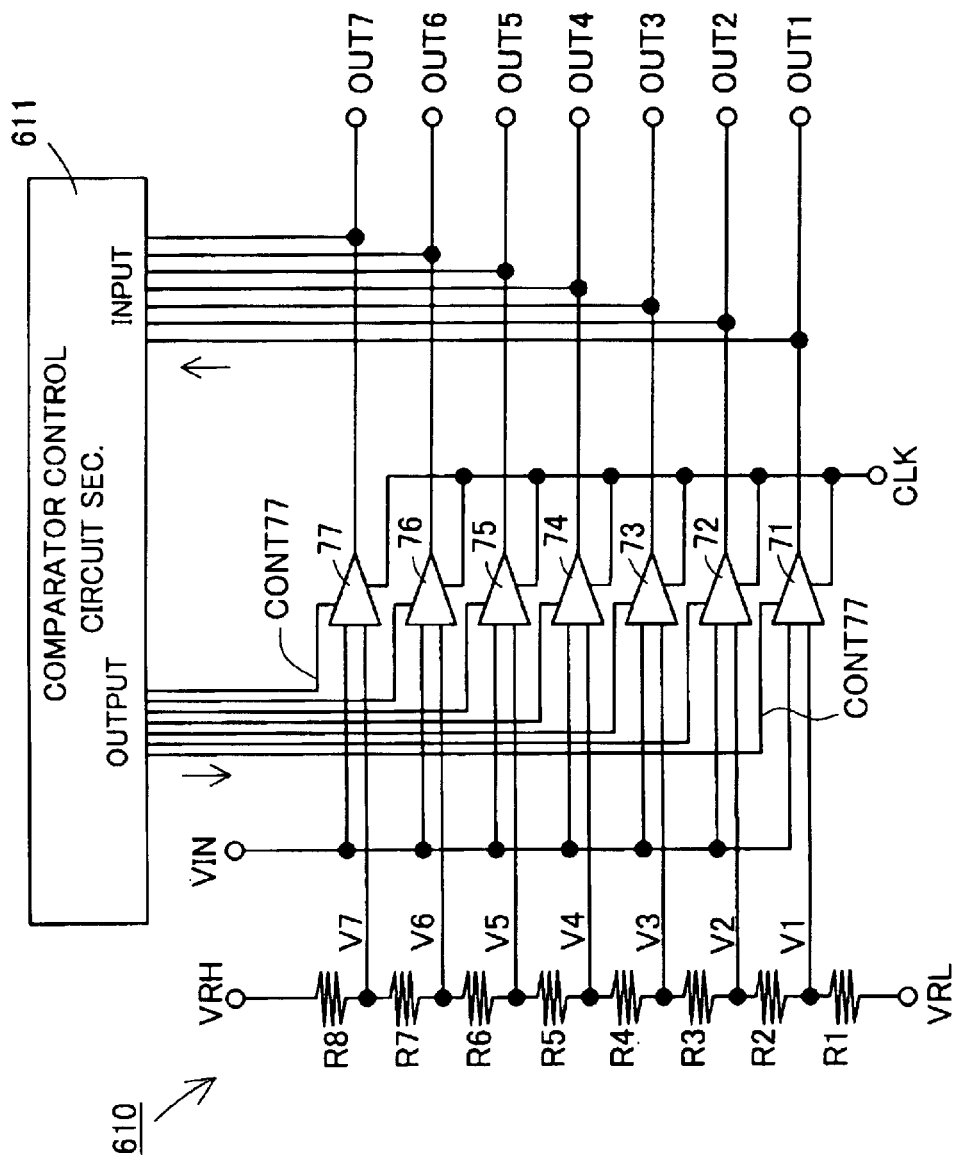
FIG. 28 EXPLANATORY VIEW SHOWING OUTLINE OF COMPARISON SECTION OF A/D CONVERTER CIRCUIT DIRECTED TO EMBODIMENT 6

FIG. 29

TABLE SHOWING RELATIONSHIP OF INPUT VOLTAGE USED IN PRECEDING CONVERSION OUTPUTS OF COMPARATORS OUTPUT CODES AND SET STATES OF COMPARATORS FOR PRESENT CONVERSION IN A/D CONVERTER CIRCUIT DIRECTED TO EMBODIMENT 6 AND VARIANT 3

| INPUT VOLTAGE (VIN VOLTAGE) | OUTPUT OF EACH COMPARATOR (OUT1~OUT7) | | | | | | | OUTPUT CODE DOUT | SET STATE OF COMPARATORS | | | | | | |
|---|---|---|---|---|---|---|---|---|---|---|---|---|---|---|---|
| | 71 | 72 | 73 | 74 | 75 | 76 | 77 | | 71 | 72 | 73 | 74 | 75 | 76 | 77 |
| VRL~V1 | L | L | L | L | L | L | L | 0 | ○ | ○ | △ | △ | △ | △ | △ |
| V1~V2 | H | L | L | L | L | L | L | 1 | ○ | ○ | ○ | △ | △ | △ | △ |
| V2~V3 | H | H | L | L | L | L | L | 2 | ○ | ○ | ○ | ○ | △ | △ | △ |
| V3~V4 | H | H | H | L | L | L | L | 3 | △ | △ | ○ | ○ | ○ | △ | △ |
| V4~V5 | H | H | H | H | L | L | L | 4 | △ | △ | ○ | ○ | ○ | ○ | △ |
| V5~V6 | H | H | H | H | H | L | L | 5 | △ | △ | △ | ○ | ○ | ○ | ○ |
| V6~V7 | H | H | H | H | H | H | L | 6 | △ | △ | △ | △ | ○ | ○ | ○ |
| V7~VRH | H | H | H | H | H | H | H | 7 | △ | △ | △ | △ | △ | ○ | ○ |

○ : NORMAL OPERATING STATE
△ : LOW POWER OPERATING STATE

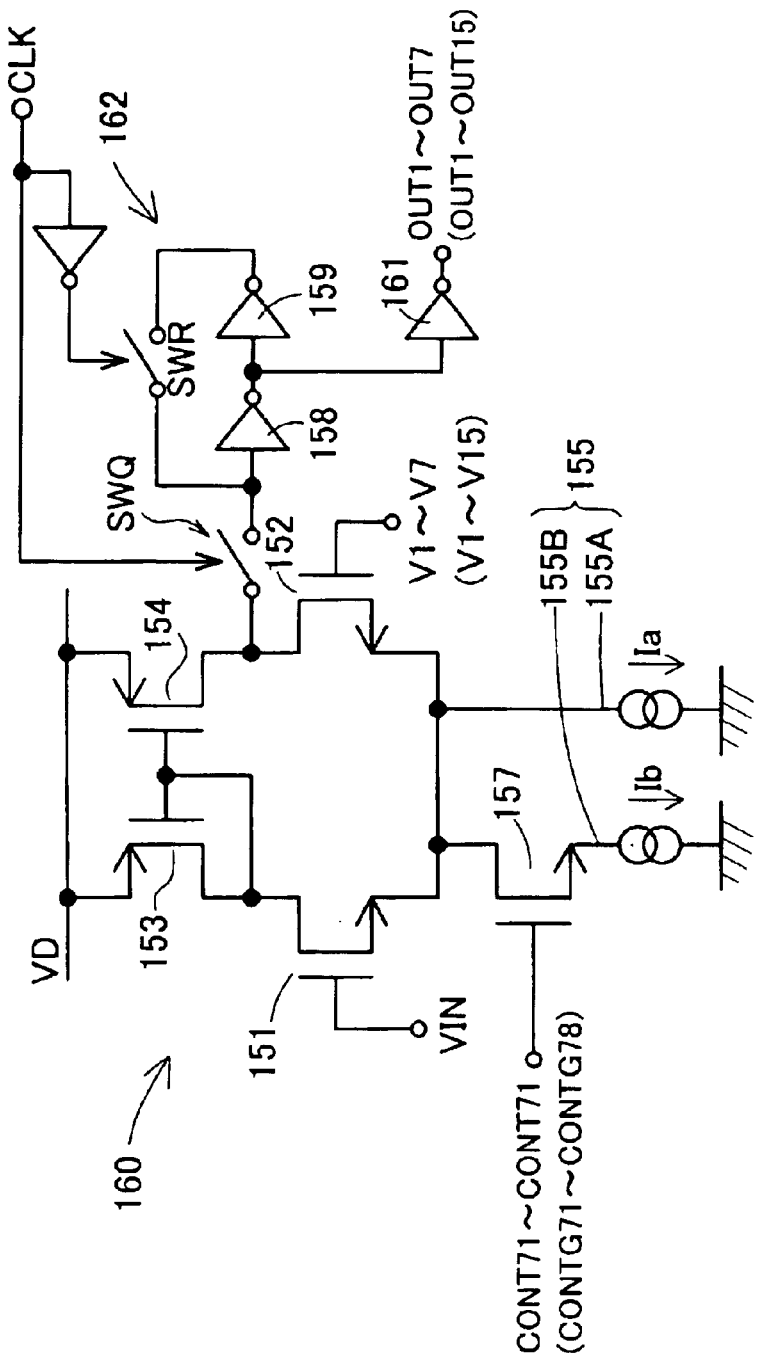
FIG. 30 EXPLANATORY VIEW SHOWING CONSTRUCTION OF DIFFERENTIAL-TYPE CONVERSION COMPARATOR USED IN A/D CONVERTER CIRCUIT DIRECTED VARIANTS 3 AND 4

EXPLANATORY VIEW SHOWING OUTLINE OF COMPARISON SECTION OF A/D CONVERTER CIRCUIT DIRECTED TO EMBODIMENT 7

FIG. 32

TABLE SHOWING RELATIONSHIP OF INPUT VOLTAGE OUTPUTS OF COMPARATORS AND OUTPUT CODES IN A/D CONVERTER CIRCUIT DIRECTED TO EMBODIMENT 7

| INPUT VOLTAGE (VIN VOLTAGE) | OUTPUT OF EACH COMPARATOR (OUT1~OUT15) | | | | | | | | | | | | | | | OUTPUT CODE DOUT |
|---|---|---|---|---|---|---|---|---|---|---|---|---|---|---|---|---|
| | 71 | 72 | 73 | 74 | 75 | 76 | 77 | 78 | 79 | 80 | 81 | 82 | 83 | 84 | 85 | |
| VRL~V1 | L | L | L | L | L | L | L | L | L | L | L | L | L | L | L | 0 |
| V1~V2 | H | L | L | L | L | L | L | L | L | L | L | L | L | L | L | 1 |
| V2~V3 | H | H | L | L | L | L | L | L | L | L | L | L | L | L | L | 2 |
| V3~V4 | H | H | H | L | L | L | L | L | L | L | L | L | L | L | L | 3 |
| V4~V5 | H | H | H | H | L | L | L | L | L | L | L | L | L | L | L | 4 |
| V5~V6 | H | H | H | H | H | L | L | L | L | L | L | L | L | L | L | 5 |
| V6~V7 | H | H | H | H | H | H | L | L | L | L | L | L | L | L | L | 6 |
| V7~V8 | H | H | H | H | H | H | H | L | L | L | L | L | L | L | L | 7 |
| V8~V9 | H | H | H | H | H | H | H | H | L | L | L | L | L | L | L | 8 |
| V9~V10 | H | H | H | H | H | H | H | H | H | L | L | L | L | L | L | 9 |
| V10~V11 | H | H | H | H | H | H | H | H | H | H | L | L | L | L | L | 10 |
| V11~V12 | H | H | H | H | H | H | H | H | H | H | H | L | L | L | L | 11 |
| V12~V13 | H | H | H | H | H | H | H | H | H | H | H | H | L | L | L | 12 |
| V13~V14 | H | H | H | H | H | H | H | H | H | H | H | H | H | L | L | 13 |
| V14~V15 | H | H | H | H | H | H | H | H | H | H | H | H | H | H | L | 14 |
| V15~VRH | H | H | H | H | H | H | H | H | H | H | H | H | H | H | H | 15 |

FIG. 33

TABLE SHOWING RELATIONSHIP OF INPUT VOLTAGE USED IN PRECEDING CONVERSION SET STATES OF COMPARATORS BELONGING TO GROUPS AND RANGE OF OUTPUT CODES POSSIBLE IN PRESENT CONVERSION IN A/D CONVERTER CIRCUIT DIRECTED TO EMBODIMENT 7

| INPUT VOLTAGE (VIN VOLTAGE) | SET STATE OF EACH GROUP | | | | | | | | POSSIBLE OUTPUT CODE RANGE |
|---|---|---|---|---|---|---|---|---|---|
| | G71 | G72 | G73 | G74 | G75 | G76 | G77 | G78 | |
| VRL~V1 | ○ | ○ | ○ | △ | △ | △ | △ | △ | 0~2 |
| V1~V2 | ○ | ○ | ○ | ○ | △ | △ | △ | △ | 0~3 |
| V2~V3 | ○ | ○ | ○ | ○ | △ | △ | △ | △ | 0~4 |
| V3~V4 | ○ | ○ | ○ | ○ | △ | △ | △ | △ | 1~5 |
| V4~V5 | ○ | ○ | ○ | ○ | ○ | △ | △ | △ | 2~6 |
| V5~V6 | △ | ○ | ○ | ○ | ○ | △ | △ | △ | 3~7 |
| V6~V7 | △ | △ | ○ | ○ | ○ | ○ | △ | △ | 4~8 |
| V7~V8 | △ | △ | △ | ○ | ○ | ○ | △ | △ | 5~9 |
| V8~V9 | △ | △ | △ | ○ | ○ | ○ | ○ | △ | 6~10 |
| V9~V10 | △ | △ | △ | △ | ○ | ○ | ○ | △ | 7~11 |
| V10~V11 | △ | △ | △ | △ | ○ | ○ | ○ | ○ | 8~12 |
| V11~V12 | △ | △ | △ | △ | ○ | ○ | ○ | ○ | 9~13 |
| V12~V13 | △ | △ | △ | △ | ○ | ○ | ○ | ○ | 10~14 |
| V13~V14 | △ | △ | △ | △ | △ | ○ | ○ | ○ | 11~15 |
| V14~V15 | △ | △ | △ | △ | △ | ○ | ○ | ○ | 12~15 |
| V15~VRH | △ | △ | △ | △ | △ | ○ | ○ | ○ | 13~15 |

○ : NORMAL OPERATING STATE
△ : LOW POWER OPERATING STATE

FIG. 34

TABLE SHOWING RELATIONSHIP OF INPUT VOLTAGE USED IN PRECEDING CONVERSION SET STATES OF COMPARATORS AND RANGE OF OUTPUT CODES POSSIBLE IN PRESENT CONVERSION IN A/D CONVERTER CIRCUIT DIRECTED TO EMBODIMENT 7

| INPUT VOLTAGE (VIN VOLTAGE) | SET STATE OF EACH COMPARATOR | | | | | | | | | | | | | | | POSSIBLE OUTPUT CODE RANGE |
|---|---|---|---|---|---|---|---|---|---|---|---|---|---|---|---|---|
| | 71 | 72 | 73 | 74 | 75 | 76 | 77 | 78 | 79 | 80 | 81 | 82 | 83 | 84 | 85 | |
| VRL~V1 | O | O | O | O | O | △ | △ | △ | △ | △ | △ | △ | △ | △ | △ | 0~2 |
| V1~V2 | O | O | O | O | O | △ | △ | △ | △ | △ | △ | △ | △ | △ | △ | 0~3 |
| V2~V3 | O | O | O | O | O | O | O | △ | △ | △ | △ | △ | △ | △ | △ | 0~4 |
| V3~V4 | O | O | O | O | O | O | O | O | O | △ | △ | △ | △ | △ | △ | 1~5 |
| V4~V5 | O | O | O | O | O | O | O | O | O | △ | △ | △ | △ | △ | △ | 2~6 |
| V5~V6 | O | O | O | O | O | O | O | O | O | O | △ | △ | △ | △ | △ | 3~7 |
| V6~V7 | △ | O | O | O | O | O | O | O | O | O | O | △ | △ | △ | △ | 4~8 |
| V7~V8 | △ | △ | O | O | △ | O | O | O | O | O | O | O | △ | △ | △ | 5~9 |
| V8~V9 | △ | △ | △ | △ | △ | △ | O | O | O | O | O | O | O | △ | △ | 6~10 |
| V9~V10 | △ | △ | △ | △ | △ | △ | △ | O | O | O | O | O | O | O | △ | 7~11 |
| V10~V11 | △ | △ | △ | △ | △ | △ | △ | △ | O | O | O | O | O | O | O | 8~12 |
| V11~V12 | △ | △ | △ | △ | △ | △ | △ | △ | O | O | O | O | O | O | O | 9~13 |
| V12~V13 | △ | △ | △ | △ | △ | △ | △ | △ | △ | O | O | O | O | O | O | 10~14 |
| V13~V14 | △ | △ | △ | △ | △ | △ | △ | △ | △ | O | O | O | O | O | O | 11~15 |
| V14~V15 | △ | △ | △ | △ | △ | △ | △ | △ | △ | △ | O | O | O | O | O | 12~15 |
| V15~VRH | △ | △ | △ | △ | △ | △ | △ | △ | △ | △ | O | O | O | O | O | 13~15 |

O : NORMAL OPERATING STATE
△ : LOW POWER OPERATING STATE

EXPLANATORY VIEW SHOWING OUTLINE OF COMPARISON SECTION OF A/D CONVERTER CIRCUIT DIRECTED TO EMBODIMENT 8

FIG. 36

TABLE SHOWING RELATIONSHIP OF INPUT VOLTAGE OF PREDETERMINED TIME PAST OUTPUTS OF SETTING COMPARATORS AND SET STATES OF CONVERSION COMPARATORS BELONGING TO GROUPS IN A/D CONVERTER CIRCUIT DIRECTED TO EMBODIMENT 8

| INPUT VOLTAGE (VIN VOLTAGE) | OUTPUT OF EACH SETTING COMPARATORS (OP2~OP14) | | | | | | | | SET STATE OF EACH CONVERSION COMPARATORS | | | | | | | |
|---|---|---|---|---|---|---|---|---|---|---|---|---|---|---|---|---|
| | P2 | P4 | P6 | P8 | P10 | P12 | P14 | | G71 | G72 | G73 | G74 | G75 | G76 | G77 | G78 |
| VRL~V2 | L | L | L | L | L | L | L | | ○ | ○ | ○ | △ | △ | △ | △ | △ |
| V2~V4 | H | L | L | L | L | L | L | | ○ | ○ | ○ | ○ | △ | △ | △ | △ |
| V4~V6 | H | H | L | L | L | L | L | | ○ | ○ | ○ | ○ | ○ | △ | △ | △ |
| V6~V8 | H | H | H | L | L | L | L | | △ | ○ | ○ | ○ | ○ | ○ | △ | △ |
| V8~V10 | H | H | H | H | L | L | L | | △ | △ | △ | ○ | ○ | ○ | ○ | △ |
| V10~V12 | H | H | H | H | H | L | L | | △ | △ | △ | △ | ○ | ○ | ○ | ○ |
| V12~V14 | H | H | H | H | H | H | L | | △ | △ | △ | △ | △ | ○ | ○ | ○ |
| V14~VRH | H | H | H | H | H | H | H | | △ | △ | △ | △ | △ | △ | ○ | ○ |

○ : NORMAL OPERATING STATE
△ : LOW POWER OPERATING STATE

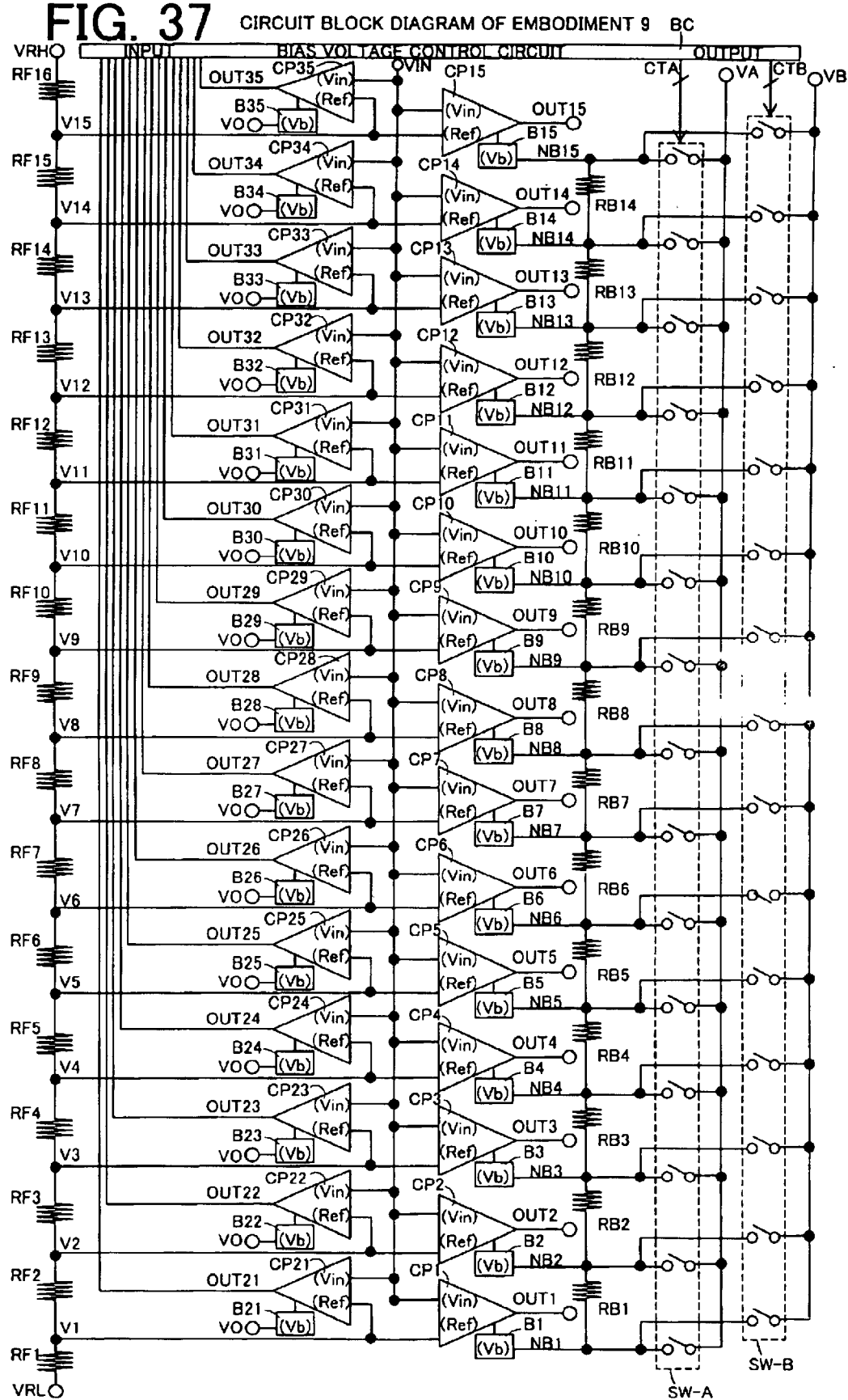
FIG. 37 CIRCUIT BLOCK DIAGRAM OF EMBODIMENT 9

FIG. 38  A/D CONVERSION TABLE OF EMBODIMENT 9

| VIN | OUTx (x=1~15) | | | | | | | | | | | | | | | OUTPUT CODE |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | |
| VRL~V1 | L | L | L | L | L | L | L | L | L | L | L | L | L | L | L | 0 |
| V1~V2 | H | L | L | L | L | L | L | L | L | L | L | L | L | L | L | 1 |
| V2~V3 | H | H | L | L | L | L | L | L | L | L | L | L | L | L | L | 2 |
| V3~V4 | H | H | H | L | L | L | L | L | L | L | L | L | L | L | L | 3 |
| V4~V5 | H | H | H | H | L | L | L | L | L | L | L | L | L | L | L | 4 |
| V5~V6 | H | H | H | H | H | L | L | L | L | L | L | L | L | L | L | 5 |
| V6~V7 | H | H | H | H | H | H | L | L | L | L | L | L | L | L | L | 6 |
| V7~V8 | H | H | H | H | H | H | H | L | L | L | L | L | L | L | L | 7 |
| V8~V9 | H | H | H | H | H | H | H | H | L | L | L | L | L | L | L | 8 |
| V9~V10 | H | H | H | H | H | H | H | H | H | L | L | L | L | L | L | 9 |
| V10~V11 | H | H | H | H | H | H | H | H | H | H | L | L | L | L | L | 10 |
| V11~V12 | H | H | H | H | H | H | H | H | H | H | H | L | L | L | L | 11 |
| V12~V13 | H | H | H | H | H | H | H | H | H | H | H | H | L | L | L | 12 |
| V13~V14 | H | H | H | H | H | H | H | H | H | H | H | H | H | L | L | 13 |
| V14~V15 | H | H | H | H | H | H | H | H | H | H | H | H | H | H | L | 14 |
| V15~VRH | H | H | H | H | H | H | H | H | H | H | H | H | H | H | H | 15 |

L : LOW VOLTAGE LEVEL
H : HIGH VOLTAGE LEVEL

CIRCUIT DIAGRAM OF BIAS VOLTAGE GENERATOR CIRCUIT

CIRCUIT DIAGRAM OF DIFFERENTIAL-TYPE COMPARATOR

OPERATIONAL WAVEFORM OF DIFFERENTIAL-TYPE COMPARATOR

FIG. 42  BIAS VOLTAGE SETTING TABLE FOR EACH COMPARATOR

| VIN | BIAS VOLTAGE TO BE SUPPLIED TO COMPARATOR CPx (x=1~15) | | | | | | | | | | | | | | |
|---|---|---|---|---|---|---|---|---|---|---|---|---|---|---|---|
|  | 1 | 2 | 3 | 4 | 5 | 6 | 7 | 8 | 9 | 10 | 11 | 12 | 13 | 14 | 15 |
| VRL~V1  | B | – | – | A | A | A | A | A | A | A | A | A | A | A | A |
| V1~V2   | B | B | – | – | A | A | A | A | A | A | A | A | A | A | A |
| V2~V3   | B | B | B | – | – | A | A | A | A | A | A | A | A | A | A |
| V3~V4   | B | – | B | B | – | – | A | A | A | A | A | A | A | A | A |
| V4~V5   | A | – | – | – | B | B | – | – | A | A | A | A | A | A | A |
| V5~V6   | A | A | – | – | B | – | B | – | – | A | A | A | A | A | A |
| V6~V7   | A | A | A | – | – | B | B | – | – | – | A | A | A | A | A |
| V7~V8   | A | A | A | A | – | – | B | B | – | – | – | A | A | A | A |
| V8~V9   | A | A | A | A | A | A | – | – | B | B | – | – | – | A | A |
| V9~V10  | A | A | A | A | A | A | A | – | – | B | B | – | – | – | A |
| V10~V11 | A | A | A | A | A | A | A | A | – | – | B | B | – | – | – |
| V11~V12 | A | A | A | A | A | A | A | A | A | – | – | B | B | – | – |
| V12~V13 | A | A | A | A | A | A | A | A | A | A | – | – | B | B | – |
| V13~V14 | A | A | A | A | A | A | A | A | A | A | A | – | – | B | B |
| V14~V15 | A | A | A | A | A | A | A | A | A | A | A | A | – | B | B |
| V15~VRH | A | A | A | A | A | A | A | A | A | A | A | A | – | – | B |

A : SET BIAS VOLTAGE VA BY MAKING SWITCH SW-A CONDUCTIVE
B : SET BIAS VOLTAGE VB BY MAKING SWITCH SW-B CONDUCTIVE
– : SWITCHES SW-A, SW-B ARE NOT CONDUCTIVE

BIAS CURRENT OF EACH COMPARATOR IN CASE INPUT VOLTAGE VIN IS IN REGION OF V8~V9

RELATION OF OFFSET VOLTAGE WITH REFERENCE TO BIAS CURRENT DIFFERENCE B/W COMPARATORS

FIG. 45 CIRCUIT BLOCK DIAGRAM OF VARIANT DIRECTED TO EMBODIMENT 9

CIRCUIT DIAGRAM OF CONVENTIONAL A/D CONVERTER CIRCUIT

A/D CONVERTER CIRCUIT AND CURRENT SUPPLY CIRCUIT

CROSS-REFERENCE TO RELATED APPLICATIONS

This application is based upon and claims the benefit of priority from each of the prior Japanese Patent Applications No. 2002-152053 filed on May 27, 2002, No. 2002-305613 filed on Oct. 21, 2002, and No. 2002-312668 filed on Oct. 28, 2002, the entire contents of which are incorporated herein by reference.

BACKGROUND OF THE INVENTION

1. Field of the Invention

This invention relates to an A/D converter circuit for converting an inputted analog voltage into a digital value.

The present invention further relates to supply of bias current to such a function circuit as an AD converter circuit and more particularly to supply of bias current to the AD converter circuit having a parallel-type A/D converter section.

2. Description of Related Art

Parallel A/D converter circuits (hereinafter also called A/D-converters) which have numerous resistor devices arrayed in series to divide a standard voltage and use numerous comparators to compare, by clock signal cycles, reference voltages of the connection points with an inputted analog voltage in parallel and generate a digital value on the basis of the outputs of the comparators are known. In this kind of parallel-type A/D-converter, for example for 8-bit A/D-conversion (also simply called conversion), 255 (=2⁸−1) comparators are used.

However, the amplitude of the inputted analog voltage does not at all times have the maximum amplitude (maximum input width) that can be converted with the A/D-converter. And also the frequency of the inputted analog voltage is not at all times a high frequency such as for example ½ of the frequency of the clock signal. Generally, the amplitude of the analog voltage is smaller than the maximum amplitude that can be A/D-converted, and a frequency amply low compared to the clock signal is also normal.

In this case, with respect to the inputted analog voltage at a point in time given by a certain clock signal, there is a limit to the change amount of the analog voltage by which it can change by the time given by the next clock signal. That is, if the analog voltage inputted at a point in time determined by a certain clock signal is known, from this it is possible with a certain width to predict the analog voltage that will be inputted at the point in time determined by the next clock signal.

On the other hand, although in a normal A/D-converter all of the comparators are operated together by the clock signal, if as described above the inputted analog voltage can be predicted, it is possible by operating only the necessary comparators and resting the rest of the comparators to make this A/D-converter low in consumed power without the resolution or conversion result (digital value) of the A/D-converter changing.

In Patent Document 1 (Japanese Laid-Open Patent Publication No. 2000-341124), the following kind of A/D converter circuit is set forth. That is, using two comparators of a former stage, the inputted analog voltage is classified as one of three levels, a low level, a high level and an intermediate level. And numerous comparators arrayed in parallel in a latter stage to that are divided into three groups, and groups of comparators to be operated are selected on the basis of first and second control signals from the two comparators of the former stage. Specifically, when the analog voltage is at the intermediate level, all the comparators of the three groups are operated. However, when the analog voltage is at the low level, only the comparators of the groups corresponding to the intermediate level and the low level are operated, and the comparators corresponding to the high level are not operated. And when the analog voltage is at the high level, only the comparators of the groups corresponding to the intermediate level and the high level are operated, and the comparators of the group corresponding to the low level are not operated. In this way, by not operating some of the comparators, the consumed power of the A/D-converter is reduced.

However, in the invention set forth in this Patent Document 1, the two comparators of the former stage are differential amplifier type comparators, which do not use a clock signal, and continuously compare and classify the analog voltage and select the groups of comparators to be operated. Thus, the groups of comparators of the latter stage are selected on the basis of the analog voltage of immediately before conversion by the comparators of the latter stage (more exactly, depending on the characteristics of the comparators of the former stage, in the past by the amount of the time delay to when their output changes in correspondence with a change in the analog voltage inputted to them). That is, to select the comparators of the latter stage, the timing with which the comparators of the former stage fetch the analog value is determined by the characteristics of the comparators of the former stage. Furthermore, the time delay of the comparators of the former stage is different between when the change of the analog value inputted is large and when it is small (when the change in the input is large, it takes time for the corresponding change in output to finish). Consequently, if looked at from the comparators of the latter stage, the timing at which the selection of the comparators of the latter stage is decided changes due to changes in the analog value, and there are cases where the groups of comparators cannot be selected appropriately, so that different groups from those which should properly be selected are selected.

And, because when the analog voltage is at the intermediate level all the comparators of the three groups are operated and so on, the number of comparators which are not operated is small and there is a limit to the consumed power reduction effect.

As an example of the function circuit in prior art, FIG. 10 shows a circuit diagram of the parallel-type AD converter circuit. The high voltage level VRH and the low voltage level VRL are divided equally with eight divided resistors RF110–RF180 and supplied as the reference voltages V110–V170. Then, the input voltages VIN are compared therewith by seven comparators C110–C170 at the same time. As a comparison result, output signals OUT110–OUT170 obtained in a digital signal are divided to high level and low level with a predetermined output signal as a boundary and outputted depending on the voltage level of the input voltage VIN. By encoding the output signals OUT110–OUT170, a 3-bit digital signal is obtained.

The respective comparators C110–C170 are of the same circuit unit. Further, a predetermined bias current needs to be supplied for the respective comparators C110–C170 to execute the comparison operation. When the parallel-type A/D converter circuit executes A/D conversion operation, the predetermined bias current is supplied to all the comparators C110–C170. Current consumption occurs in each comparator.

However, the input voltage VIN is analog voltage and the voltage change quantity of the input voltage VIN in A/D conversion operation to be carried out at each predetermined timing is limited. That is, in the A/D conversion operation about the input voltage VIN, which is an analog voltage signal, a voltage value of the input voltage VIN has to be detected with only comparators existing within a voltage range which may change at adjacent conversion timings. Thus, in a comparator having a voltage value within a voltage range which may not be inputted at the adjacent conversion timing, as the reference voltage, unnecessary current consumption in comparator which is unnecessary for the A/D conversion operation occurs under a conventional technology in which the bias current is always supplied, which is a problem to be solved.

As regards other circuits than the AD converter circuit, a function circuit having plural circuit units and in which their circuit operations are carried out by supplying the bias current to each of them may have the same problem. That is, for example, although in a function circuit in which the operation condition of each circuit unit is switched over depending on bias current setting so as to determine a next operation condition depending on a current operation condition, only the circuit units which can be expected have to be supplied with the bias current, according to the conventional technology, the bias current is always supplied to all the circuit units so that unnecessary current consumption occurs, which is a problem to be solved.

SUMMARY OF THE INVENTION

This invention was made in view of these problem points, and has the object of providing an A/D converter circuit wherein, by using a clock signal, on the basis of the analog voltage inputted a predetermined time past, comparators to be operated as usual and comparators to be brought to a state of low consumed power can be suitably selected, and which has smaller consumed power.

And, it has the object of providing an A/D converter circuit wherein, by using a clock signal, on the basis of the analog voltage inputted a predetermined time past, comparators to be operated and comparators to be rested can be suitably selected, and which has smaller consumed power.

Also, it has the object of providing an A/D converter circuit wherein, by using a clock signal, on the basis of the analog voltage inputted a predetermined time past, comparators to be made to perform normal operation and comparators to be made to perform low power operation can be suitably selected, and which has smaller consumed power.

An object of the present invention is to provide a current supply circuit and an A/D converter circuit capable of reducing unnecessary bias current while securing necessary bias current to maintain its circuit performance in the A/D converter circuit having the parallel-type A/D conversion section and the function circuit having plural circuit units.

According to one aspect of the present invention there is provided an A/D converter circuit which is a parallel-type A/D converter circuit for converting an inputted analog voltage to a digital value on the basis of a first clock signal using multiple first comparators, the multiple first comparators being constructed so that for each either of a normal operating state and a low consumed power state can be selected by means of a control signal, comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the normal operating state and holds the remainder of the first comparators in the low consumed power state.

In the A/D converter circuit directed to one aspect of this invention, in accordance with an input information signal generated on the basis of an analog voltage inputted a predetermined time past using the first clock signal or the second clock signal, the comparator control section outputs a control signal. By this, first comparators to be brought to a normal operating state in the present conversion are selected and the remaining first comparators are held in a low consumed power state.

To suppress the consumed power of the A/D converter circuit, it is most desirable for all of the first comparators to be brought to a low consumed power state. However, when a first comparator is brought to a low consumed power state, because it shows behavior different from when this first comparator has been brought to the normal operating state, when all of the first comparators are brought to the low consumed power state, there are cases where suitable AD-conversion cannot be carried out.

However, in this invention, the timing of the analog voltage used for selecting the first comparators can be aligned with a fixed timing determined by the first clock signal or a second clock signal. Accordingly, when the character of the inputted analog voltage such as its amplitude and frequency are known in advance, the range of change in the analog voltage which can arise from a point in time a predetermined time past to the present conversion can be predicted suitably. And so, in correspondence with this, for first comparators from which a suitable output cannot be obtained when they are brought to the low consumed power state, although their consumed power will become relatively large, a normal operating state, in which they can perform comparison operation suitably, is selected and used for the present conversion. On the other hand, for first comparators from which a suitable output can be obtained even when they are brought to the low consumed power state, they are brought to the low consumed power state. In this way, as a whole, it can be made a low consumed power A/D converter circuit.

Incidentally, a low consumed power state means a state such that the power consumed in the comparator can be made low compared with when the comparator is operated in the normal operating state, and is irrespective of whether or not this comparator can perform the required comparison operation. Therefore, 'a low consumed power state' includes not only a state which while being lower in consumed power than the normal operating state is such that comparison operation as a comparator can be performed (a low power operating state), but also a state which is lower in consumed power than the normal operating state but is such that comparison operation as a comparator cannot be performed and it is not operating as a comparator (a resting state).

Also, in bringing the remaining comparators to a low consumed power state after selecting comparators to be brought to the normal operating state, besides bringing all of the remaining comparators to low power operating state or bringing them all to a resting state, it is also possible to bring, of the remaining comparators to be brought to a low consumed power state, some to a low power operating state and the remainder to a resting state.

In generating the input information signal using the first clock signal, for example the case of utilizing the first comparators themselves can be given as an example. That is, one which by also using the preceding outputs of the first comparators as an input information signal utilizes them for the selection of the first comparators for the present conversion can be given as an example. And, one in which second comparators operating under the first clock signal or a second clock signal are provided separately from the first comparators and the outputs of these second comparators are utilized for the selection of the first comparators for the present conversion can be also given as an example.

And, as the predetermined time past, this can be set suitably considering the amplitude and frequency of the inputted analog voltage and the number of first comparators to be brought to the normal operating state in the present conversion and so on, and for example one clock period (1 cycle) of the first clock signal past can be given as an example. However, this may be made a time shorter than this (for example ½ a clock period or the like), or conversely it may be made a time longer than this (for example 2 clock periods).

According to second aspect of the present invention, there is provided an A/D converter circuit which is a parallel-type A/D converter circuit for converting an inputted analog voltage to a digital value on the basis of a first clock signal using multiple first comparators, the multiple first comparators being constructed so that for each either of an operating state and a resting state can be selected by means of a control signal, comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the operating state and holds the remainder of the first comparators in the resting state.

In the A/D converter circuit directed to the second aspect of this invention, in accordance with an input information signal generated on the basis of an analog voltage inputted a predetermined time past using the first clock signal or the second clock signal, the comparator control section outputs a control signal. By this, first comparators to be brought to an operating state in the present conversion are selected and the remaining first comparators are held in a resting state. In this way, the timing of the analog voltage used for selecting the first comparators can be aligned with a fixed timing determined by the first clock signal or the second clock signal. Accordingly, when the character of the inputted analog voltage such as its amplitude and frequency are known in advance, the range of change in the analog voltage which can arise from a point in time a predetermined time past to the present conversion can be predicted precisely. And so, because it is only necessary, in correspondence with this change range, to select the first comparators whose comparison results cannot be predicted and bring these to the normal operating state and bring the remaining first comparators, whose comparison results can be predicted, to the resting state, before using them in the present conversion, suitable first comparators can be selected and brought to the operating state at all times. Also, since, because only a suitable number of first comparators need to be brought to the operating state, the number of the remaining first comparators held in the resting state can be made large, it can be made a lower consumed power A/D converter circuit.

Incidentally, holding the comparators in a resting state means not operating the comparators, and keeping the comparators in a state of small consumed power. Accordingly, in this resting state it is not possible to perform comparison operation of reference voltages and the analog voltage with the comparators. For example, in a chopper-type comparator, generally, a voltage fetching state and a comparing state are made to arise alternately to perform comparison. In this case, in the voltage fetching state, the input stage and the output stage of a logic device such as an inverter are short-circuited, a through current is made to flow, and an intrinsic voltage is made to arise in this logic device. At this time much power is consumed. As an example of holding a chopper-type comparator like this in a resting state, the case of not performing the voltage fetching described above, and maintaining the comparing state, can be cited. And, in a differential-type comparator, the case of cutting the constant current flowing through the constant current source of the differential circuit can also be given as an example.

However, in this A/D converter circuit, there is a limit to the analog voltage waveform which can be converted to a digital value correctly at all times. That is, depending on the number of first comparators brought to the operating state and the length of the predetermined time and so on, the maximum width through which the analog voltage can change in the time from the predetermined time past to the present conversion is limited. Therefore, the amplitude and frequency of the analog voltage are limited. If the analog voltage is one which changes within this limit, it can be converted to a digital value correctly.

On the other hand, in this A/D converter circuit, when it inputs an analog voltage having a large amplitude and/or a large frequency such as exceed this limit, it cannot perform A/D-conversion correctly. However, if it is understood that there is this kind of limit, applications in which it can be used also exist. For example, when an analog signal in which periods of a large amplitude and periods of a small amplitude appear alternately is inputted, although in a period of a large amplitude exceeding the limit range and in a transition period, of a period of small amplitude, following the period of large amplitude, A/D-conversion cannot be carried out correctly. After the passing of the transition period of the small amplitude period A/D-conversion can be carried out correctly. If only the digital values of periods like this are used, the A/D converter circuit of this invention can be used.

Incidentally, in this patent application, the high level and low level about reference voltages are such that, when reference voltages are compared, the one with the higher potential is written higher-level and the one with the lower potential is written lower-level. In this way, for reference voltages, a ranking of from high-level to low-level is assigned.

On the other hand, the high level and low level about comparators are such that, for two comparators being contrasted, when the reference voltages to which they each refer are compared, the comparator referring to the high-potential (high-level) reference voltage is written high-level and the comparator referring to the low-potential (low-level) reference voltage is written low-level. In this way, a ranking of from high-level to low-level is assigned for the comparators also.

And, the comparator one level higher refers to the comparator which is one whose rank is one on the highest level side of the comparator being considered. Similarly, the comparator one level lower refers to the comparator whose rank is one on the lowest level side of the comparator being considered. The adjacent comparators refer to the comparators whose ranks are one level higher or one level lower with respect to the comparator being considered.

Incidentally, in this patent application, the high level and low level about groupings are such that, when the comparators included in the groupings are compared, groupings in which high level comparators are included are called high-level and groupings in which low level comparators are included are called low-level. Thus also for the groupings, a ranking from high-level to low-level is assigned.

And, the grouping one level higher refers to the grouping whose rank is one on the highest level side of the grouping being considered. Similarly, the grouping one level lower refers to the grouping whose rank is one on the lowest level side of the grouping being considered. Adjacent groupings refer to the groupings whose ranks are one level higher or one level lower with respect to the grouping being considered.

According to third aspect of the present invention, there is provided an A/D converter circuit, which is a parallel-type A/D converter circuit for converting an inputted analog voltage to a digital value on the basis of a clock signal using multiple comparators, the multiple comparators being constructed so that for each either of a normal operating state and a low consumed power state can be selected by means of a control signal, comprising a comparator control circuit section for, in accordance with an input information signal generated on the basis of the analog voltage used in the preceding conversion, outputting the control signal, which, of the multiple comparators, brings some of the comparators to the normal operating state and holds the remainder of the comparators in the low consumed power state.

In the A/D converter circuit directed to the third aspect of this invention, the comparator control circuit section outputs a control signal in accordance with an input information signal generated on the basis of the analog voltage used in the preceding conversion. This control signal selects some comparators to be brought to a normal operating state in the present conversion and brings the remaining comparators to a low consumed power state.

Accordingly, because the timing of the analog voltage used for selecting the comparators can be aligned with the timing of the preceding conversion at all times, it is only necessary to select and use in the present conversion the comparators corresponding to the change range of the analog voltage which can arise in the period of 1 cycle of the clock signal, and consequently it is possible to select suitable comparators as the normal operating state or the low consumed power state at all times. Also, because it is only necessary to bring a suitable number of comparators to the normal operating state, the number of remaining comparators brought to the low consumed power state can be made large, and consequently it can be made a lower consumed power A/D converter circuit.

According to fourth aspect of the present invention there is provided an A/D converter circuit, which is a parallel-type A/D converter circuit for converting an inputted analog voltage to a digital value on the basis of a clock signal using multiple comparators, the multiple comparators being constructed so that for each either of an operating state and a resting state can be selected by means of a control signal, comprising a comparator control circuit section for, in accordance with an input information signal generated on the basis of the analog voltage used in the preceding conversion, outputting the control signal, which, of the multiple comparators, brings some of the comparators to the operating state and holds the remainder of the comparators in the resting state.

In the A/D converter circuit directed to the fourth aspect of this invention, the comparator control circuit section outputs a control signal in accordance with an input information signal generated on the basis of the analog voltage used in the preceding conversion. This control signal selects some comparators to be brought to an operating state in the present conversion and holds the remaining comparators in a resting state. Accordingly, because the timing of the analog voltage used for the selection of the comparators can be aligned with the timing of the preceding conversion at all times, it is only necessary to select and use in the present conversion the comparators corresponding to the change range of the analog voltage which can arise in the period of 1 cycle of the clock signal, and consequently it is possible to select suitable comparators as the operating state or the resting state at all times. Also, because it is only necessary to bring a suitable number of comparators to the operating state, the number of remaining comparators brought to the resting state can be made large, and consequently it can be made a lower consumed power A/D converter circuit.

According to fifth aspect of the present invention, there is provided an A/D converter circuit, which is a parallel-type A/D converter circuit for converting an inputted analog voltage to a digital value on the basis of a first clock signal using multiple first comparators, the multiple first comparators being constructed so that for each either of a normal operating state and a low power operating state can be selected by means of a control signal, comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the normal operating state and holds the remainder of the first comparators in the low power operating state.

In the A/D converter circuit directed to fifth aspect of this invention, in accordance with an input information signal generated on the basis of an analog voltage inputted a predetermined time past using the first clock signal or a second clock signal, the comparator control section outputs a control signal. By this, first comparators to be brought to a normal operating state in the present conversion are selected and the remaining first comparators are held in a low power operating state. In this way, the timing of the analog voltage used for selecting the first comparators can be aligned with a fixed timing determined by the first clock signal or a second clock signal. Accordingly, first comparators to be brought to the normal operating state and first comparators to be brought to the low power operating state can be selected suitably in correspondence with the change range of the analog voltage which can occur from a point in time a predetermined time past to the present conversion. And, because some of the first comparators are brought to a low power operating state, the consumed power of the A/D converter circuit as a whole can be reduced.

And, as described above, when a comparator is temporarily brought to a resting state to reduce its consumed power, it often takes time for this comparator to return to operating as normal again. Consequently, when some comparators are brought to the resting state, there is a risk of the upper limit of the response speed (the frequency of the clock signal) of the A/D converter circuit being restricted by the time taken for restoration from the resting state to the operating state. With respect to this, compared to the time taken to change from the resting state to the operating state, in this invention, the time taken to change from the low power operating state to the normal operating state is short. Consequently, it is advantageous for driving the A/D converter circuit at a faster clock frequency.

Incidentally, the low power operating state refers to, of the operating state of the comparator, a state wherein, while comparison operation as a comparator is possible, the consumed power during operation is lower than in the contrasted normal operating state.

When a comparator has been brought to the low power operating state, it sometimes happens that a restriction on its usage range arises compared to when it is brought to the normal operating state. Generally, the response speed of a comparator depends on, besides its consumed power, the size of the voltage difference between the two voltages which it is comparing (the reference voltage and the analog voltage), and becomes slower the smaller is the voltage difference. In this connection, the first comparators used in the A/D converter circuit have their capabilities and characteristics determined in consideration of consumed power, voltage difference and response speed.

Nonetheless, when this comparator is brought to a low power operating state to pull down its consumed power, although when the voltage difference actually applied is large a correct comparison result is obtained within the predetermined period set by the clock signal, there is a risk that when the voltage difference is small, because the response time becomes slow, a correct comparison result will not be obtained within the predetermined period. Consequently, if all of the first comparators used in the A/D converter circuit are brought to the low power operating state, there are cases where correct conversion results are not obtained.

In this connection, of the multiple first comparators that the A/D converter circuit has, for first comparators for which the voltage difference between the inputted analog voltage and the reference voltage is predicted to be large, it is good if they are brought to the low power operating state. This is because even when this is done, correct comparison results are obtained within the predetermined period. On the other hand, for first comparators for which it is predicted that the voltage difference will be small, although their consumed power will be large, it is good if they are brought to the normal operating state. This is because correct comparison results will be obtained within the predetermined period even though the voltage difference is small. If this is done, as well as correct comparison results being obtained for all of the first comparators of the A/D converter circuit, as a whole the consumed power can be reduced.

And, in this A/D converter circuit, there is a limit to the waveform of analog voltage which can be correctly converted to a digital value at any time. That is, the maximum amplitude over which the analog voltage can change in the time from the predetermined time past to the present conversion is limited, by the number of first comparators brought to the normal operating state and the length of the predetermined time and so on. Consequently, the amplitude and frequency of the analog voltage are limited. If it is an analog voltage which changes within the range of this limit, it can be correctly converted to a digital value.

On the other hand, in this A/D converter circuit, when an analog voltage having a large amplitude and/or a large frequency such as exceed the limit is inputted, A/D-conversion cannot be carried out correctly. However, if it is understood that there is this kind of limit, applications in which it can be used do exist.

According to sixth aspect of the present invention, there is provided an A/D converter circuit, which is a parallel-type A/D converter circuit for converting an inputted analog voltage to a digital value on the basis of a clock signal using multiple comparators, the multiple comparators being constructed so that for each either of a normal operating state and a low power operating state can be selected by means of a control signal, comprising a comparator control circuit section for, in accordance with an input information signal generated on the basis of the analog voltage used in the preceding conversion, outputting the control signal, which, of the multiple comparators, brings some of the comparators to the normal operating state in the present conversion and holds the remainder of the comparators in the low power operating state.

In the A/D converter circuit directed to the sixth aspect of this invention, the comparator control circuit section outputs a control signal in accordance with an input information signal generated on the basis of the analog voltage used in the preceding conversion. This control signal selects some comparators to be brought to a normal operating state in the present conversion and holds the remaining comparators in a low power operating state. Accordingly, because the timing of the analog voltage used for selecting the comparators can be aligned with the timing of the preceding conversion at all times, it is only necessary to select and use in the present conversion the comparators corresponding to the change range of the analog voltage which can arise in the period of 1 cycle of the clock signal. Accordingly, it is possible to select suitable comparators as the normal operating state or the low power operating state at all times. Consequently, as a whole it can be made a low consumed power A/D converter circuit.

According to seventh aspect of the present invention, there is provided an A/D converter circuit, including a parallel-type A/D conversion section provided with plurality of comparators, the A/D converter circuit comprising: bias current supply sections for supplying bias current, the bias current supply sections being provided for each of the plurality of comparators; bias current setting terminals being provided for each of the bias current supply sections, bias voltage at the bias current setting terminals being set for adjusting the bias current; and resistor elements for connecting adjoining bias current setting terminals.

In the A/D converter circuit directed to the seventh aspect of this invention, the bias current supply sections supply bias current to each of the comparators constituting the parallel-type A/D conversion section and each bias current is set depending on bias voltage to be applied to each of the bias current setting terminals provided for each of the bias current supply sections.

According to the seventh aspect, there is also provided a current supply circuit, directed to claim 1, for supplying bias current to a function circuit constituted by a plurality of circuit units, the current supply circuit comprising: bias current supply sections for supplying bias current, the bias current supply sections being provided for each of the plurality of circuit units; bias current setting terminals being provided for each of the bias current supply sections, bias voltage at the bias current setting terminals being set for adjusting the bias current; and resistor elements for connecting adjoining bias current setting terminals.

In the current supply circuit directed to the seventh aspect, the bias current supply sections supply bias current to each of the plurality of circuit units and each bias current is set depending on bias voltage to be applied to each of the bias current setting terminals provided for each of the bias current supply sections.

Since bias voltage is set for each of the bias current setting terminals, bias current is determined by each of the bias current supply sections and bias current can be adjusted for each of the circuit units or each of the comparators. Thereby, bias current suitable to operation state of the circuit units or the comparators can be supplied. Since the bias current setting terminals are connected with the resistor elements, voltage corresponding to resultant voltage of each bias voltage passing through resistor elements is set for a bias current setting terminal for which bias voltage is not set and sandwiched between bias current setting terminals for which bias voltage is set. Bias current depending on a voltage value to be set for a bias current setting terminal can be supplied to a circuit unit sandwiched between circuit units in different operation state or to a comparator sandwiched between comparators in different operation state.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 3 is a table showing a relationship between input voltage, outputs of conversion comparators, and output codes, in an A/D converter circuit directed to Embodiments 1, 2;

FIG. 4 is a table showing a relationship between inputted voltage a predetermined time past, outputs of setting comparators, and set states of conversion comparators, in an A/D converter circuit directed to Embodiment 1;

FIG. 12 is an explanatory view showing an outline of a comparison section, of an A/D converter circuit directed to Embodiment 2;

FIG. 13 is a table showing a relationship of input voltage used in the preceding conversion, outputs of comparators, output codes, and set states of comparators for the present conversion, in an A/D converter circuit directed to Embodiment 2 and Variant 1;

FIG. 17 is a table showing a relationship of input voltage and comparator outputs and output codes, in an A/D converter circuit directed to Embodiment 3;

FIG. 18 is a table showing a relationship of input voltage used in the preceding conversion, set states of comparators belonging to groups, and range of output codes possible in the present conversion, in an A/D converter circuit directed to Embodiment 3;

FIG. 19 is a table showing a relationship of input voltage used in the preceding conversion, set states of comparators, and range of output codes possible in the present conversion, in an A/D converter circuit directed to Embodiment 3;

FIG. 21 is a table showing a relationship of input voltage a predetermined time past, outputs of setting comparators, and set states of comparators belonging to groups, in an A/D converter circuit directed to Embodiment 4;

FIG. 22 is an explanatory view showing the outline of a comparison section, of an A/D converter circuit directed to Embodiment 5;

FIG. 23 is a table showing a relationship of input voltage, outputs of conversion comparators, and output codes, in an A/D converter circuit directed to Embodiments 5, 6;

FIG. 24 is a table showing a relationship of input voltage a predetermined time past, outputs of setting comparators, and set states of conversion comparators, in an A/D converter circuit directed to Embodiment 5;

FIG. 28 is an explanatory view showing the outline of a comparison section, of an A/D converter circuit directed to Embodiment 6;

FIG. 29 is a table showing a relationship of input voltage used in the preceding conversion, outputs of comparators, output codes, and set states of comparators for the present conversion in an A/D converter circuit directed to Embodiment 6 and Variant 3;

FIG. 30 is an explanatory view showing a construction of a differential-type conversion comparator used in an A/D converter circuit directed to Variants 3, 4;

FIG. 32 is a table showing a relationship of input voltage, outputs of comparators and output codes, in an A/D converter circuit directed to Embodiment 7;

FIG. 33 is a table showing a relationship of input voltage used in a preceding conversion, set states of comparators belonging to groups, and range of output codes possible in the present conversion, in an A/D converter circuit directed to Embodiment 7;

FIG. 34 is a table showing a relationship of input voltage used in a preceding conversion, set states of comparators, and range of output codes possible in the present conversion, in an A/D converter circuit directed to Embodiment 7;

FIG. 36 is a table showing a relationship of input voltage a predetermined time past, outputs of setting comparators, and set states of conversion comparators belonging to groups, in an A/D converter circuit directed to Embodiment 8;

FIG. 37 is a circuit block diagram of an Embodiment 9;

FIG. 38 is an A/D conversion table of the Embodiment 9;

FIG. 42 is a bias voltage setting table for each comparator;

DETAILED DESCRIPTION OF THE PREFERRED EMBODIMENTS (First Embodiment)

Figure 1:
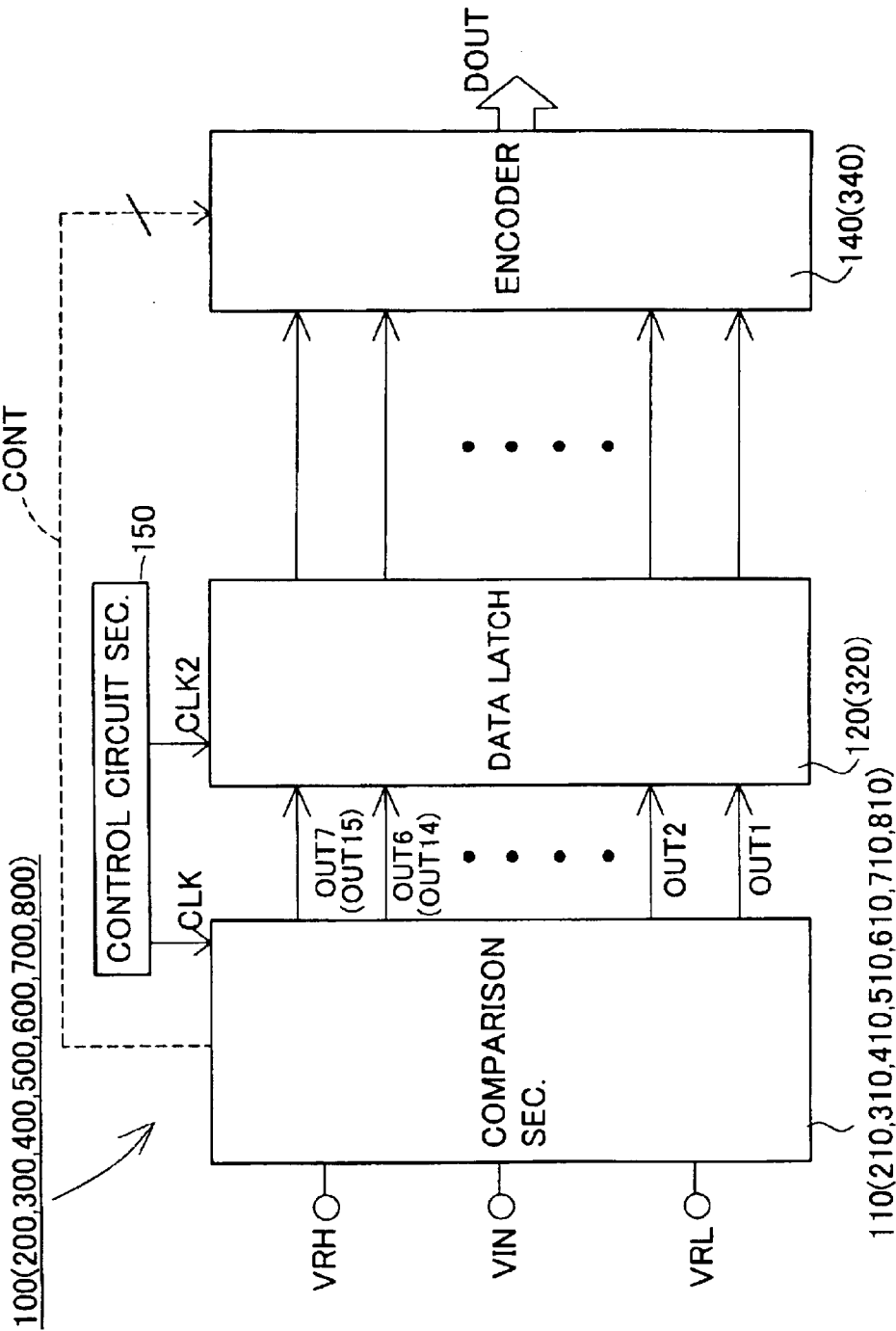
FIG. 1 is a block diagram showing the outline of an A/D converter circuit directed to Embodiments 1, 2, 3.
Figure 2:
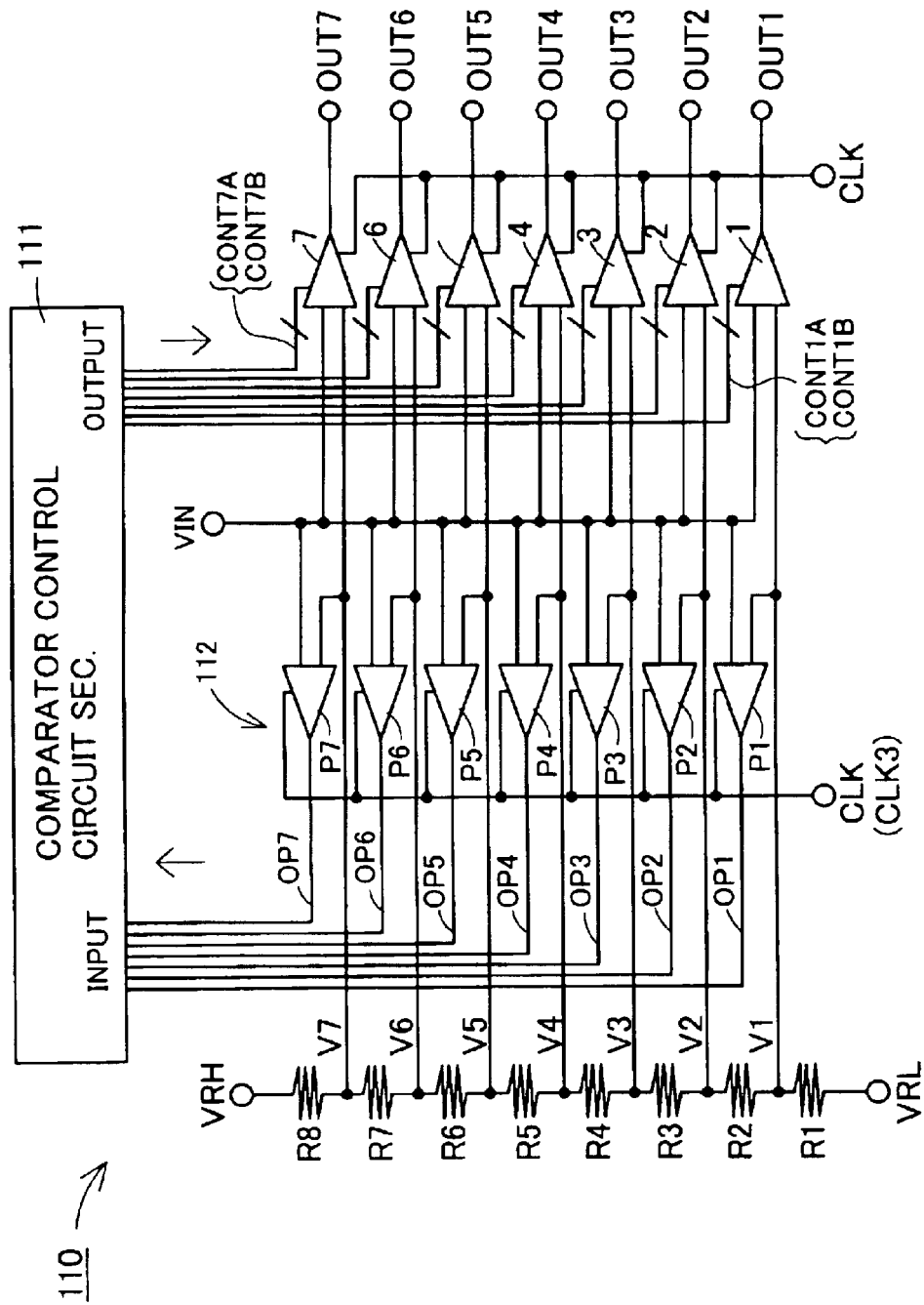
FIG. 2 is an explanatory view showing the outline of a comparison section, of an A/D converter circuit directed to Embodiment 1.
Figures 5, 6:
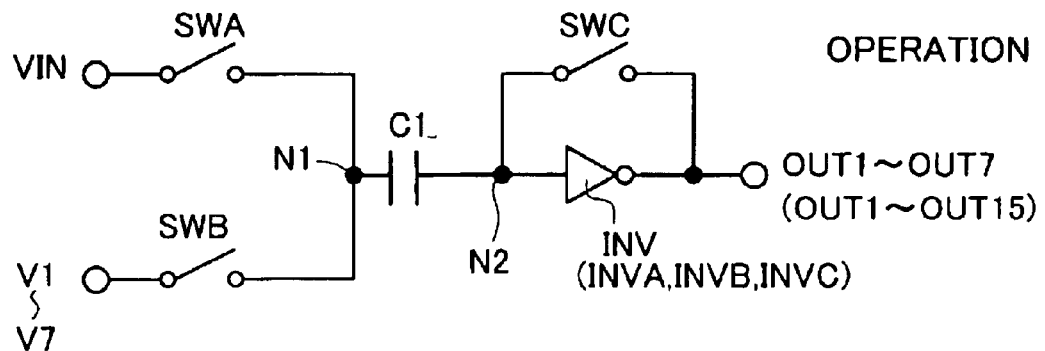
FIG. 5 is an explanatory view showing a construction of a main part of a chopper-type conversion comparator.
FIG. 6 is a table showing a relationship of operations and switches of the main part of a chopper-type conversion comparator shown in FIG. 5.
Figure 7:
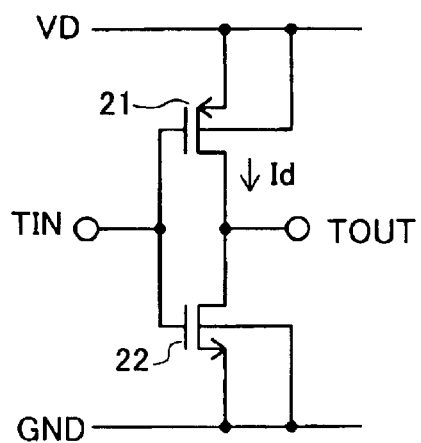
FIG. 7 is a circuit diagram showing a circuit construction of an inverter device.
Figure 8:
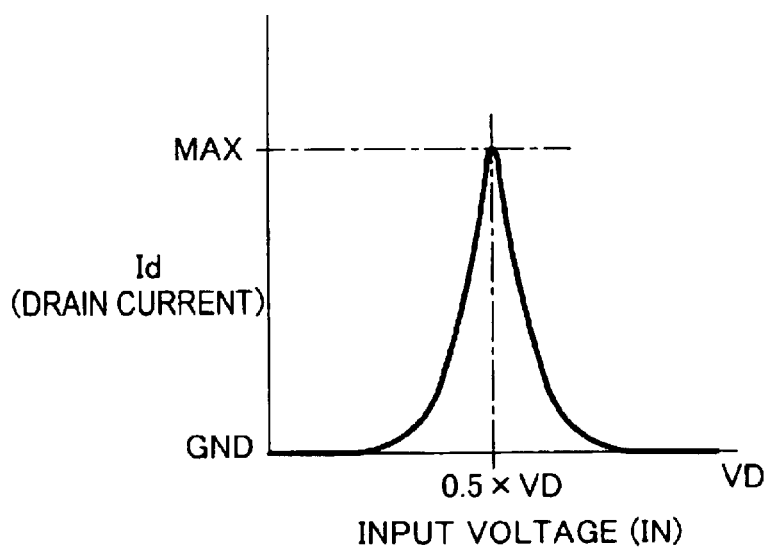
FIG. 8 is a graph showing a relationship of input voltage and drain current of an inverter device in FIG. 7.
Figure 9:
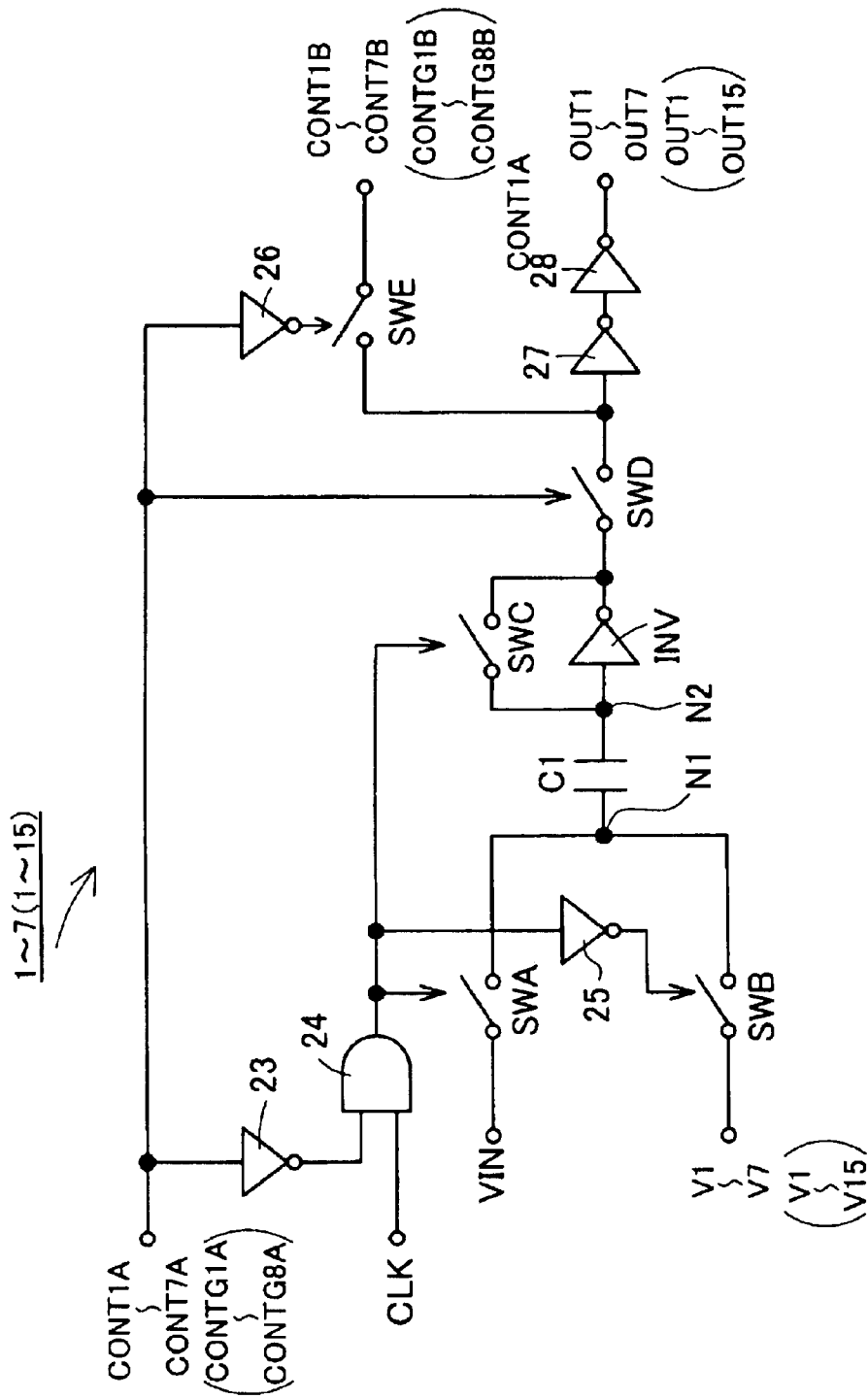
FIG. 9 is an explanatory view showing a construction of a chopper-type conversion comparator.
Figure 10:
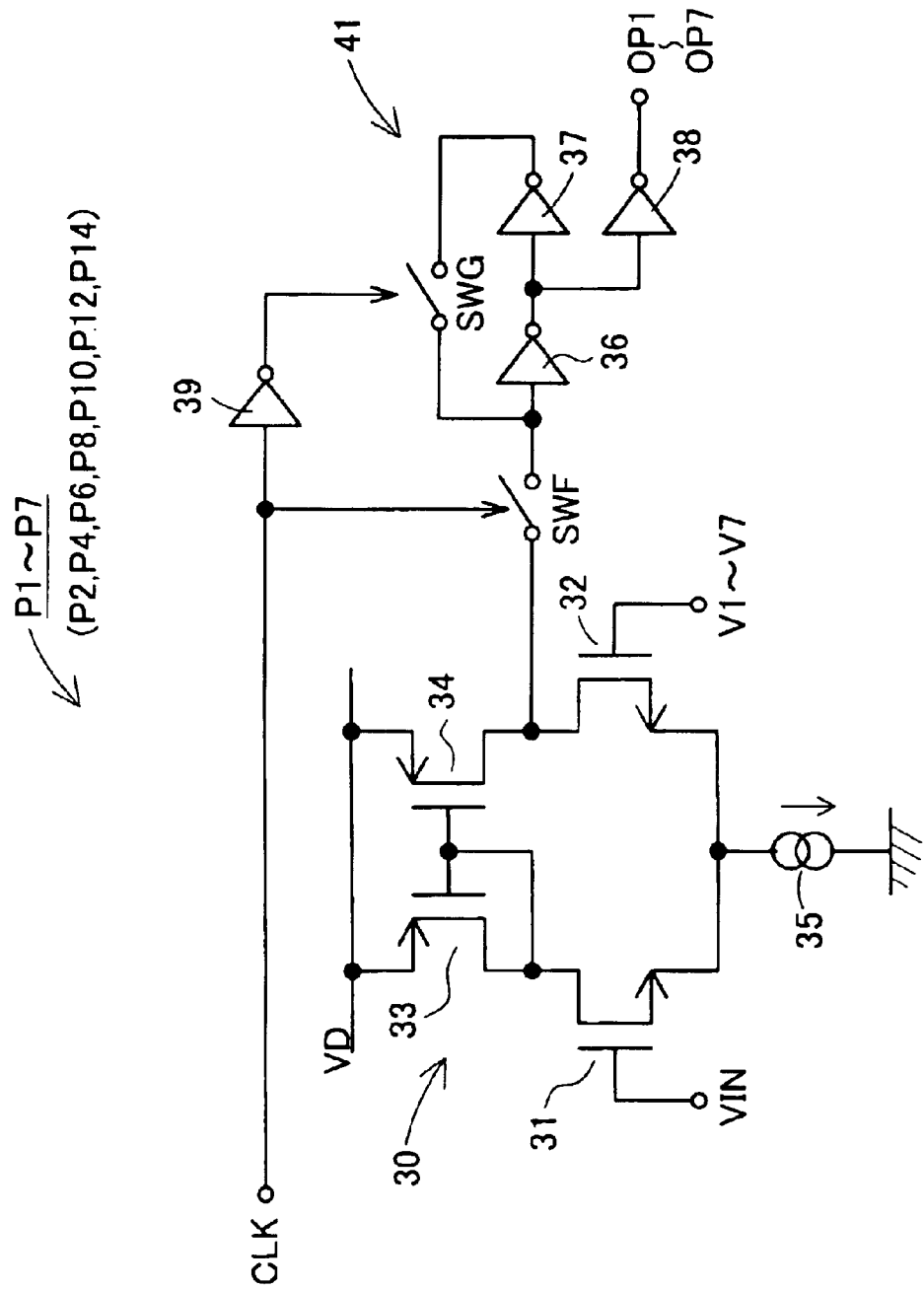
FIG. 10 is an explanatory view showing a construction of a differential-type setting comparator.

A parallel-type A/D converter circuit 100 directed to a first embodiment of this invention will be described with reference to FIG. 1–FIG. 10. Of these, FIG. 1 is a block diagram showing the outline of the A/D converter circuit, FIG. 2 is an explanatory view showing the outline of a comparison section of this, FIG. 3 is a table showing a relationship between input voltage, outputs of conversion comparators, and output codes. And, FIG. 4 is a table showing a relationship between input voltage a predetermined time past, outputs of setting comparators, and set states of conversion comparators. FIG. 5 is an explanatory view showing the construction of a main part of a chopper-type conversion comparator, FIG. 6 is a table showing a relationship of the operation of this part and its switches, FIG. 7 is a circuit diagram showing the circuit construction of an inverter device, and FIG. 8 is a graph showing a relationship between the input voltage and drain current of this inverter device. Further, FIG. 9 is an explanatory view showing the construction of a chopper-type conversion comparator, and FIG. 10 is an explanatory view showing the construction of a differential-type setting comparator.

The A/D converter circuit 100 of this Embodiment 1 is a circuit for converting an analog voltage VIN to a 3-bit digital output DOUT corresponding to this value at intervals of a predetermined period, and, as shown in FIG. 1, has a comparison section 110, a data latch 120, an encoder 140 and a control circuit section 150. Of these, to the comparison section 110 is inputted, besides a high-level standard voltage VRH, a low-level standard voltage VRL and the analog voltage VIN, a clock signal CLK from the control circuit section 150. This comparison section 110, as will be discussed later, outputs conversion comparator outputs OUT1–OUT7. These conversion comparator outputs OUT1–OUT7 are inputted to the data latch 120. The data latch 120 holds and outputs the conversion comparator outputs OUT1–OUT7 all together on the basis of a second clock signal CLK2 supplied from the control circuit section 150, and the encoder 140 is connected to the output side of this data latch 120. This encoder 140 encodes the conversion comparator outputs OUT1–OUT7 into the digital output DOUT, which is binary digital data, and outputs it. For the data latch 120, the encoder 140 and the control circuit section 150, known circuit constructions can be employed.

Next, with reference to FIG. 2, the comparison section 110 will be explained. In the comparison section 110, by means of 8 identical voltage-dividing resistors R1–R8 connected in series between the high standard voltage VRH and the low standard voltage VRL, seven reference voltages V1–V7 are obtained. And, it has 7 chopper-type conversion comparators 1–7, an input information generating circuit section 112 made up of 7 differential-type setting comparators P1–P7, and a comparator control circuit section 111.

Of these, the setting comparators P1–P7 constituting the input information generating circuit section 112 respectively refer exclusively to and correspond one-to-one with the seven reference voltages V1–V7. The setting comparators P1–P7, every cycle of the inputted clock signal CLK, make a comparison with the analog voltage VIN, and update setting comparator outputs OP1–OP7 to either a high level (hereinafter sometimes indicated simply by "H") or a low level (hereinafter sometimes indicated simply by "L") and output them.

Because the reference voltages V1–V7 have the relationship V1<V2< . . . <V6<V7, the one with the larger number is the higher-level reference voltage. And similarly, the one with the larger number is the higher-level setting comparator.

The comparator control circuit section 111 performs predetermined logical processing on these inputted setting comparator outputs OP1–OP7 and outputs first setting signals CONT1A–CONT7A and second setting signals CONT1B–CONT7B. The first and second setting signals CONT1A etc. are used for state-setting of the conversion comparators 1–7 in the next conversion, i.e. in the next cycle of the clock signal CLK.

Because the conversion comparators 1–7 have the construction discussed later, they are set by these first and second setting signals CONT1A etc. to two states, an operating state in which they are operated as normal comparators and a resting state in which their operation is suspended and they hold a specified state. More specifically, they are set to any of three states, an operating state, a resting and "H" output state and a resting and "L" output state.

Specifically, the conversion comparators 1–7 respectively refer exclusively to and correspond one-to-one with the seven reference voltages V1–V7, and when they are set to the operating state, every cycle of the inputted clock signal CLK, they each compare the analog voltage VIN with the reference voltage V1 etc., and update and output the conversion comparator outputs OUT1–OUT7 having either the level "H" or "L". When one is set to the resting state and the "H" output state, its output is fixed at "H". And when one is set to the resting state and the "L" output state, its output is fixed at "L".

For the conversion comparators 1 etc., the one with the larger number is the higher-level conversion comparator.

Next, the circuit construction of the setting comparator P1–P7 will be described, with reference to FIG. 10. The setting comparators P1–P7 are all differential-type comparators of the same construction, and furthermore their outputs are updated every cycle of the clock signal CLK.

The setting comparator P1–P7 compares the analog voltage VIN with the reference voltage V1 etc. by means of a differential circuit 30. The differential circuit 30 is made up of CMOS, and has an N-channel 31 to the gate of which the analog voltage VIN is applied, and an N-channel 32 to the gate of which one of the reference voltages V1–V7 is applied. The drain of the N-channel 31 is connected via a P-channel 33 and the drain of the N-channel 32 via a P-channel 34 to a power supply potential VD. The gates of the P-channels 33, 34 are both connected to the drain of the N-channel 31. And, the sources of the N-channels 31, 32 are connected commonly to ground by way of a constant current circuit 35. In this differential circuit 30, the difference between the analog voltage VIN and the reference voltage V1 etc. appears as the drain voltage of the N-channel 32.

The drain of the N-channel 32 is connected by way of a switch SWF to a holding circuit 41. In this holding circuit 41, inverters 36, 37 are connected in series, and a connection between the input terminal of the inverter 36 and the output terminal of the inverter 37 is opened and closed by a switch SWG. Also, the setting comparator output OP1–OP7 is outputted from an inverter 38 branching from the output terminal of the inverter 36.

Here, the switches SWF, SWG are analog switches which specifically are constructed of MOS transistors or the like and are ON when their control signal is "H" and OFF when it is "L", and are opened and closed by the clock signal CLK. An inverter 39 makes the opening and closing of the switch SWF and the switch SWG opposite in phase.

In setting comparators P1–P7 having this kind of construction, in the period over which the clock signal CLK is "H", the switch SWF comes ON and the switch SWG goes OFF, and consequently the result of the comparison of the reference voltage V1–V7 with the analog voltage VIN is outputted from the inverter 38. On the other hand, in the period over which the clock signal CLK is "L", because the switch SWF goes OFF and the switch SWG comes ON, the preceding output result is held and continues to be outputted from the inverter 38.

Accordingly, in this A/D converter circuit 100, depending on which of the ranges bounded by the high standard voltage VRH, the low standard voltage VRL and the reference voltages V1–V7 the magnitude of the analog voltage VIN belongs to, the setting comparator outputs OP1–OP7 of the setting comparators P1–P7 become either "H" or "L". Consequently, the analog voltage VIN and the setting comparator outputs OP1–OP7 of the setting comparators P1–P7 assume the relationship shown in the left half of the table shown in FIG. 4.

Next, the circuit construction and operation of the conversion comparators 1–7 will be described, with reference to FIG. 5–FIG. 9. The conversion comparators 1–7 are all chopper-type comparators of the same construction, and, as mentioned above, when they are set to the operating state their outputs OUT1–OUT7 are updated every cycle of the clock signal CLK. First the case where they are set to the operating state will be explained.

The operation of a main part of a chopper-type conversion comparator 1–7 (see FIG. 5) will be explained. The main part of the conversion comparator 1 etc. has a switch SWA to which the analog voltage VIN is inputted and a switch SWB to which the reference voltage V1–V7 is inputted. The output sides of the switches SWA, SWB are connected to a node N1, and one terminal of a capacitor C1 is connected to this node N1. The other terminal of the capacitor C1 is connected to the input terminal of an inverter INV made up of CMOS, and the comparison result comparator output OUT1–OUT7 is outputted from the output terminal of this inverter INV. A switch SWC is connected in parallel with the inverter INV.

As shown in FIG. 6, there are two operating states of this conversion comparator 1 etc., a VIN voltage fetching state and a comparing state. That is, in the VIN voltage fetching state, the switches SWA, SWC are turned ON, and the switch SWB is turned OFF. In the comparing state, on the other hand, the switches SWA and SWC are turned OFF and the switch SWB is turned ON.

All three of the switches SWA, SWB and SWC are analog switches which become ON with an "H" input and become OFF with an "L" input.

The inverter device INV, as shown in FIG. 7, has a known CMOS circuit construction in which a P-channel MOS transistor 21 and an N-channel MOS transistor 22 are connected in series, and has the characteristic that, as shown in FIG. 8, when an input voltage inputted to its input terminal TIN is in the vicinity of half of the power supply voltage VD (=0.5 VD), the drain current Id which flows rises sharply. As mentioned above, in the VIN voltage fetching state, the switch SWB is OFF, but the switch SWA becomes ON (see FIG. 5). Consequently, the potential of the node N1 becomes the analog voltage VIN. And, because the switch SWC becomes ON and the input terminal TIN and the output terminal TOUT of the inverter INV are short-circuited, the input and output voltages of this inverter INV both assume the value of approximately half of the power supply voltage VD (VD/2). As a result, the voltage across the terminals of the capacitor C1 is charged to the value of (VD/2−VIN).

Now, in this VIN voltage fetching state, because the switch SWC is turned ON and the input terminal TIN and the output terminal TOUT of the inverter INV are short-circuited, the MOS transistors 21 and 22 both become ON, and a large drain current (through current) flows. That is, it can be seen that this VIN voltage fetching state is a state in which the power consumption is large.

On the other hand, in the comparing state, the switch SWC becomes OFF, and the inverter INV operates as an amplifier circuit. Because the switch SWB becomes ON and the SWA becomes OFF, the reference voltage V1–V7 is impressed on the node N1. As mentioned above, at this time, the voltage across the terminals of the capacitor C1 has already been charged to the voltage (VD/2−VIN), and consequently the voltage of the input terminal of the inverter INV becomes for example VD/2−(VIN−V1). Thus, the conversion comparator outputs OUT1–OUT7 outputted from the inverter s INV of the conversion comparators 1–7 become "H" when VIN>Vi (where i=1–7) and become "L" when VIN<Vi. That is, with the analog voltage VIN as a boundary, from conversion comparators using a lower reference voltage than this, "H" is outputted, and from conversion comparators using a higher reference voltage, "L" is outputted.

And, in this comparing state, because there is no flowing of a current steadily, it can be seen that it is a state wherein the consumed power is small.

Because chopper-type conversion comparators 1–7 like this are used alternating between a VIN voltage fetching state and a comparing state under the clock signal CLK, when the conversion comparators 1–7 are brought to the operating state, in which they are brought to the VIN voltage fetching state and then brought to a comparing state, a large power consumption arising in the period of the VIN voltage fetching state cannot be avoided. And, the consumed power at this time is generally larger than the consumed power of when the differential-type setting comparators P1–P7 are operated constantly.

Now, as mentioned above, generally, it is normal for the amplitude of the analog voltage VIN inputted to the A/D converter circuit to be smaller than the maximum amplitude that can be A/D-converted by this circuit and for the frequency also to be amply low compared to the clock signal. That is, with respect to the analog voltage inputted at a point in time set by a certain clock signal, there is a limit to the change amount of the analog voltage which can arise by the point in time set by the clock signal of the next cycle. Therefore, if the analog voltage inputted at the point in time decided by a certain clock signal is known, from this, it is possible to predict with a certain width the analog voltage which will be inputted at the point in time decided by the clock signal of the next cycle. In which case, it is not necessary to have all of the conversion comparators in their operating state all the time, and it becomes practical to bring only some of the conversion comparators to the operating state and for the other conversion comparators, so that they do not assume the VIN fetching state, which has large consumed power, specifically, to bring them to a resting state in which they hold in the comparing state. If this is done, the power consumed by the A/D converter circuit 100 can be suppressed.

In this connection, it will be supposed that, as the characteristic of the inputted analog voltage VIN, the range through which the analog voltage VIN can change in the period of one cycle of the clock signal CLK is not greater than ⅛ (the reciprocal of the figure obtained by adding 1 to the number of comparators) of the maximum amplitude which can be A/D-converted by the A/D converter circuit 100. Under this supposition, in the A/D converter circuit 100 of this Embodiment 1, in the comparator control circuit section 111, the setting comparator outputs OP1–OP7 are logic-processed, the first and second setting signals CONT1A etc. are generated, and the states of the conversion comparators 1–7 in the next conversion are set as shown in the right half of the table shown in FIG. 4. In FIG. 4, the operating state is shown by ○ and the resting state is shown by Δ.

The specific setting content of this table will now be explained.

First, when setting comparator outputs OP1–OP7 showing that setting comparators having determined that the analog voltage VIN inputted 1 cycle of the clock signal ago is greater than the reference voltages V1–V7 which they refer to themselves exist are inputted to the comparator control circuit section 111, specifically, when there are those at "H" among the setting comparator outputs OP1–OP7, the following is carried out. [1] The specified conversion comparator referring to the same reference voltage as the reference voltage (i.e. the common reference voltage) referred to by the highest-level setting comparator (in other words the one with the greatest potential of its reference voltage) among the setting comparators having made this "H" determination, and the conversion comparator one level higher than this specified conversion comparator, are brought to the operating state (shown ○ in FIG. 4). [2] The conversion comparators other than these are brought to the resting state. [3] The higher-level conversion comparators than the conversion comparators brought to the operating state are set to output "L" (shown Δ/L in FIG. 4), and the lower-level conversion comparators are set to output "H" (shown Δ/H in FIG. 4) This will now be explained specifically. Among the setting comparator outputs OP1–OP7, when there are outputs made high-level "H", that is, when the analog voltage VIN is determined to be higher than the reference voltage V1, the following is done. For example, a case wherein, because as the analog voltage VIN a voltage in the range V5–V6 has been inputted the setting comparator outputs OP1–OP7 have become (H, H, H, H, H, L, L) will be considered. [1] The conversion comparator 5 referring to the same reference voltage (the common reference voltage V5) as the highest-level setting comparator P5 among the setting comparators P1–P5 outputting "H", and the conversion comparator 6 one level higher than this conversion comparator 5, are brought to the operating state.

This is because, since the characteristic of the inputted analog voltage VIN was assumed as described above, the analog voltage VIN that will be compared by the conversion comparators in the next conversion can be predicted to be in one of the ranges of reference voltages V4–V5, V5–V6, or V6–V7. That is, it is because, from the comparison results of 1 cycle earlier in the setting comparators P1 etc., the only conversion comparators for which the comparison result obtained by the conversion comparators 1 etc. 1 cycle later than that cannot be predicted are the conversion comparators 5, 6.

Generalizing this, it is because, from the comparison results (the setting comparator outputs OP1 etc.) obtained by the setting comparators P1 etc. 1 cycle earlier in the clock signal CLK, the ones for which the comparison result that will be obtained by the conversion comparators 1 etc. 1 cycle later than that cannot be predicted are only the specified conversion comparator referring to the same reference voltage as the highest-level setting comparator among the setting comparators outputting "H" and the conversion comparator one level higher than this. Accordingly, these are brought to the operating state.

[2] The other conversion comparators 1–4, 7 are brought to the resting state. [3] The conversion comparator 7, higher-level than the conversion comparators 5 and 6 brought to the operating state, is set to output "L", and the lower-level conversion comparators 1–4 are set to output "H".

The relationship described above also applies similarly within whichever of the reference voltage ranges V1–V2, V2–V3, . . . , V6–V7, V7-VRH the analog voltage VIN inputted 1 cycle earlier in the clock signal CLK was. However, when the analog voltage VIN inputted 1 cycle earlier was in the range V7-VRH, no conversion comparator 1 level higher exists.

On the other hand, when setting comparator outputs OP1–OP7 indicating that there are no setting comparators which have determined that the analog voltage VIN inputted 1 cycle ago in the clock signal CLK is larger than their reference voltage have been inputted to the comparator control circuit section 111, specifically, when the setting comparator outputs OP1–OP7 are all "L", the following is done. [4] The lowest-level conversion comparator 1 is brought to the operating state. This is because, from the comparison results (the setting comparator outputs OP1 etc.) obtained by the setting comparators P1 etc. 1 cycle earlier, that for which the comparison result (the comparator output OUT1 etc.) that will be obtained by the conversion comparator 1 etc. 1 cycle later than that cannot be predicted is only the conversion comparator 1. [5] The other conversion comparators 2–7 are held in the resting state. [6] The other conversion comparators 2–7 are set to output "L".

Thus, in whichever of the ranges of low standard voltage VRL-high standard voltage VRH the value of the analog voltage VIN of 1 cycle earlier was, a relationship of setting states shown in the right half of the table of FIG. 4 is obtained, and in all the cases, the consumed power in the whole A/D converter circuit 100 can be suppressed.

A circuit construction of a conversion comparator 1–7 for performing operation based on this kind of setting is shown in FIG. 9. Here, the first setting signal CONT1A–CONT7A is a signal controlling switching of the respective conversion comparator 1–7 between the operating state and the resting state, and specifically orders the conversion comparator 1–7 to be brought to the operating state with "H" and orders it to be brought to the resting state with "L". And, the second setting signal CONT1B–CONT7B is a signal controlling which of "H" and "L" the conversion comparator 1–7 outputs, with the premise that it has been brought to the resting state, and with "H" orders the conversion comparator 1-7 to output "H" and with "L" orders the conversion comparator 1-7 to output "L".

As already explained, the conversion comparator 1 etc. has a switch SWA to which the analog voltage VIN is inputted, and a switch SWB to which a reference voltage V1–V7 is inputted. The output sides of the switches SWA, SWB are connected to a node N1, and one terminal of a capacitor C1 is connected to this node N1. The other terminal of the capacitor C1 is connected to the input terminal of an inverter INV. And, a switch SWC is connected in parallel with the inverter INV. Further, the output terminal of the inverter INV is connected via a switch SWD to an inverter 27, and also, through an inverter 28 an output of the same phase as that of the inverter INV is outputted as a comparator output OUT1–OUT7.

Also, a two-input AND device 24 is interposed between the clock signal CLK and the switches SWA, SWB, SWC, and to this AND device 24 is inputted a signal obtained by inverting the first setting signal CONT1A–CONT7A with an inverter 23 in parallel with the clock signal CLK. Accordingly, when the first setting signal CONT1A etc. is "H", the switches SWA etc. assume an operating state in which they operate under the clock signal CLK. The switch SWB is driven in opposite phase to the switch SWA, by means of an inverter 25. On the other hand, when the first setting signal CONT1A etc. is "L", irrespective of the clock signal CLK the switches SWA, SWC are turned OFF and the switch SWB is turned ON. That is, it is forcibly fixed in the comparing state, and assumes a resting state (see FIG. 6). Thus, as a result of the first setting signal CONT1A etc. being made "L", the operation of this conversion comparator stops, but it is prevented from assuming the VIN fetching state, in which its consumed power is large, and power consumption can be suppressed.

Also, the switch SWD is opened and closed by the first setting signal CONT1A etc., and the second setting signal CONT1B etc. is inputted to the input terminal of the inverter 27 via a switch SWE. This switch SWE is opened and closed by a signal obtained by inverting the first setting signal CONT1A etc. with an inverter 26. And, the opening and closing of the switch SWD and the opening and closing of the switch SWE become opposite in phase. The switches SWD, SWE are also analog switches, and when the first setting signal CONT1A etc. is "H", the switch SWD becomes ON, and the switch SWE becomes OFF. In this case, the output of the inverter INV is transmitted to the inverter 27 and an output of the same phase as this is outputted as a comparator output OUT1–OUT7. On the other hand, when the first setting signal CONT1A etc. is "L", the switch SWD becomes OFF and the switch SWE becomes ON. Because consequently the second setting signal CONT1B etc. is inputted to the inverter 27, if the second setting signal CONT1B etc. is "H", "H" is outputted as the comparator output OUT1 etc., and conversely if the second setting signal CONT1B etc. is "L", "L" is outputted as the comparator output OUT1 etc.

In this way, it is possible to select three states of the conversion comparators 1 etc., an operating state, a resting state and "H"-output state, and a resting state and "L"-output state, by using the first setting signal CONT1A etc. and the second setting signal CONT1B etc.

Of the conversion comparators 1–7 set like this, for the conversion comparators brought to the operating state (for example the conversion comparators 5, 6), as a result of comparing the analog voltage VIN with the reference voltages (for example the reference voltages V5, V6), the conversion comparator outputs of these conversion comparators also become "H" or "L".

In this way, even in this A/D converter circuit 100, depending on which of the ranges (for example V5–V6) divided by the high standard voltage VRH, the low standard voltage VRL and the reference voltages V1–V7 the magnitude of the analog voltage VIN belongs to, the outputs of the conversion comparators 1–7 become "H" or "L". Consequently, the analog voltage VIN and the conversion comparator outputs OUT1–OUT7 of the conversion comparators 1–7 assume the relationship shown in the table of FIG. 3. This relationship is the same as the result obtained when all of the conversion comparators are operated.

Accordingly, thereafter, by similar processing, by means of the encoder 140, in accordance with the conversion comparator outputs OUT1–OUT7, a digital output DOUT corresponding to these can be generated. In the table of FIG. 3, the digital output DOUT is expressed as a decimal output code.

In this way, with the A/D converter circuit 100 set forth in this Embodiment 1, of the conversion comparators 1–7, in correspondence with a predicted change range of the analog voltage, conversion comparators whose comparison result cannot be predicted are selected and these are set to a normal operating state, and the remaining conversion comparators, whose comparison result can be predicted, are brought to a resting state, before use for the present conversion, and consequently it is possible to select and bring to the operating state suitable conversion comparators at all times. Also, since because only a suitable number of conversion comparators need to be brought to the operating state the number of the remaining first comparators to be held in the resting state can be made large, it can be made a more lower consumed power A/D converter circuit.

And, in the A/D converter circuit 100, in the input information generating circuit section 112, using 7 setting comparators operating under the clock signal CLK, outputs OP1–OP7, which are input information signals, are generated. Because of this, the timing of the operating state or resting state selection of the conversion comparators 1 etc. can be aligned with a fixed timing determined by the clock signal CLK (in this Embodiment 1, 1 cycle past). Therefore, it is possible to select suitable conversion comparators and bring them to the operating state or the resting state at all times.

And, the A/D converter circuit 100 has the same number (7) of setting comparators P1–P7, which refer to the same reference voltages V1–V7 as the conversion comparators 1–7. Consequently, in selection-determining which of the 7 conversion comparators 17 are to be brought to the operating state and which are to be brought to the resting state, 7 comparison results (outputs OP1–OP7) obtained by means of the setting comparators P1–P7 can be used, and the selection determination becomes easy.

Also, in the A/D converter circuit 100, in correspondence with the determinations (outputs OP1 etc.) of the setting comparators P1 etc., of the conversion comparators 1–7 only 1 or 2 are brought to the operating state, and the others are brought to the resting state. Therefore, the consumed power of the A/D converter circuit 100 can be greatly reduced.

Also, in this A/D converter circuit 100, because differential-type setting comparators are used as the comparators P1–P7, they can be made lower in consumed power than when chopper-type comparators are used for these.

Now, in this Embodiment 1, an example was shown wherein the setting comparators P1–P7 and the conversion comparators 1–7 are driven by the same clock signal CLK, and using setting comparator outputs OP1 etc. obtained 1 cycle past in the clock signal CLK, first and second setting signals CONT1A etc. are generated and used for the state-setting of the conversion comparators 1–7 in the next cycle.

Figure 11:
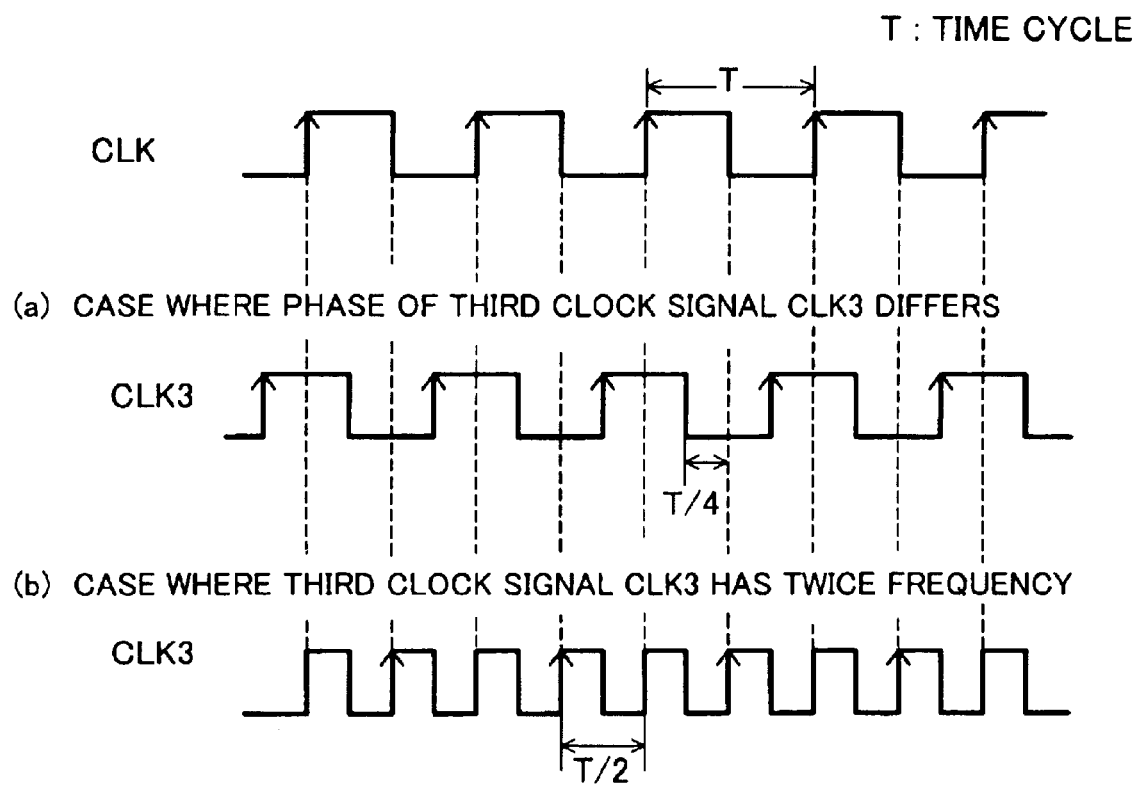
FIG. 11 is an explanatory view showing a relationship of the clock signal CLK and the third clock signal CLK3 of a case where setting comparators are driven by a third clock signal CLK3 different from the clock signal CLK, (a) is a case where the phase of the third clock signal CLK3 differs, and (b) is a case where the third clock signal CLK3 has twice the frequency.

However, as shown in FIG. 2, alternatively the setting comparators P1–P7 (the input information generating circuit section 112) may be driven with a third clock signal CLK3, different from the clock signal CLK. As the third clock signal CLK3, a signal having the same frequency as the clock signal CLK but with a different phase, having a reverse-phase waveform or a waveform ¼ -period shifted (see FIG. 11(a)) can be used. By using a third clock signal CLK3 like this, it is possible to obtain setting comparator outputs OP1 etc. acquired for state-setting of the conversion comparators 1–7 on the basis of the analog signal of a shorter time past than 1 cycle in the clock signal CLK (for example, in the case of FIG. 11(a), T/4 past (where T is the period of the clock signal CLK)). When this is done, the range over which the analog voltage VIN can change in this time becomes smaller than the range over which it can change in the interval of 1 cycle of the clock signal. That is, in selecting conversion comparators to be brought to an operating state or a resting state on the basis of a past analog voltage, because the nearer in the past the analog voltage VIN to be made the base is the smaller the range through which the analog voltage VIN can change thereafter, it is possible to make the number of conversion comparators brought to the operating state small and make the number of conversion comparators brought to the resting state large, and it is possible to suppress the consumed power of the A/D converter circuit more. Or, if the same number of conversion comparators are brought to the operating state, it is possible to perform A/D-conversion correctly on an analog voltage VIN with a larger amplitude and a higher frequency.

Or, as the third clock signal CLK3, a signal having a frequency an integer multiple of the clock signal CLK can alternatively be used. For example, a case wherein a third clock signal CLK3 having a frequency twice the clock signal CLK is used will be explained. Also, it will be assumed that every 2 cycles of this third clock signal CLK3 the timing of its rise becomes the same as the rise timing of the clock signal CLK once (see FIG. 11(b)). In this case, of the rise timing of the third clock signal CLK3 every 2 cycles, if the rise timing which is not the same as the rise timing of the clock signal CLK (the timing shown with arrows in FIG. 11(b)) is used, comparison results of the setting comparators P1 etc. (setting comparator outputs OP1 etc.) can be obtained ½ a cycle (T/2) earlier (past) than the conversion by the conversion comparators 1 etc. In this case also, the number of conversion comparators brought to the operating state can be made small and the number of conversion comparators brought to the resting state made large and the consumed power of the A/D converter circuit can be suppressed more. Or, if the same number of conversion comparators are brought to the operating state, it is possible to perform A/D-conversion correctly on an analog voltage VIN with a larger amplitude and a higher frequency.

(Second Embodiment)

Next, a parallel-type A/D converter circuit 200 directed to a second embodiment will be described, with reference to FIG. 12–FIG. 14. The A/D converter circuit 200 of this Embodiment 2 is a 3-bit A/D converter circuit, like the A/D converter circuit 100 of Embodiment 1. However, as can be understood by comparing FIG. 12 and FIG. 2, it differs in the point that in a comparison section 210, it has no setting comparators P1–P7. Accordingly, the explanation will center on the different parts, and similar parts have been given the same numbers and their explanation will be omitted or simplified.

The A/D converter circuit 200 also is a circuit for converting an analog voltage VIN to a 3-bit digital output DOUT at intervals of a predetermined period applied with a clock signal CLK, and has the comparing section 210, a data latch 120, an encoder 140 and a control circuit section 150 (see FIG. 1). To the comparing section 210 is inputted, besides a high standard voltage VRH, a low standard voltage VRL and the analog voltage VIN, a clock signal CLK from the control circuit section 150.

In the comparing section 210 shown in FIG. 12, seven reference voltages V1–V7 are obtained by means of 8 identical voltage-dividing resistors R1–R8 connected in series between the high standard voltage VRH and the low standard voltage VRL. And, it has 7 chopper-type comparators 1–7 and a comparator control circuit section 211.

The comparators 1–7 have the same circuit construction as the conversion comparators 1–7 (see FIG. 9) in Embodiment 1, and are set by first and second setting signals CONT1A etc. outputted from the comparator control circuit section 211 to any of three states, an operating state in which they can function as normal comparators, a resting state and "H"-output state, and a resting state and "L"-output state.

Specifically, the comparators 1–7 respectively refer exclusively to and correspond one-to-one with the seven reference voltages V1–V7, and when they are set to the operating state, every cycle of the inputted clock signal CLK, compare them with the analog voltage VIN and update and output conversion comparator outputs OUT1–OUT7 at either "H" or "L". On the other hand, when one is set to the resting state and "H"-output state, its output is fixed at "H". And when one is set to the "L" output state, its output is fixed at "L".

And, the comparator outputs OUT1–OUT7, besides being outputted and inputted to the data latch 120, are each branched and inputted to the comparator control circuit section 211.

The comparator control circuit section 211 performs predetermined logical processing on these inputted comparator outputs OUT1–OUT7 and outputs first setting signals CONT1A–CONT7A and second setting signals CONT1B–CONT7B like those of Embodiment 1.

Because the comparators 1–7 have the same circuit construction as the conversion comparators 1–7 of Embodiment 1 (see FIG. 9), similarly, in the VIN fetching state, in which the switch SWC is turned ON, they consume power greatly, but in the comparing state, in which the switch SWC becomes OFF, they do not consume much power. And, by bringing the first setting signal CONT1A etc. to "L" it is possible to forcibly bring one to the comparing state, and moreover by means of the second setting signal CONT1B etc. the comparator output OUT1–OUT7 of that time can be fixed at "H" or "L".

In this connection, the first and second setting signals CONT1A etc. are obtained using comparator outputs OUT1–OUT7 obtained in the last (1 cycle earlier) conversion in the comparators 1–7. And these are used in the state-setting of the comparators 1–7 for the next (1 cycle later than this) conversion.

Specifically, as shown in the table of FIG. 13, set states of the comparators 1–7 are decided in correspondence with the magnitude of the analog voltage VIN used in the preceding conversion. For example, when the analog voltage VIN used in the preceding conversion is within the range of reference voltage V3–V4, the outputs (comparison results) of the comparators 1–7 at this point in time become, in rank from the lower level comparators, (H, H, H, L, L, L, L,). Now, it will be supposed that the characteristic of the inputted analog voltage VIN is such that the range over which the analog voltage VIN can change in the period of 1 cycle is not greater than ⅛ (the reciprocal of the figure obtained by adding 1 to the number of comparators) of the maximum amplitude which can be A/D-converted by the A/D converter circuit 200. In this case, the analog voltage VIN compared in the next conversion is expected to lie in one of the ranges of reference voltage V2–V3, V3–V4 or V4–V5. That is, if this kind of analog signal is made a premise, from the comparison results in the preceding conversion, the comparators for which the comparison result in this next conversion cannot be predicted are only the comparators 3, 4. Expressing this generally, they are only the highest-level comparator among the comparators outputting "H" and the comparator one level higher than this.

Since the comparators for which the comparison result cannot be predicted are limited like this, in this Embodiment 2, the comparators 3, 4 are brought to the operating state (shown ○ in FIG. 13). On the other hand, the comparators 1, 2 lower-level than these are brought to the resting state and "H"-output state (shown with Δ/H in FIG. 13), and the comparators 5, 6, 7 higher-level than these are brought to the resting state and "L"-output state (shown Δ/L in FIG. 13). When it is done in this way also, as long as the analog voltage VIN compared in the next conversion is within the range of reference voltage V2–V5 fitting the above-mentioned premise, the same comparator outputs OUT1–OUT7 as when all of the 7 comparators 1–7 are brought to the operating state will be obtained. Thus, in this way also, correct A/D-conversion is possible.

Furthermore, by doing this, of the 7 comparators, because the 5 comparators 1, 2, 5–7 can be brought to the resting state, it is possible to suppress the consumed power in the whole A/D converter circuit 200.

The relationship above also applies similarly within whichever of the reference voltage ranges V1–V2, V2–V3, ..., V6–V7, V7–VRH the analog voltage VIN inputted at the time of the preceding conversion was. However, when the analog voltage VIN inputted at the time of the preceding conversion was in the range V7–VRH, no comparator one level higher exists.

When the analog voltage VIN inputted at the time of the preceding conversion was lower than the reference voltage V1, i.e. was in the range VRL–V1, the outputs of the comparators 1–7 at this point in time all become the output "L", that is, (L, L, L, L, L, L, L). In this case, the analog-voltage VIN compared in the conversion after that is expected to be in one of the ranges of reference voltage VRL–V1 or V1–V2. Consequently, from the comparison results in the preceding conversion, the comparator for which the comparison result in the conversion after that cannot be predicted is only the comparator 1. Accordingly, the comparator 1 is brought to the operating state. On the other hand, the comparators 2–7 higher-level than this are brought to the resting state and "L"-output state.

Also when this is done, the analog voltage VIN compared in the next conversion is limited to within the range of reference voltage VRL–V2, and the same comparator outputs OUT1–OUT7 as when all of the 7 comparators 1–7 are brought to the operating state will be obtained. Thus, in this way also, correct A/D-conversion is possible. Furthermore, by doing it this way, because of the 7 comparators the 6 comparators 2–7 assume the resting state, it is possible to suppress the consumed power in the whole A/D converter circuit 200.

Thus, it can be seen that, in whichever of the ranges of low standard voltage VRL-high standard voltage VRH the value of the analog voltage VIN of the preceding conversion was, a relationship of setting states shown in the table of FIG. 13 is obtained, and in all the cases, the consumed power in the whole A/D converter circuit 200 can be suppressed. Also, in this Embodiment 2, as will be understood by comparing with Embodiment 1, it is not necessary to form separately setting comparators P1 etc., and it becomes a simpler A/D converter circuit.

And, in the A/D converter circuit 200 of this Embodiment 2, the timing of the analog voltage used for selecting the comparators 1–7 to the operating state or the resting state can be aligned with the timing of the preceding conversion at all times. Accordingly, it is possible to select suitable comparators as operating state or resting state at all times, and because the number of the remaining comparators held in the resting state can be made large, it can be made a lower consumed power A/D converter circuit.

And, in the A/D converter circuit 200, the comparators 1 etc. to be brought to the operating state or to be brought to the resting state in the present conversion are selected using the outputs OUT1 etc. of the comparators 1–7 in the preceding conversion as input information signals. Therefore, a circuit for separately generating input information signals like the setting comparators P1–P7 in Embodiment 1 is unnecessary and it can be made a simple construction.

Also, in the A/D converter circuit 200, on the basis of the outputs OUT1 etc. of the comparators 1–7 in the preceding conversion, in the present conversion, of the comparators 1–7, only two or one are brought to the operating state, and the others are brought to the resting state. Therefore, it is possible to greatly reduce the consumed power of the A/D converter circuit.

In the A/D converter circuit 200 of this Embodiment 2, as described above, when the characteristic of the inputted analog voltage VIN is such that the range over which the analog voltage VIN can change in the period of 1 cycle of the clock signal CLK is not greater than ⅛ (the reciprocal of the figure obtained by adding 1 to the number of comparators) of the maximum amplitude, in all cases correct A/D-conversion is possible. Conversely, when an analog voltage VIN whose range over which it can change in the period of 1 cycle is larger than ⅛ (the reciprocal of the figure obtained by adding 1 to the number of comparators) of the maximum amplitude is used, A/D-conversion cannot be carried out properly. However, the A/D converter circuit 200 can also be used in the following way.

Figure 14:
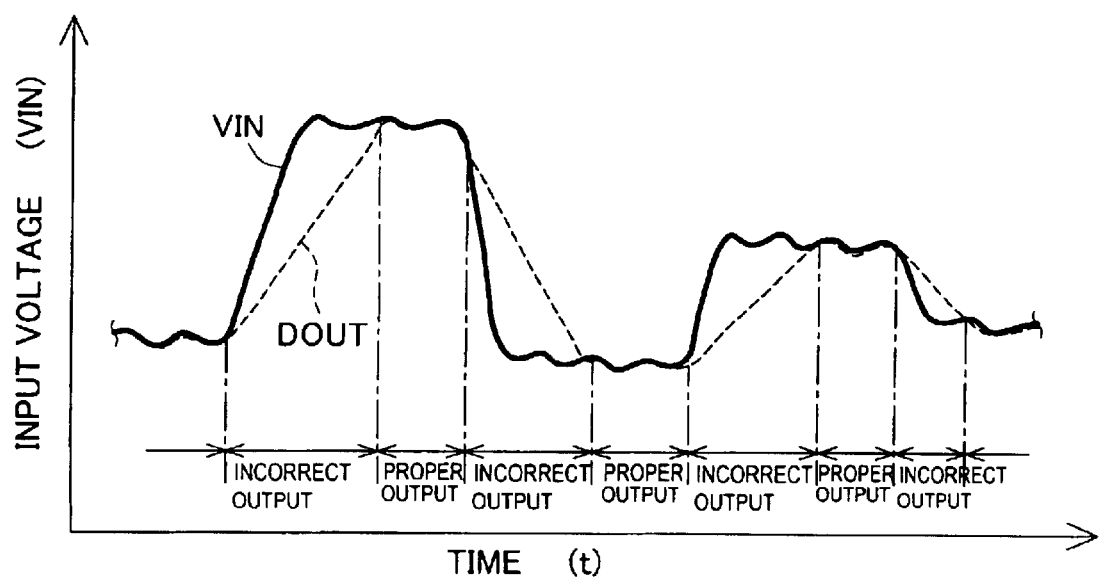
FIG. 14 is an explanatory view illustrating the operation of the A/D converter circuit of Embodiment 2 when inputting a voltage waveform in which large voltage changes and small voltage changes occur alternately.

That is, as shown in FIG. 14, when as the analog voltage VIN an analog voltage VIN having a voltage waveform in which large voltage changes and small voltage changes arise alternately is inputted to the A/D converter circuit 200, a period where a large voltage change occurs and a transition period, of a period of small voltage change, following that become incorrect output periods in which, with respect to the analog voltage VIN, the digital output DOUT shown with a dashed line does not match the value of the analog voltage VIN A/D-converted. However, because with time the digital output DOUT approaches the value which should properly have been obtained, eventually a digital output DOUT correctly A/D-converting the analog voltage VIN is obtained, and after that there is a proper output period over which the proper digital output is obtained, until a large voltage change occurs again. Therefore, with this kind of characteristic of the analog voltage VIN as a premise, if only the digital output DOUT obtained in the proper output period is used, the A/D converter circuit 200 of this Embodiment 2 can be used to A/D-convert with low consumed power even an analog voltage VIN in which this kind of large voltage change occurs.

(First Variant)

Figure 15:
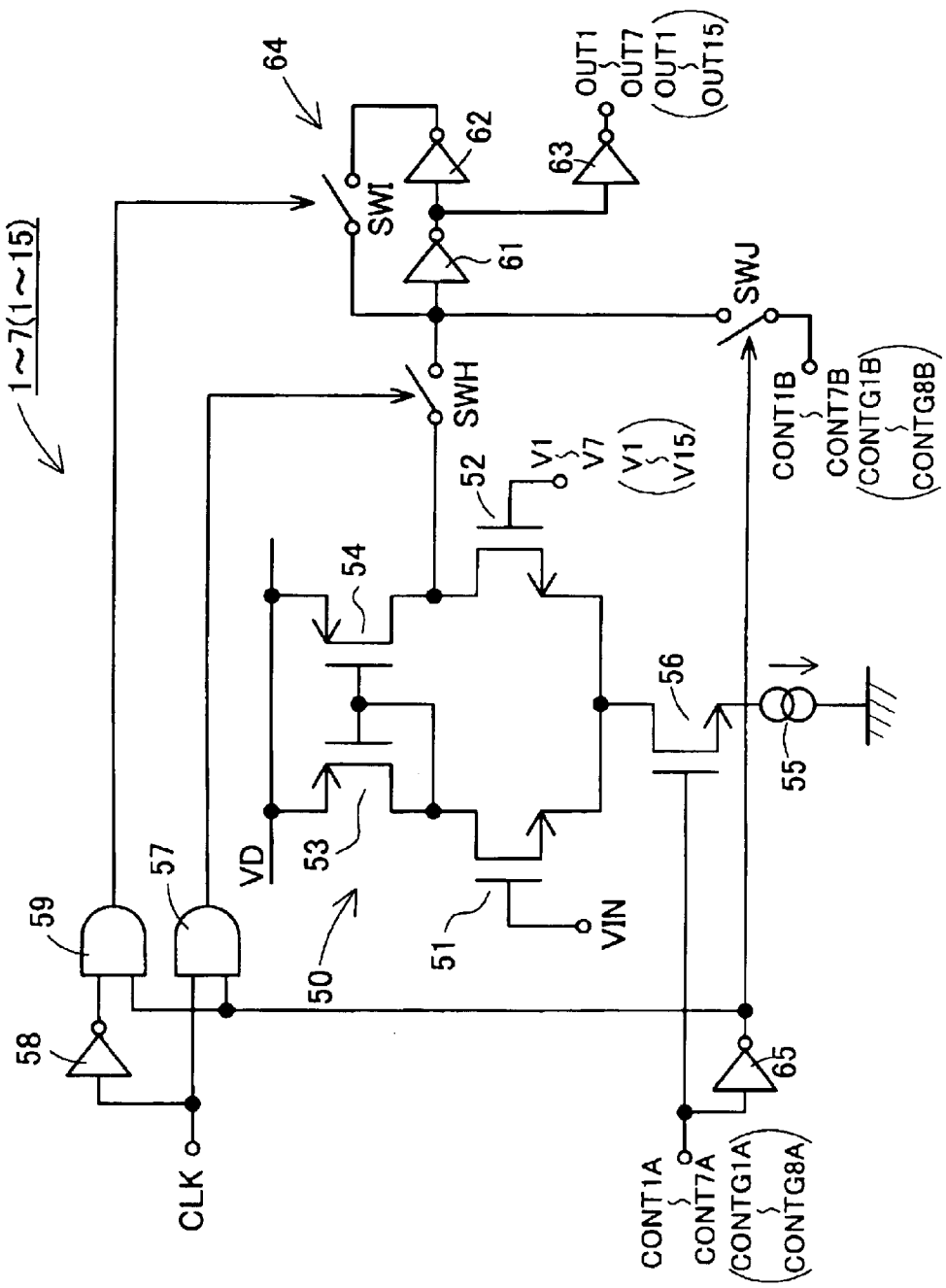
FIG. 15 is an explanatory view showing a construction of a differential-type conversion comparator used in an A/D converter circuit directed to Embodiment 1.

Next, a Variant 1 obtained by modifying Embodiment 2 will be described, with reference to FIG. 15. In the A/D converter circuit 200 of Embodiment 2, chopper-type comparators (see FIG. 5, FIG. 9) were used as the comparators 1–7. With respect to this, in this Variant 1, only the point that differential-type comparators are used is different. Accordingly, the explanation will center on the different parts, and similar parts have been given the same numbers and their explanation will be omitted or simplified.

As mentioned above, the comparators 1–7 in this Variant 1 are differential-type comparators. That is, each of the comparators 1–7 compares the analog voltage VIN and the reference voltage V1 etc. by means of a differential circuit 50. The differential circuit 50 is made up of CMOS, and has an N-channel 51 to the gate of which the analog voltage VIN is applied and an N-channel 52 to the gate of which one of the reference voltages V1–V7 is applied. The drain of the N-channel 51 via a P-channel 53 and the drain of the N-channel 52 via a P-channel 54 are each connected to a power supply potential VD. The gates of the P-channels 53, 54 are both connected to the drain of the N-channel 51. And, the sources of the N-channels 51, 52 are commonly connected and grounded by way of an N-channel 56 and a fixed current circuit 55. In this differential circuit 50, the difference between the analog voltage VIN and the reference voltage V1 etc. appears as the drain voltage of the N-channel 52. The drain of the N-channel 52 is connected via a switch SWH to a holding circuit 64. This holding circuit 64 is connected in series with inverters 61, 62, and a connection between the input terminal of the inverter 61 and the output terminal of the inverter 62 is opened and closed by a switch SWI. Also, a comparator output OUT1–OUT7 is outputted from an inverter 63 branching from the output terminal of the inverter 61.

All three of the switches SWH, SWI and SWJ are analog switches which turn ON with an "H" input and turn OFF with an "L" input.

Here, the switch SWH is opened and closed by the output of a 2-input AND device 57. To this AND device 57 are inputted the clock signal CLK and a signal obtained by inverting the first setting signal CONT1A etc. with an inverter 65. Accordingly, when the first setting signal CONT1A etc. is "H", the switch SWH operates under the clock signal CLK. On the other hand, when the first setting signal CONT1A etc. is "L", irrespective of the clock signal CLK the switch SWH is turned OFF.

And, the switch SWI also is opened and closed by the output of a 2-input AND device 59. To this AND device 59 are inputted a signal obtained by inverting the clock signal CLK with an inverter 58 and a signal obtained by inverting the first setting signal CONT1A etc. with an inverter 65. Accordingly, when the first setting signal CONT1A etc. is "L", the switch SWI operates under the inverted clock signal CLK. On the other hand, when the first setting signal CONT1A etc. is "H", irrespective of the clock signal CLK the switch SWI is turned OFF.

Also, the N-channel 56 is controlled by the signal obtained by inverting the first setting signal CONT1A etc. with the inverter 65, and when the first setting signal CONT1A etc. is "H", the N-channel 56 becomes ON and current flows to the constant current source 55, and when the first setting signal CONT1A etc. is "L" the N-channel 56 becomes OFF and the current flowing to the constant current source 55 is cut, comparison with the differential circuit 50 becomes impossible and the consumed power is reduced.

And, the switch SWJ is controlled by the first setting signal CONT1A etc., and when the first setting signal CONT1A etc. is "H" the switch SWJ becomes OFF and when the first setting signal CONT1A etc. is "L" the switch SWJ becomes ON.

Accordingly, when the first setting signal CONT1A etc. is "H", the N-channel 56 is turned ON, and the differential circuit 50 works. Also, the switch SWH is opened and closed under the clock signal CLK, and the switch SWI is opened and closed in opposite phase to that. On the other hand, the switch SWJ is turned OFF. Accordingly, of this in a period when also the clock signal CLK is "H", because the switch SWH comes ON and the switch SWI becomes OFF, a result of comparison of the reference voltage V1 etc. and the analog voltage VIN is outputted from the inverter 63 as the comparator output OUT1 etc. On the other hand, in a period when the clock signal CLK is "L", because the switch SWH turns OFF and the switch SWI turns ON, the preceding output result is held and continues to be outputted from the inverter 63.

Conversely, when the first setting signal CONT1A etc. is "L", because the N-channel 56 becomes ON and the current flowing to the constant current source 55 is cut, the consumed power in the differential circuit 50 decreases. And, the switches SWH and SWI are fixed to OFF and the switch SWJ becomes ON. Consequently, because the second setting signal CONT1B etc. is inputted to the inverter 61, if the second setting signal CONT1B is "H", "H" is outputted as the comparator output OUT1 etc., and conversely if the second setting signal CONT1B is "L", "L" is outputted as the comparator output OUT1 etc.

Thus, even if differential-type comparators are used as the comparators 1–7, by using the first setting signal CONT1A etc. and the second setting signal CONT1B etc., it is possible to select 3 states, an operating state, a resting state and "H" output state, and a resting state and "L"-output state.

Therefore, even if differential-type comparators 1–7 are used, as in this Variant 1, in the same way as in Embodiment 2, A/D-conversion can be carried out. In this variant, even while using differential-type comparators, which generally have smaller consumed power than chopper-type comparators, it is possible to make it an A/D converter circuit 200 with its consumed power reduced further.

(Third Embodiment)

Next, a parallel-type A/D converter circuit 300 directed to a third embodiment will be described, with reference to FIG.

16–FIG. 19. The A/D converter circuit 300 of this Embodiment 3 is the same as Embodiment 2 in that it does not use setting comparators, but differs in the point that it is a 4-bit A/D converter circuit and uses 15 comparators 1–15, and in the point that it performs state-setting of the comparators with the first and second setting signals CONTG1A etc. group by group, with two comparators as one group, as in comparators 2 and 3, 4 and 5, and so on. Accordingly, the explanation will center on the different parts, and similar parts have been given the same numbers and their explanation will be omitted or simplified.

The A/D converter circuit 300 also is a circuit for converting an analog voltage VIN to a digital output DOUT at intervals of a predetermined period applied with a clock signal CLK, and has a comparing section 310, a data latch 320, an encoder 340 and a control circuit section 150 (see FIG. 1). To the comparing section 310 is inputted, besides a high standard voltage VRH, a low standard voltage VRL and the analog voltage VIN, a clock signal CLK from the control circuit section 150.

Figure 16:
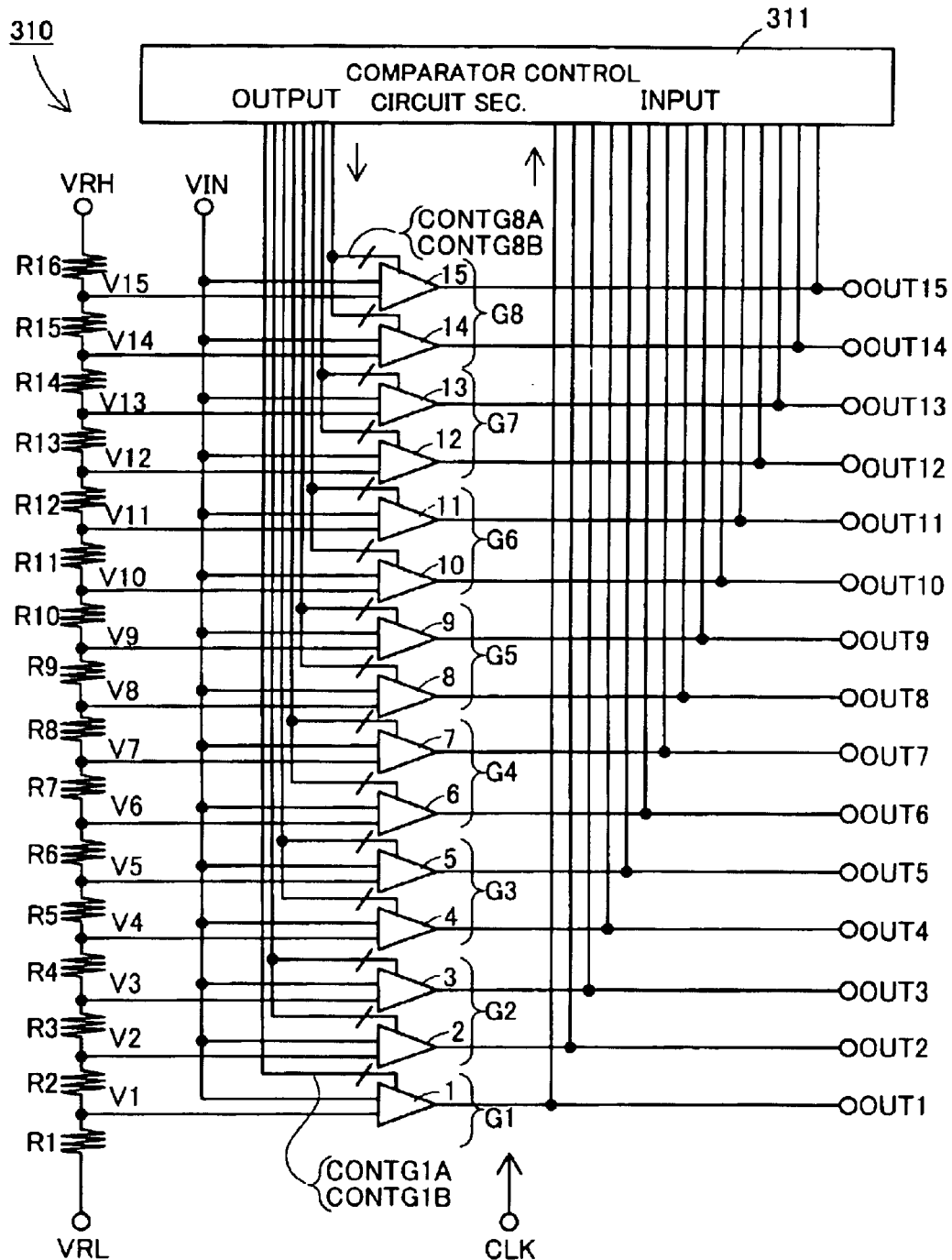
FIG. 16 is an explanatory view showing the outline of a comparison section, of an A/D converter circuit directed to Embodiment 3.

In the comparing section 310 shown in FIG. 16, 15 reference voltages V1–V15 are obtained by means of 16 identical voltage-dividing resistors R1–R16 connected in series between the high standard voltage VRH and the low standard voltage VRL. And, it has 15 chopper-type comparators 1–15 and a comparator control circuit section 311.

The comparators 1–15 have the same circuit construction as the conversion comparators 1–7 (see FIG. 9) in Embodiment 1 and the comparators 1–7 in Embodiment 2, and are set by first and second setting signals CONTG1A etc. outputted from the comparator control circuit section 311 to any of three states, an operating state in which they can function as normal comparators, a resting state and "H"-output state, and a resting state and "L"-output state.

Specifically, the comparators 1–15 respectively refer exclusively to and correspond one-to-one with the 15 reference voltages V1–V15, and when they are set to the operating state, every cycle of the inputted clock signal CLK, they compare the analog voltage VIN and the reference voltage V1 etc. and update and output comparator outputs OUT1–OUT15 having the level either "H" or "L". On the other hand, when one is set to the resting state and "H"-output state, its output is fixed at "H". And when one is set to the "L"-output state, its output is fixed at "L".

And, the comparator outputs OUT1–OUT15, besides being inputted to the data latch 320, are each branched and inputted to the comparator control circuit section 311.

In FIG. 16, the connection lines between the clock signal CLK and the comparators are not shown, but as in Embodiment 1 (see FIG. 2) and Embodiment 2 (see FIG. 12), the clock signal CLK is inputted to each of the comparators 1–15.

The comparator control circuit section 311 performs predetermined logical processing on these inputted comparator outputs OUT1–OUT15 and outputs first setting signals CONTG1A–CONTG8A and second setting signals CONTG1B–CONTG8B like those of Embodiments 1, 2. However, differently from Embodiments 1, 2, these first and second setting signals CONTG2A etc., excepting the first setting signal CONTG1A and the second setting signal CONTG1B, each state-set one group G2–G8 including two comparators. For example, the first and second setting signals CONTG8A, CONTG8B are inputted to the two comparators 14 and 15 belonging to the group G8, and set the states of these two comparators simultaneously. On the other hand, the first setting signal CONTG1A and the second setting signal CONTG1B are inputted to the comparator 1 and set the state of this comparator 1. Accordingly, the group G1 includes only the one comparator 1. In this way, the comparators 1–15 are divided into eight groups G1–G8 each including one or two comparators.

Now, because the comparators 1–15 have the same circuit construction as the conversion comparators 1–7 of Embodiment 1 (see FIG. 9), in the same way, in the VIN fetching state, in which the switch SWC is turned ON, they consume power greatly, but in the comparing state, in which the switch SWC is turned OFF, they do not consume much power. And, by bringing the first setting signals CONTG1A etc. to "L", the comparators 1 etc. can be brought to a resting state as a comparing state forcibly, and moreover by means of the second setting signals CONTG1B etc. the comparator outputs OUT1–OUT15 of that time can be fixed at "H" or "L".

In this connection, the first and second setting signals CONTG1A etc. are obtained using comparator outputs OUT1–OUT15 obtained in the preceding (1 cycle earlier) conversion by the comparators 1–15. And these are used in the state-setting of the comparators 1–15 for the next (1 cycle later than this) conversion.

Specifically, as shown in the tables of FIG. 17 and FIG. 18, set states of the comparators 1–15 are decided in correspondence with the magnitude of the analog voltage used in the preceding conversion. For example, when the analog voltage VIN used in the preceding conversion is within the range of reference voltage V6–V7, the outputs (comparison results) of the comparators 1–15 at this point in time become, in rank from the lower level comparators, (H, H, H, H, H, H, L, L, L, L, L, L, L, L, L), i.e. expressed in output code, '6' (see FIG. 17).

Now, it will be supposed that the characteristic of the inputted analog voltage VIN is such that the range over which the analog voltage VIN can change in the period of 1 cycle is not greater than ⅛ (the reciprocal of the number of groups) of the maximum amplitude which can be converted by the A/D converter circuit 300. In this case, the analog voltage VIN compared in the next conversion is expected to lie in one of the ranges of reference voltage V4–V5, V5–V6, V6–V7, V7–V8, or V8–V9 (in possible output codes, '4'-'8'). That is, if this kind of analog signal is made a premise, the comparators for which the comparison result of 1 cycle later cannot be predicted from the comparison results of 1 cycle earlier are only the comparators 5, 6, 7, 8.

Because the comparators of which the comparison results cannot be predicted are limited in this way, in this Embodiment 3, the group G4 to which belongs the highest-level comparator 6 among the comparators 1–6 which outputted "H" 1 cycle earlier, and the groups G3, G5 one level higher and one level lower than this, are brought to the operating state (shown ○ in FIG. 18 and FIG. 19). On the other hand, the comparators 1, 2, 3 belonging to the groups G1, G2 lower-level than the groups G3–G5 are brought to the resting state and "H"-output state (shown Δ/H in FIG. 18, FIG. 19), and the comparators 10, 11, 12, 13, 14, 15 belonging to the groups G6, G7, G8 higher-level than these are brought to the resting state and "L"-output state (shown Δ/L in FIG. 18, FIG. 19). When it is done in this way also, as long as the analog voltage VIN compared in the next cycle is within the range of reference voltage V4–V9 fitting the above-mentioned premise, the same comparator outputs OUT1–OUT15 as when all of the 15 comparators 1–15 are brought to the operating state will be obtained. Thus, in this way also, correct A/D-conversion is possible.

Furthermore, by doing this, of the 15 comparators, because the 9 comparators 1–3, 10–15 can be brought to the resting state, it is possible to suppress the consumed power in the whole A/D converter circuit 300.

The relationship above also applies similarly within whichever of the reference voltage ranges V1–V2, V2–V3, . . . , V14–V15, V15-VRH the analog voltage VIN inputted at the time of the preceding conversion was. However, there may be times when there is no group one level higher or one level lower.

When the analog voltage VIN inputted at the time of the preceding conversion was lower than the reference voltage V1, i.e. was in the range VRL-V1, the outputs of the comparators 1–15 at this point in time all become the output "L", that is, (L, L, L, L, L, L, L, L, L, L, L, L, L, L, L). In this case, the analog voltage VIN compared in the next conversion is expected to be in one of the reference voltage ranges VRL-V1, V1–V2 or V2–V3. Consequently, the comparators for which there is a possibility that the comparison result cannot be predicted by comparing with the comparison results of 1 cycle earlier are only comparators 1, 2. Accordingly, the groups G1, G2 to which the comparators 1, 2 belong and the comparators 1, 2, 3 belonging to these are brought to the operating state. On the other hand, the groups G3–G8 higher-level than these groups and the comparators 4–15 belonging to these are brought to the resting state and "L"-output state.

When it is done this way also, as long as the analog voltage VIN compared in the next conversion is within the range of reference voltage VRL-V3, as when all of the 15 comparators 1–15 are brought to the operating state, correct A/D-conversion is possible. Furthermore, by doing it this way, because of the 15 comparators the 12 comparators 4–15 can be brought to the resting state, it is possible to suppress the consumed power in the whole A/D converter circuit 300.

Thus, it can be seen that, in whichever of the ranges of low standard voltage VRL-high standard voltage VRH the value of the analog voltage VIN used in the preceding conversion was, a relationship of setting states shown in the tables of FIG. 18 and FIG. 19 is obtained, and in all the cases, the consumed power in the whole A/D converter circuit 300 can be suppressed.

Also, as will be understood by comparing with Embodiment 2, in this Embodiment 3, because the state-setting of the comparators is carried out for each of groups G1–G8, compared to when state-setting is carried out for each comparator, a simpler comparator control circuit section 311 is adequate.

Thus, with the A/D converter circuit 300 of this Embodiment 3, comparators 1–15 are brought to either an operating state or a resting state in groups (groupings) G1–G8. Consequently, the construction of the comparator control circuit section 311 for bringing the comparators 1 etc. to the operating state and the resting state becomes simple.

And, in this A/D converter circuit 300, the outputs OUT1 etc. of the comparators 1–15 obtained in the preceding conversion are used for the selection of the comparators 1 etc. for the present conversion. Furthermore, the comparators 1 etc. are divided into n=8 groups (groupings) G1–G8, and only the comparators belonging to 3 or 2 groups (groupings) are brought to the operating state in the present conversion, and the comparators belonging to the other groups (groupings) are brought to the resting state. Accordingly, the consumed power of the A/D converter circuit 300 can be reduced greatly.

(Second variant)

In Embodiment 3 described above, chopper-type comparators (see FIG. 9) were used as the comparators 1–15, but instead of this, as in Variant 1 described above, differential-type comparators (see FIG. 10) can alternatively be used. When this is done, even while using differential-type comparators, which generally have smaller consumed power than chopper-type comparators, it is possible to make it an A/D converter circuit with its consumed power further reduced.

(Fourth Embodiment)

Next, a parallel-type A/D converter circuit 400 directed to a fourth embodiment will be described, with reference to FIG. 20 and FIG. 21. The A/D converter circuit 400 of this Embodiment 4 uses 7 setting comparators as in Embodiment 1, but differs in the point that it is a 4-bit A/D converter circuit and uses 15 conversion comparators. And, although unlike Embodiment 3 setting comparators are also used, like Embodiment 3, as in conversion comparators 2 and 3, 4 and 5 and so on, with two or one conversion comparators as one group, state-setting of the conversion comparators 1–15 is carried out with first and second setting signals CONTG1A etc. Accordingly, the explanation will center on the parts differing from Embodiments 1 and 3, and similar parts have been given the same numbers and their explanation will be omitted or simplified.

The A/D converter circuit 400 also is a circuit for converting an analog voltage VIN to a digital output DOUT at intervals of a predetermined period applied with a clock signal CLK, and has a comparison section 410, a data latch 320, an encoder 340 and a control circuit section 150 (see FIG. 1). To the comparison section 410 is inputted, besides a high standard voltage VRH, a low standard voltage VRL and the analog voltage VIN, a clock signal CLK from the control circuit section 150.

Figure 20:
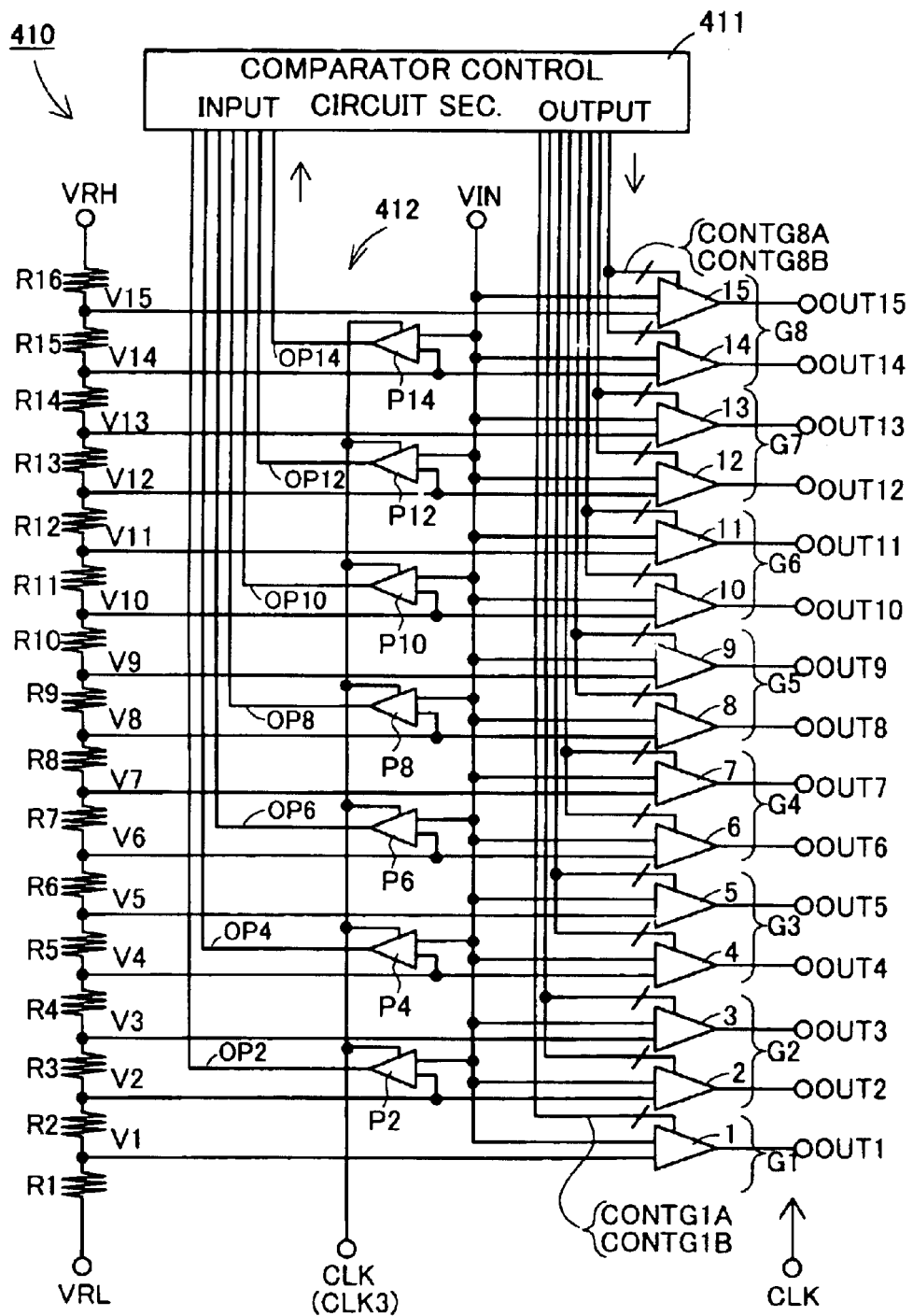
FIG. 20 is an explanatory view showing the outline of a comparison section, of an A/D converter circuit directed to Embodiment 4.

In the comparison section 410 shown in FIG. 20, 15 reference voltages V1–V15 are obtained by means of 16 identical voltage-dividing resistors R1–R16 connected in series between the high standard voltage VRH and the low standard voltage VRL. And, it has 15 chopper-type conversion comparators 1–15, an input information generating circuit section 412 made up of 7 differential-type setting comparators P2–P14, and a comparator control circuit section 411.

Of these, the setting comparators P2, P4 . . . P14 constituting the input information generating circuit section 412 have the same circuit construction as the setting comparators P1–P7 in Embodiment 1 (see FIG. 10), and refer respectively to, among the 15 reference voltages V1–V15, every other reference voltage V2, V4 . . . V14. These setting comparators P2 etc., every cycle of the inputted clock signal CLK, each make a comparison with the analog voltage VIN and update and output a setting comparator output OP2, OP4 . . . OP14 having either the level "H" or the level "L".

The comparator control circuit section 411 performs predetermined logical processing on these inputted setting comparator outputs OP2–OP14 and outputs first setting signals CONTG1A–CONTG8A and second setting signals CONTG1B–CONTG8B. The first and second setting signals CONTG1A etc. are used for state-setting of the conversion comparators 1–15 in the next conversion, i.e. in the next cycle of the clock signal CLK.

The conversion comparators 1–15 have the same circuit construction as the conversion comparators 1–7 in Embodiment 1 (see FIG. 9), and are set by the first and second setting signals CONTG1A etc. outputted from the comparator control circuit section 411 to any of three states, an operating state in which they can function as normal comparators, a resting state and "H"-output state, and a resting state and "L"-output state.

In this A/D converter circuit 400, depending on which of the ranges divided by the high standard voltage VRH, the low standard voltage VRL and the seven reference voltages V2, V4 . . . V14 the magnitude of the analog voltage VIN belongs to, the outputs OP2 etc. of the setting comparators P2 etc. become either "H" or "L". Consequently, the analog voltage VIN and the setting comparator outputs OP2–OP14 of the setting comparators P2–P14 assume the relationship shown in the left half of the table shown in FIG. 21. These setting comparator outputs OP2 etc. are inputted to the comparator control circuit section 411.

In the comparator control circuit section 411, predetermined logical processing is carried out on these inputted setting comparator outputs OP2–OP14, and first setting signals CONTG1A–CONTG8A and second setting signals CONTG1B–CONTG8B similar to those in Embodiment 3 are outputted. As in Embodiment 3, the conversion comparators 1–15 are divided into 8 groups G1–G8. The group G1 includes only the comparator 1, but the other groups G2–G8 all include two conversion comparators. Accordingly, by the first and second setting signals CONTG1A etc., the 15 conversion comparators 1–15 have their states set the one or two included in each group at a time. The conversion comparators 1–15 and the setting comparators P2 etc. have the following relationship. That is, in the groups G2–G8 excluding the lowest-level group G1, to the reference voltages (grouping reference voltages) V2, V4, . . . , V14 to which the lowest-level conversion comparator among the conversion comparators belonging to each of the groups G2 etc. (the lowest-level first comparator in the group) 2, 4, . . . , 14 refer, the setting comparators P2 etc. are also referring. In this way, a correspondence relationship is formed between the 7 setting comparators P2 etc. and the 8 groups G1, G2 etc.

Now, the conversion comparators 1–15, like the conversion comparators 1–7 of Embodiment 1, consume power greatly in the VIN fetching state, in which the switch SWC is turned ON, but in the comparing state, in which the switch SWC is OFF, they do not consume much power. And, by bringing the first setting signals CONTG1A etc. to "L", it is possible to bring the comparators 1 etc. to the resting state as a comparing state forcibly, and moreover by means of the second setting signals CONTG1B etc. the comparator outputs OUT1–OUT15 of that time can be fixed at "H" or "L".

In this connection, the first and second setting signals CONTG1A etc. are obtained using setting comparator outputs OP2–OP14 obtained a predetermined time past (for example 1 cycle earlier in the clock signal) by the setting comparators P2 etc. And these are used in the state-setting of the conversion comparators 1–15 one cycle after that. By this means, the set states of the comparators 1–15 are decided for each of the groups G1–G8 in correspondence with the magnitude of the analog voltage VIN inputted and compared by the setting comparators P2 etc. a predetermined time past.

For example, it will be supposed that the characteristic of the inputted analog voltage VIN is such that the range over which the analog voltage VIN can change in the period of 1 cycle of the clock signal CLK is not greater than ⅛ (the reciprocal of the number of groups) of the maximum amplitude which can be converted by the A/D converter circuit 400. In this case, setting can be carried out as shown in the table of FIG. 21.

For example, when the analog voltage VIN inputted 1 cycle ago was in the range of reference voltage V6–V8, the outputs (comparison results) OP2 etc. of the setting comparators P2 etc. at this point in time become, as shown in the left side of the table of FIG. 21, in rank from the lower-level setting comparators, (H, H, H, L, L, L, L). Now, because the analog voltage VIN has the characteristic discussed above, at the point in time at which the analog voltage VIN is compared by the conversion comparators 1 etc., the values that this analog signal can take are expected to be confined to the range of reference voltage V4–V10. That is, the comparison results of the conversion comparators 4–9 cannot be predicted.

Since the conversion comparators for which the comparison result cannot be predicted are limited like this, the following is done. That is, for the specified group G4 (specified grouping) to which the conversion comparator 6 referring to the same reference voltage V6 as the highest-level comparator P6 among the setting comparators P2 etc. outputting "H" belongs, and the groups G3, G5 one level higher and one level lower than this, the conversion comparators 4–11 belonging to these are brought to the operating state (shown ○ in FIG. 21). This is so that, because their comparison results cannot be predicted, they perform comparison in the operating state. On the other hand, for the remaining groups G1, G2, G6, G7, the comparison results of the conversion comparators 1–3, 10–15 belonging to them can be predicted in advance. Accordingly, for the comparators 1–3 belonging to the low-level groups G1, G2, they are brought to the resting state and "H"-output state (shown Δ/H in FIG. 21), and for the comparators 10–15 belonging to the high-level groups G6, G7, G8, they are brought to the resting state and "L"-output state (shown Δ/L in FIG. 21).

When it is done this way also, as long as the analog voltage VIN compared in the next cycle is within the anticipated range of reference voltage V4–V10, the same comparator outputs OUT1–OUT15 as when all of the 15 comparators 1–15 are brought to the operating state will be obtained. Thus, in this way also, correct A/D-conversion is possible.

Furthermore, by doing this, of the 15 conversion comparators 1–15, because the 9 comparators 1–3, 10–15 can be brought to the resting state, it is possible to suppress the consumed power in the whole A/D converter circuit 400.

The relationship above also applies similarly within whichever of the reference voltage ranges V2–V4, . . . , V14-VRH the analog voltage VIN inputted the predetermined time past was. However, there may be times when there is no group one level higher or one level lower than the specified group.

When the analog voltage VIN inputted the predetermined time past was lower than the reference voltage V2, i.e. was in the range VRL-V2, the outputs of the setting comparators P2 etc. at this point in time all become the output "L", that is, (L, L, L, L, L, L, L). In this case, the analog voltage VIN at the point in time when it is compared by the conversion comparators thereafter is expected to be in the reference voltage range VRL-V4. Consequently, for the comparators 1–3, the comparison result cannot be predicted. Accordingly, the groups G1, G2 to which these belong are brought to the operating state, to actually make a comparison with the analog voltage. On the other hand, the groups G3–G8 higher-level than these and the comparators 4–15 belonging to these are brought to the resting state and "L"-output state.

When this is done also, as long as the analog voltage VIN compared is within the range of reference voltage VRL-V4 as expected, as when all of the 15 comparators 1–15 are brought to the operating state, correct A/D-conversion is possible. Furthermore, by doing it this way, because of the 15 conversion comparators the 12 comparators 4–15 can be brought to the resting state, it is possible to suppress the consumed power in the whole A/D converter circuit 400.

Thus, it can be seen that, in whichever of the ranges of low standard voltage VRL-high standard voltage VRH the value of the analog voltage VIN when compared by the setting comparators P2 etc. (a predetermined time past) was, a relationship of setting states shown in the table FIG. 21 is obtained, and in all the cases, the consumed power in the whole A/D converter circuit 400 can be suppressed.

Also, as will be understood by comparing with Embodiment 1, in this Embodiment 4, because the state-setting of the comparators is carried out for each of groups G1–G8, compared to when state-setting is carried out for each comparator, a simpler comparator control circuit section 411 is adequate. Furthermore, because unlike in Embodiment 1, in which the same number (7) of setting comparators as conversion comparators were used, a smaller number of setting comparators than conversion comparators are used, the construction of the comparison section 410 also becomes simple.

Thus the A/D converter circuit 400 of this Embodiment 4 has m=15 conversion comparators 1 etc. divided into n=8 groups (groupings) and 7 setting comparators P2 etc. And the setting comparators P2 etc. refer to the same reference voltages V2, V4, . . . , V14 as the lowest-level conversion comparators 2, 4, . . . , 14 in the groups. Consequently, a correspondence relationship between the setting comparators P2 etc. and the groups G1 etc. is achieved. Accordingly, it is possible to select conversion comparators to be brought to the operating state or the resting state easily and appropriately group by group, on the basis of the comparison results of the setting comparators P2 etc. And because the states of the conversion comparators 1 etc. are selected group by group, the construction of the comparator control circuit section 411 becomes simple.

And, only the conversion comparators belonging to some of the groups, specifically three or two groups, are brought to the operating state in the present conversion, and the conversion comparators belonging to the other groups are brought to the resting state. Thus, the consumed power of the A/D converter circuit 400 can be greatly reduced.

In this Embodiment 4 also, similarly to that explained in Embodiment 1, the setting comparators P2 etc. (the input information generating circuit section 412) may alternatively be driven by a third clock signal CLK3, different from the clock signal CLK. As the third clock signal CLK3, one the same frequency as the clock signal CLK but having a waveform of opposite phase or a waveform shifted by ¼ period (see FIG. 11) or the like can be shown as an example.

(Fifth Embodiment)

Next, a parallel-type A/D converter circuit 500 directed to a fifth embodiment will be described, with reference to FIG. 22–FIG. 27. In Embodiment 1 described above, the conversion comparators were set to either an operating state in which they can perform comparing operation as normal or a resting state in which they have low consumed power but cannot perform comparison operation. With respect to this, this Embodiment 5 differs in the point that the conversion comparators are set to either a normal operating state in which they can perform comparison operation as normal or a low power operating state in which they have low consumed power and furthermore can perform comparison operation. Accordingly, the explanation will center on the different parts, and similar parts have been given the same numbers and their explanation will be omitted or simplified.

The A/D converter circuit 500 also is a circuit for converting an analog voltage VIN to a digital output DOUT at intervals of a predetermined period applied with a clock signal CLK, and has a comparison section 510, a data latch 120, an encoder 140 and a control circuit section 150 (see FIG. 1). To the comparison section 510 is inputted, besides a high standard voltage VRH, a low standard voltage VRL and the analog voltage VIN, a clock signal CLK from the control circuit section 150.

The comparison section 510 shown in FIG. 22, similarly to the comparison section 110 in Embodiment 1 (see FIG. 2), has seven reference voltages V1–V7 obtained by dividing the difference between a high standard voltage VRH and a low standard voltage VRL with resistors R1–R8. And, like Embodiment 1 it has an input information generating circuit section 112 made up of seven differential-type setting comparators P1–P7. And this comparison section 510 has a comparator control circuit section 511 and conversion comparators 71–77 controlled by setting signals CONT71–77 from the comparator control circuit section 511.

The setting comparators P1–P7 constituting the input information generating circuit section 112, as in Embodiment 1, every cycle of the clock signal CLK, respectively compare the reference voltages V1–V7 with the analog voltage VIN and output setting comparator outputs OP1–OP7. The comparator control circuit section 511 performs predetermined logical processing on the inputted setting comparator outputs OP1–OP7 and outputs the setting signals CONT71–CONT77. These setting signals CONT71 etc. are used in state-setting of the conversion comparators 71–77 in the next conversion, i.e. the next cycle of the clock signal CLK.

The conversion comparators 71–77, because they have the construction discussed later, are set by these setting signals CONT71 etc. to two states, a normal operating state in which they perform comparison operation as normal comparators and a low power operating state in which they can carry out comparison operation while having lower consumed power than in the normal operating state.

Specifically, the conversion comparators 71–77 respectively refer exclusively to and correspond one-to-one with the seven reference voltages V1–V7, and whether they are set to the normal operating state or the low power operating state, every cycle of the inputted clock signal CLK, they each compare the analog voltage VIN with the reference voltage V1 etc., and update and output the conversion comparator outputs OUT1–OUT7 having either the level "H" or "L".

The circuit construction of the setting comparators P1–P7 is the same as in Embodiment 1 (see FIG. 10). Accordingly, in this A/D converter circuit 500 also, depending on the magnitude of the analog voltage VIN, the outputs OP1–OP7 of the setting comparators P1–P7 become either "H" or "L". Specifically, the analog voltage VIN and the conversion comparator outputs OP1–OP7 of the setting comparators P1–P7 have the relationship shown in the left half of the table shown in FIG. 24.

Next, the circuit construction and operation of the conversion comparators 71–77 will be described, with reference to FIG. 25. The conversion comparators 71–77 are all chopper-type comparators having the same construction. Accordingly, the construction and operation of the main part of a chopper-type comparator explained in Embodiment 1 (see FIG. 5–FIG. 9) also applies in this Embodiment 5. However, in the conversion comparators 71 etc. used in this Embodiment 5, of the construction of the main part of the conversion comparator shown in FIG. 5, the construction of the inverter INVA differs slightly from the construction of the inverter INV shown in FIG. 7.

Figure 25:
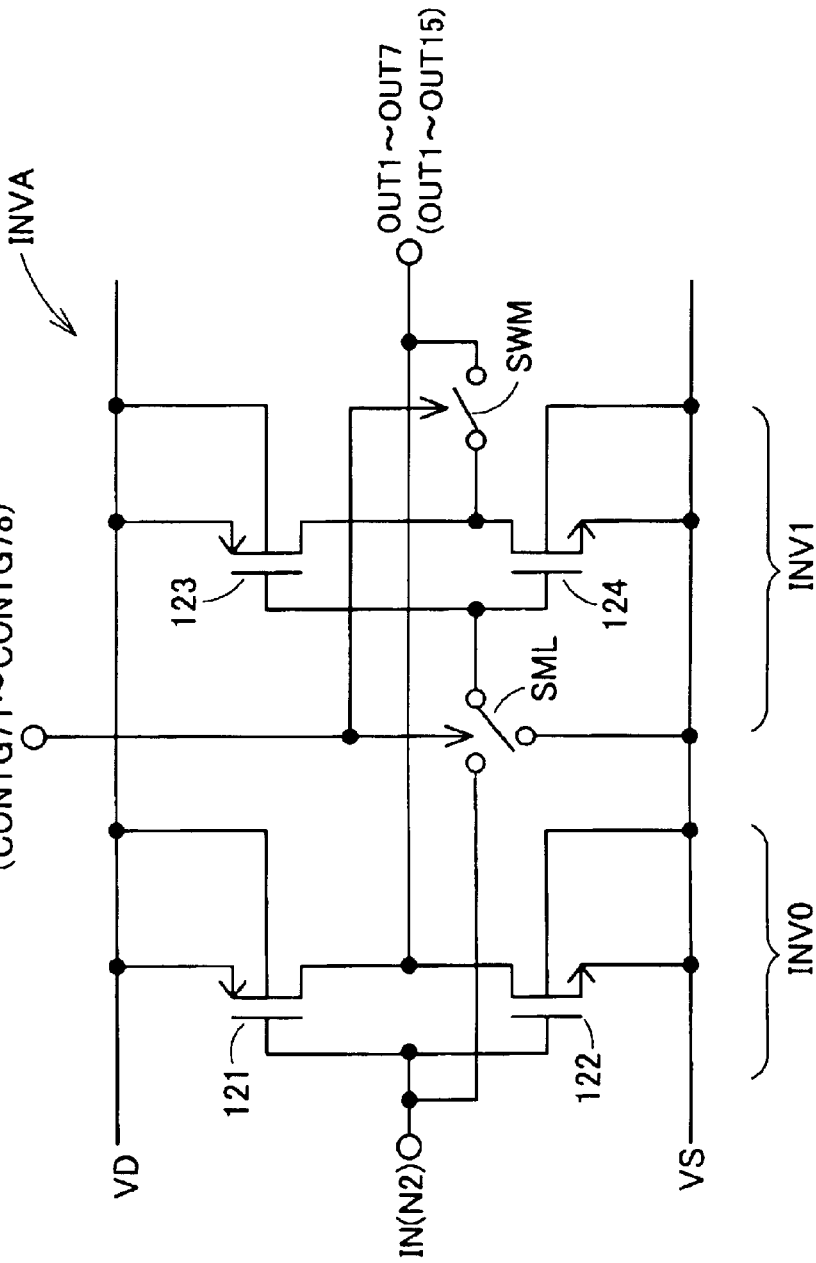
FIG. 25 is an explanatory view showing a construction of an inverter section of a conversion comparator used in Embodiments 5–8.

The construction of the inverter INVA used in the conversion comparators 71 etc. in this Embodiment 5 is shown in FIG. 25. As can be easily understood by comparing with the inverter INV shown in FIG. 7, in the inverter INVA used in this Embodiment 5, a basic inverter section INV0 and an inverter section INV1 are formed in parallel.

Of these, the basic inverter section INV0 has the construction of a known CMOS inverter wherein a P-channel MOS transistor 121 and an N-channel MOS transistor 122 are connected in series (see FIG. 5), and its input terminal IN is connected through a node N2 to the capacitor C1 and the comparator output OUT1–OUT7 is outputted from its output terminal.

On the other hand, the inverter section INV1 also has the construction of a known CMOS inverter wherein a P-channel MOS transistor 123 and an N-channel MOS transistor 124 are connected in series, but the gates of the transistors 123, 124 are connected to the input terminal IN via an analog switch SWL. And, the drain of the transistor 123 and the drain of the transistor 124 are connected via an analog switch SWM to the comparator output OUT1–OUT7. The switch SWL is opened and closed by a setting signal CONT71 etc., and specifically, when the setting signal CONT71 etc. is at the high level, connects the gates of the transistors 123, 124 to the input terminal IN. And conversely when it is at the low level, it connects the gates of the transistors 123, 124 to ground. And, the switch SWM is also opened and closed by the setting signal CONT71 etc., and, specifically, turns ON when the setting signal CONT71 etc. is at the high level.

Because the inverter INVA of this Embodiment 5 has this kind of construction, when the setting signal CONT71 etc. is at the low level, looking from the node N2 or the capacitor C1 (see FIG. 5), it is the same as if only the basic inverter section INV0 existed. On the other hand, when the setting signal CONT71 etc. is at the high level, from the node N2 or the capacitor C1 (see FIG. 5), it looks as if the basic inverter section INV0 and the claimal inverter section INV1 have been connected in parallel.

Consequently, when this inverter INVA is used, when the comparator is brought to the VIN fetching state by the conversion comparators 71 etc. and the intrinsic voltage (for example VD/2) of the inverter INVA is made to arise, by means of the setting signal CONT71 etc., it is possible to control the through current flowing through the inverter INVA to two steps, a large and a small. That is, when the setting signal CONT71 etc. is at the low level, if the conversion comparators 71 etc. are brought to the VIN voltage fetching state, i.e. if the input and output of the inverter INVA are short-circuited, a through current flows through the basic inverter section INV0 (the transistors 121, 122) only. On the other hand, when the setting signal CONT71 etc. is at the high level, if the conversion comparators 71 etc. are brought to the VIN voltage fetching state, a through current flows through not only the basic inverter section INV0 but also the inverter section INV1 (the transistors 123, 124). Consequently, if the case where the setting signal CONT71 etc. is at the high level is considered the normal state, compared to this, in the case where it is at the low level the through current is smaller, and it can be made a low power state wherein the consumed power in the conversion comparator 71 etc. is low.

Now, generally in an A/D converter circuit which uses chopper-type comparators, if the characteristics of the P-channel and N-channel transistors constituting the inverters are selected to make the through current flowing through the inverters small during the period of the VIN voltage fetching state, a long switching time is taken on switching from the high level to the low level or from the low level to the high level in the period of the comparing state. That is, the speed of comparison operation in the comparators, and hence the conversion time of the A/D converter circuit, must be made long. However, generally, the speed of the comparison operation of the comparators is faster the larger is the voltage difference between the analog voltage VIN and the reference voltage. Therefore, even with a comparator using an inverter with a small through current, if the difference between the analog voltage VIN and the reference voltage is large, a sufficient comparison operation speed can be obtained and the correct comparison result can be obtained.

In this Embodiment 5, for the conversion comparators 71 etc., the case in which the setting signals CONT71 etc. are brought to the high level will be called the normal operating state. In this normal operating state, a sufficient comparison operation speed is obtained even if the voltage difference between the analog voltage VIN and the reference voltage is small. When all of the conversion comparators 71–77 are brought to this normal operating state, for all of the conversion comparators 71 etc., irrespective of the voltage difference between the analog voltage VIN and the reference voltage, because a sufficient comparison operation speed is obtained, correct A/D-conversion is possible as normal. However, because the through current flowing through the inverter INVA of each of the conversion comparators 71 etc. is relatively large, the consumed power in the A/D converter circuit 500 is relatively large.

On the other hand, for the conversion comparators 71 etc., the case in which the setting signals CONT71 etc. are brought to the low level will be called the low power operating state. In this low power operating state, the through current is relatively low, and the consumed power also can be made small. However, when the difference between the analog voltage VIN and the reference voltage is small, a sufficient comparison operation speed is not obtained. Consequently, when all of the conversion comparators 71–77 are brought to this low power operating state, because in some of the conversion comparators a sufficient comparison operation speed is not obtained, there are cases where correct A/D-conversion is not possible. That is, it is necessary to select the conversion comparators 71 etc. to be brought to the low power operating state suitably. When a conversion comparator 1 etc. is temporarily brought to a resting state as shown in Embodiment 1 etc., because the potential of the other terminal of the capacitor C1 (the node N2) becomes indefinite, it sometimes takes time for it to change from the resting state to the operating state. With respect to this, in this Embodiment 5, because the potential of the node N2 does not become indefinite, the time taken for the change from the low power operating state to the normal operating state is short. Therefore, the A/D converter circuit 500 is advantageous to driving at a fast clock frequency.

Now, as was explained also in Embodiment 1, generally, the amplitude of the analog voltage VIN inputted to the A/D converter circuit is smaller than the maximum amplitude which can be A/D-converted by this circuit, and its frequency is also amply lower compared to the clock signal. That is, with respect to the analog voltage inputted at a point in time given by a certain clock signal, there is a limit to the change amount of the analog voltage which can occur by the time given by the clock signal of the next cycle. Therefore, if the analog voltage inputted at a point in time determined by a certain clock signal is known, from this it is possible with a certain width to predict the analog voltage that will be inputted at the point in time determined by the clock signal of the next cycle.

In this connection, in this Embodiment 5, of the conversion comparators 71–77, those of the conversion comparators for which it is predicted, on the basis of the predicted analog voltage, that the voltage difference between the analog voltage and the reference voltage will be small, are brought to the normal operating state. On the other hand, the remaining conversion comparators are brought to the low power operating state.

In this Embodiment 5, as in Embodiment 1, it will be supposed that as the characteristic of the inputted analog voltage VIN, the range over which the analog voltage VIN can change in the period of 1 cycle of the clock signal CLK is not greater than ⅛ (the reciprocal of the number obtained by adding 1 to the number of comparators) of the maximum amplitude which can be converted by the A/D converter circuit 500.

And, it will be supposed that when the voltage difference between the analog voltage and the reference voltage is equal to or greater than ⅛ of the maximum amplitude, the conversion comparators 71 etc. can perform correct comparison operation even when brought to the low power operating state.

Under these suppositions, in the A/D converter circuit 500 of this Embodiment 5, in the comparator control circuit section 511, logical processing is carried out on the setting comparator outputs OP1–OP7, setting signals CONT71 etc. are thereby generated, and the states of the conversion comparators 71–77 in the next conversion are set as shown in the right half of the table shown in FIG. 24. In FIG. 24, the normal operating state is shown with ○ and the low power operating state is shown with Δ.

The specific setting content of this table will now be explained.

First, when setting comparator outputs OP1–OP7 indicating that setting comparators having determined that the analog voltage VIN inputted 1 cycle ago in the clock signal is greater than the reference voltages V1–V7 which they refer to themselves exist are inputted to the comparator control circuit section 511, specifically, when there are those at "H" among the setting comparator outputs OP1–OP7, the following is carried out. [1] The specified conversion comparator referring to the same reference voltage as the reference voltage (i.e. the common reference voltage) referred to by the highest-level setting comparator (in other words the one with the greatest potential of its reference voltage) among the setting comparators having made this "H" determination, and the conversion comparator one level higher than this specified conversion comparator, and the conversion comparator two levels higher than this specified conversion comparator, and the conversion comparator one level lower than this specified conversion comparator, are brought to the normal operating state. [2] The conversion comparators other than these are brought to the low power operating state.

This will now be explained specifically. When among the setting comparator outputs OP1–OP7 there is an output brought to the high level "H", that is, when it has been determined that the analog voltage VIN is higher than the reference voltage V1, the following is done. For example, a case wherein because a voltage in the range V4–V5 has been inputted as the analog voltage VIN the setting comparator outputs OP1–OP7 are (H, H, H, H, L, L, L) will be considered. [1] The specified conversion comparator 74 referring to the same reference voltage (the common reference voltage V4) as the reference voltage V4 to which the highest-level setting comparator P4 among the setting comparators P1–P4 outputting "H", refers, the conversion comparator 75 one level higher than this conversion comparator 74, the conversion comparator 76 two levels higher than this conversion comparator 74, and the conversion comparator 73 one level lower than this conversion comparator 74 are brought to the normal operating state.

As mentioned above, the characteristic of the inputted analog voltage VIN was assumed to be such that the range over which the analog voltage VIN can change in the period of 1 cycle of the clock signal CLK is not greater than ⅛ of the maximum amplitude which can be converted by the A/D converter circuit 500. Consequently, the analog voltage VIN to be compared by the conversion comparators in the next conversion is expected to be in one of the ranges of reference voltage V3–V4, V4–V5 or V5–V6. On the other hand, it was assumed that when the voltage difference between the analog voltage VIN and the reference voltage is equal to or greater than ⅛ of the maximum amplitude, the conversion comparators 71 etc. can perform correct comparison operation even when brought to the low power operating state. Considering this, it can be seen that whichever of the predicted ranges (V3–V6) the analog voltage VIN takes a value in, the conversion comparators 71, 72, 77, whose reference voltages are V1, V2 and V7, can perform comparison operation correctly even when brought to the low power operating state. Conversely, for the conversion comparators 73–76 there is a possibility that if they are not brought to the normal operating state, they will not be able to perform comparison operation correctly. Generalizing this, from the comparison results (the setting comparator outputs OP1 etc.) obtained by the setting comparators P1 etc. 1 cycle earlier in the clock signal CLK, it is necessary to bring to the normal operating state the specified conversion comparator referring to the same reference voltage as the highest-level setting comparator among the setting comparators outputting "H", the conversion comparators one and two levels higher than this, and the conversion comparator one level lower than this specified comparator.

[2] On the other hand, the conversion comparators 71, 72, 77 other than these are brought to the low power operating state.

The above relationship applies similarly within whichever of the reference voltage ranges V1–V2, V2–V3, . . . , V6–V7, V7-VRH the analog voltage VIN inputted 1 cycle earlier in the clock signal CLK was. However, when the analog voltage VIN inputted 1 cycle earlier was in the range V6–V7, because there is no comparator two levels higher, only the three conversion comparators 75, 76, 77 are brought to the normal operating state. And, when the analog voltage VIN was in the range V7-VRH, because no comparators one and two levels higher exist, only the two conversion comparators 76, 77 are brought to the normal operating state. Also, when the analog voltage VIN was in the range V1–V2, because a comparator one level lower does not exist, only the three conversion comparators 71, 72, 73 are brought to the normal operating state.

On the other hand, when setting comparator outputs OP1–OP7 indicating that setting comparators having determined that the analog voltage VIN inputted 1 cycle ago in the clock signal is greater than the reference voltages do not exist have been inputted to the comparator control circuit section 511, specifically, when the setting comparator outputs OP1–OP7 are all "L", the following is carried out. [3] The conversion comparators 71, 72 of the lowest level and one level higher than this (second from the bottom) are brought to the normal operating state. This is because, considering the range of the expected analog voltage VIN (VRL-V2), whereas the conversion comparators 73–77, whose reference voltages are V3–V7, can perform comparison operation correctly even when brought to the low power operating state, for the conversion comparators 71, 72 there is a possibility that if they are not brought to the normal operating state, they will not be able to perform comparison operation correctly. [4] The remaining conversion comparators 73–77 are brought to the low power operating state.

Thus, it can be seen that, in whichever of the ranges of low standard voltage VRL-high standard voltage VRH the value of the analog voltage VIN of 1 cycle earlier was, a relationship of setting states shown in the right half of the table of FIG. 24 is obtained, and in all the cases, the consumed power in the whole A/D converter circuit 500 can be suppressed.

And whichever of the normal operating state and the low power operating state the conversion comparators 71–77 set like this are set to, they can perform comparison operation correctly and output suitable conversion comparator outputs OUT1–OUT7, and the analog voltage VIN and the conversion comparator outputs OUT1–OUT7 of the conversion comparators 71–77 assume the relationship shown in the table of FIG. 23. This relationship is the same as when all of the conversion comparators are brought to the normal operating state, i.e. the result of using a normal 3 bit comparison section.

Therefore, thereafter, by similar processing, by means of the encoder 140, in accordance with the conversion comparator outputs OUT1–OUT7, a digital output DOUT corresponding to these can be generated. In the table of FIG. 23, the digital output DOUT is expressed as a decimal output code.

Thus, with the A/D converter circuit 500 of this Embodiment 5, the timing of the analog voltage VIN used for selecting the conversion comparators can be aligned with a fixed timing determined by the clock signal CLK (in this Embodiment 5, 1 cycle past). Accordingly, the conversion comparators to be brought to the normal operating state and the conversion comparators to be brought to the low power operating state can be suitably selected in correspondence with the change range of the analog voltage which can occur from the point in time a predetermined time past to the present conversion. And, because some of the conversion comparators are brought to a low power operating state, the consumed power of the A/D converter circuit 500 as a whole can be reduced.

And, compared to changing from a resting state to an operating state as in Embodiment 1, the time taken to change from the low power operating state to the normal operating state is short. Consequently, it is advantageous for driving an A/D converter circuit at a faster clock frequency.

And, in the A/D converter circuit 500, in the input information generating circuit section 512, outputs OP1–OP7, which are input information signals, are generated using 7 setting comparators P1 etc. operating under the clock signal CLK. Consequently, the timing of the selection of the conversion comparators 71 etc. can be easily aligned with a fixed timing determined by the clock signal CLK (in this Embodiment 5, 1 cycle past). Therefore, it is possible to select and bring to the normal operating state or the low power operating state suitable conversion comparators at all times.

And, the A/D converter circuit 500 has the same number (7) of setting comparators P1–P7, which refer to the same reference voltages V1–V7 as the conversion comparators 71–77. Consequently, in selection-determining which of the 7 conversion comparators 71–77 are to be brought to the normal operating state and which are to be brought to the low power operating state, because 7 comparison results (OP1–OP7) obtained by means of the setting comparators P1–P7 can be used, the selection determination becomes easy.

Also, in the A/D converter circuit 500, in correspondence with the determinations (outputs OP1 etc.) of the setting comparators P1 etc., of the conversion comparators 71–77 only 2 to 4 are brought to the normal operating state, and the others are brought to the low power operating state. Therefore, the consumed power of the A/D converter circuit 500 can be greatly reduced.

Also, in this A/D converter circuit 500, because differential-type comparators are being used as the setting comparators P1–P7, they can be made lower in consumed power than when chopper-type comparators are used for these.

Now, in this Embodiment 5, an example was shown wherein the setting comparators P1–P7 and the conversion comparators 71–77 are driven by the same clock signal CLK, and using setting comparator outputs OP1 etc. obtained 1 cycle past in the clock signal CLK, setting signals CONT71 etc. are generated and used for the state-setting of the conversion comparators 71–77 in the next cycle.

However, like that explained in Embodiment 1, alternatively they may be driven with a third clock signal CLK3, different from the clock signal CLK (see FIG. 22). As the third clock signal CLK3, a signal with a different phase, having a waveform opposite in phase to the clock signal CLK or a waveform ¼-period shifted (see FIG. 11(a)) can be used. Or, as the third clock signal CLK3, a signal having a frequency an integer multiple of the clock signal CLK can be used. By using a third clock signal CLK3 like this, because the nearer in the past the analog voltage VIN to be made the base is the smaller the range through which the analog voltage VIN can change thereafter becomes, it is possible to make the number of conversion comparators brought to the normal operating state small and make the number of conversion comparators brought to the low power operating state large, and it is possible to suppress the consumed power of the A/D converter circuit more. Or, if the same number of conversion comparators are brought to the normal operating state, it is possible to perform A/D-conversion correctly on an analog voltage VIN with a larger amplitude and a higher frequency.

And, in this Embodiment 5, although an example wherein an inverter INVA having a basic inverter section INV0 and an inverter section INV1 (see FIG. 25) was used has been shown, other constructions can also be employed as the inverter.

Figure 26:
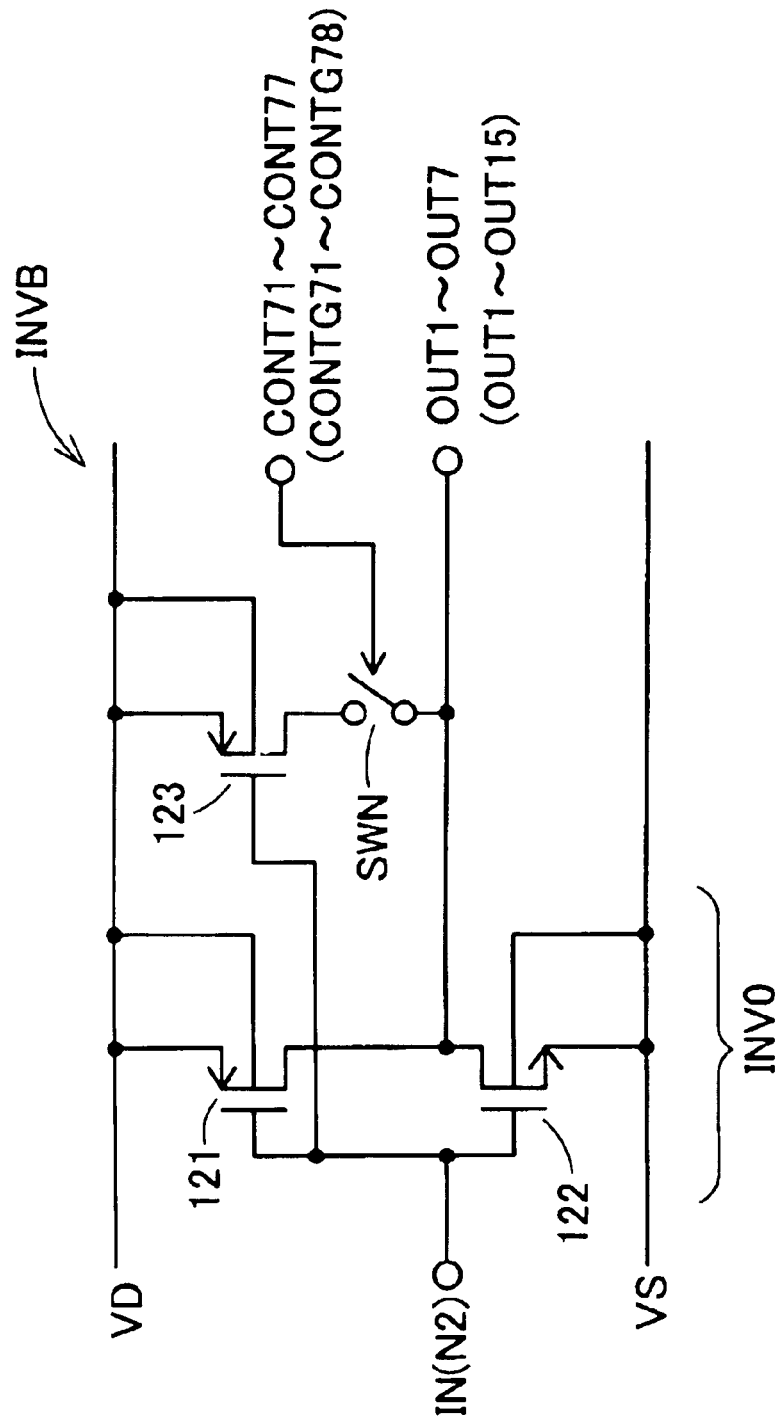
FIG. 26 is an explanatory view showing another construction of an inverter section of a conversion comparator used in Embodiments 5–8.

For example, the inverter INVB shown in FIG. 26, besides the basic inverter section INV0, has in parallel with the P-channel MOS transistor 121 a similarly P-channel MOS transistor 123, and the drain terminal of that is connected by way of an analog switch SWN to the output OUT1 etc. of the basic inverter section INV0. This switch SWN is turned ON by the setting signal CONT71 etc. assuming the high level.

In this inverter INVB, because it has this kind of construction, when the setting signal CONT71 etc. is at the low level, looking from the node N2 or the capacitor C1 (see FIG. 5), it is the same as if only the basic inverter section INV0 existed. On the other hand, when the setting signal CONT71 etc. is at the high level, from the node N2 or the capacitor C1 (see FIG. 5), it looks as if the transistor 121 of the basic inverter section INV0 and the transistor 123 have been connected in parallel.

Thus, by using this inverter INVB also, when the intrinsic voltage of the inverter INVB is made to arise, by means of the setting signal CONT71 etc., it is possible to control the through current flowing through the inverter INVB to two steps, a large and a small. That is, when the setting signal CONT71 etc. is at the low level, if the input and output of the inverter INVB are short-circuited, a through current flows through the basic inverter section INV0 only. On the other hand, when the setting signal CONT71 etc. is at the high level, because a through current flows through not only the basic inverter section INV0, not only the transistor 121 but also the transistor 123, a relatively large through current flows. Consequently, if the case where the setting signal CONT71 etc. is at the high level is considered the normal state, compared to this, in the case where it is at the low level the through current is smaller, and it can be made a low power state wherein the consumed power in the conversion comparator 71 etc. is low.

Figure 27:
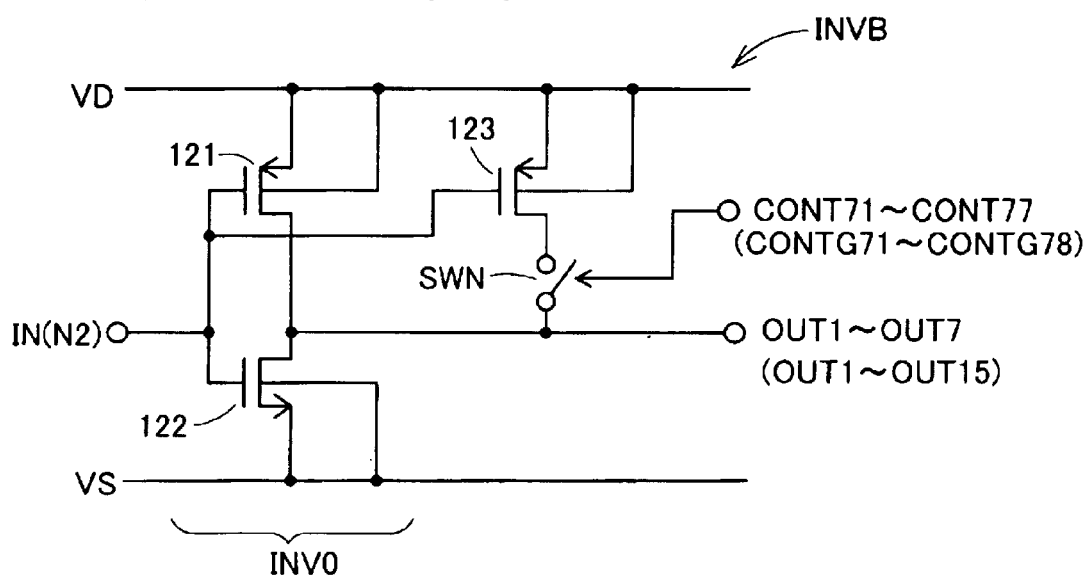
FIG. 27 is an explanatory view showing another construction of an inverter section of a conversion comparator used in Embodiments 5–8.

Reversely to this, an inverter INVC can also be employed in which, as shown in FIG. 27, besides the basic inverter section INV0, in parallel with the transistor 122 a similar N-channel MOS transistor 124 is provided, and the drain terminal of that is connected to the output OUT1 etc. by way of an analog switch SWP. With this inverter INVC also, compared to when the setting signal CONT71 etc. is at the high level, the through current when it is at the low level becomes small, and the consumed power in the conversion comparator 71 etc. can be made small.

(Sixth Embodiment)

Next, a parallel-type A/D converter circuit 600 directed to a sixth embodiment will be described, with reference to FIG. 28, FIG. 29. The A/D converter circuit 600 of this Embodiment 6, like the A/D converter circuit 500 of Embodiment 5, is a 3-bit A/D converter circuit. However, as can be understood easily by comparing FIG. 28 and FIG. 22, it differs in that, in a comparison section 610, it does not have the setting comparators P1–P7. Accordingly, the explanation will center on the different parts, and similar parts have been given the same numbers and their explanation will be omitted or simplified.

The A/D converter circuit 600 also is a circuit for converting an analog voltage VIN to a 3-bit digital output DOUT at intervals of a predetermined period applied with a clock signal CLK, and has the comparison section 610, a data latch 120, an encoder 140 and a control circuit section 150 (see FIG. 1). To the comparison section 610 is inputted, besides a high standard voltage VRH, a low standard voltage VRL and the analog voltage VIN, a clock signal CLK from the control circuit section 150.

The comparison section 610 shown in FIG. 28, in the same way as in Embodiment 5, obtains seven reference voltages V1–V7. And, it has 7 chopper-type comparators 71–77 and a comparator control circuit section 611.

The comparators 71–77 have the same circuit construction as the conversion comparators 71–77 in Embodiment 5 (see FIG. 5, FIG. 25), and respectively refer exclusively to and correspond one-to-one with the seven reference voltages V1–V7. The conversion comparators 71–77 are set by setting signals CONT71 etc. outputted from the comparator control circuit section 611 to one of two states, a normal operating state in which they perform comparison operation as normal comparators and a low power operating state in which they can carry out comparison operation while having lower consumed power than in the normal operating state.

And, the comparator outputs OUT1–OUT7, besides being outputted and inputted to the data latch 120, are each branched and inputted to the comparator control circuit section 611.

The comparator control circuit section 611 performs predetermined logic processing on these inputted comparator outputs OUT1–OUT7 and outputs setting signals CONT71–CONT77 similar to those of Embodiment 5.

Because the comparators 71–77 have the same circuit construction as the conversion comparators 71–77 of Embodiment 5 (see FIG. 5, FIG. 25), in the normal operating state, in which the setting signals CONT71 etc. are at the high level, the switch SWL is connected to the node N2, the switch SWM is turned ON, and in the VIN fetching state a large through current flows and a relatively large power is consumed. On the other hand, in the low power operating state, in which the setting signals 71 etc. are at the low level, the through current which flows in the VIN fetching state is relatively small, and the consumed power can also be made small.

However, like that explained in Embodiment 5, when the comparators 71 etc. are brought to the normal operating state, a sufficient comparison operation speed is obtained even when the voltage difference between the analog voltage VIN and the reference voltage is small. On the other hand, when the comparators 71 etc. are brought to the low power operating state, although relatively the through current can be made small and the consumed power also can be made small, when the difference between the analog voltage VIN and the reference voltage is small, a sufficient comparison operation speed is not obtained.

In this connection, the setting signals CONT71 etc. are obtained using the comparator outputs OUT1–OUT7 obtained by the comparators 71–77 in the preceding (1 cycle earlier) conversion. And, these are used for the state-setting of the comparators 71–77 for the next (1 cycle later than this) conversion. Specifically, as shown in the table of FIG. 29, the set states of the comparators 71–77 are decided in correspondence with the magnitude of the analog voltage VIN used in the preceding conversion.

For example, when the analog voltage VIN used in the preceding conversion was in the range of reference voltage V4–V5, the outputs (comparison results) of the comparators 71–77 at this point in time are, in rank from the lower-level comparators, (H, H, H, H, L, L, L).

Now, it will be supposed that the characteristic of the inputted analog voltage VIN is such that the range over which the analog voltage VIN can change in the period of 1 cycle is not greater than ⅛ (the reciprocal of the number obtained by adding 1 to the number of comparators) of the maximum amplitude which can be converted by the A/D converter circuit 600. In this case, the analog voltage VIN to be compared in the next conversion is expected to be in the range of reference voltage V3–V6.

Also, it will be assumed that when the voltage difference between the analog voltage and the reference voltage is equal to or greater than ⅛ of the maximum amplitude, the comparators 71 etc. can perform correct comparison operation even when brought to the low power operating state. Considering this, it can be seen that whichever of the ranges (V3–V6) the analog voltage VIN of 1 cycle later takes a value in, the comparators 71, 72, 77, whose reference voltages are V1, V2 and V7, can perform comparison operation correctly even when brought to the low power operating state. On the other hand, for the comparators 73–76 there is a possibility that if they are not brought to the normal operating state, they will not be able to perform comparison operation correctly. Generalizing this, from the comparison results (the comparator outputs OUT1 etc.) obtained by the comparators 71 etc. 1 cycle earlier in the clock signal CLK, it is necessary to bring to the normal operating state the highest-level specified conversion comparator 74 among the comparators 71–74 outputting "H", the conversion comparators 75, 76 one and two levels higher than this, and the conversion comparator 73 one level lower than this specified comparator. On the other hand, the comparators 71, 72 77 other than these are brought to the low power operating state.

When it is done in this way also, as long as the analog voltage VIN compared in the next conversion is in the expected range of reference voltage V3–V6, the same correct comparator outputs OUT1–OUT7 as when all of the 7 comparators 71–77 are brought to the normal operating state are obtained.

Furthermore, by doing it like this, because of the 7 comparators the 3 comparators 71, 72, 77 can be brought to the low power operating state, the consumed power of the whole A/D converter circuit 600 can be suppressed.

The above relationship applies similarly within whichever of the reference voltage ranges V1–V2, V2–V3, . . . , V6–V7, V7-VRH the analog voltage VIN inputted 1 cycle earlier in the clock signal CLK was. However, when the analog voltage VIN inputted 1 cycle earlier was in the range V6–V7, only the three comparators 75, 76, 77 are brought to the normal operating state. And, when the analog voltage VIN was in the range V7-VRH, only the two comparators 76, 77 are brought to the normal operating state. Also, when the analog voltage VIN was in the range V1–V2, only the three comparators 71, 72, 73 are brought to the normal operating state.

On the other hand, when outputs OUT1–OUT7 indicating that comparators having determined that the analog voltage VIN inputted 1 cycle ago in the clock signal CLK is greater than their reference voltages do not exist have been inputted to the comparator control circuit section 611, specifically, when the comparator outputs OUT1–OUT7 are all "L", the following is carried out. That is, the comparators 71, 72 of the lowest level and one level higher than this are brought to the normal operating state, and the other comparators 73–77 are brought to the low power operating state.

Thus, it can be seen that, in whichever of the ranges of low standard voltage VRL-high standard voltage VRH the value of the analog voltage VIN of 1 cycle earlier was, a relationship of setting states shown in the table of FIG. 29 is obtained, and in all the cases, the consumed power in the whole A/D converter circuit 600 can be suppressed. Also, in this Embodiment 6, as will be understood if it is compared with Embodiment 5, it is not necessary for setting comparators P1 etc. to be formed separately, and it becomes a simpler A/D converter circuit.

In the A/D converter circuit 600 of this Embodiment 6, the timing of the analog voltage used for selecting the comparators 71–77 to the normal operating state or the low power operating state can be aligned with the timing of the preceding conversion at all times. Consequently, suitable comparators can be selected as normal operating state or low power operating state at all times, and because the number of remaining comparators brought to the low power operating state can be made large it can be made a lower consumed power A/D converter circuit.

And, in the A/D converter circuit 600, the comparators to be brought to the normal operating state or the low power operating state in the present conversion are selection-determined using the outputs OUT1 etc. of the comparators 71 etc. in the preceding conversion. Consequently, a circuit for generating an Embodiment 5 input information signal is unnecessary, and it can be made a simple construction.

In the A/D converter circuit 600, on the basis of the outputs OUT1 etc. of the comparators 71–77 in the preceding conversion, in the present conversion, only 4 to 2 of the comparators 71–77 are brought to the normal operating state, and the others are brought to the low power operating state. Consequently, the consumed power of the A/D converter circuit 600 can be greatly reduced.

(Third Variant)

Next, a Variant 3 obtained by modifying Embodiment 6 will be explained, with reference to FIG. 30. In the A/D converter circuit 600 of Embodiment 6, chopper-type comparators (see FIG. 5, FIG. 25) were used as the comparators 71–77. With respect to this, this Variant 3 differs only in the point that differential-type comparators are used. Accordingly, the explanation will center on the different parts, and similar parts have been given the same numbers and their explanation will be omitted or simplified.

As described above, the comparators 71–77 of this Variant 3 are differential-type comparators (see FIG. 30). That is, the comparators 71–77 each compare the analog voltage VIN and the reference voltage V1 etc. by means of a differential circuit 160. The differential circuit 160 is made up of CMOS, and has an N-channel 151 to the gate of which the analog voltage VIN is applied and an N-channel 152 to the gate of which one of the reference voltages V1–V7 is applied. The drain of the N-channel 151 is connected by a P-channel 153 and the drain of the N-channel 152 by a P-channel 154 to the power supply potential VD. The gates of the P-channels 153, 154 are both connected to the drain of the N-channel 151. And, the sources of the N-channels 151, 152 are commonly connected and grounded by way of an N-channel 156 and a constant current circuit 155. In this differential circuit 160, the difference between the analog voltage VIN and the reference voltage V1 etc. appears as the drain voltage of the N-channel 152. The drain of the N-channel 152 is connected by way of a switch SWQ to a holding circuit 162. In this holding circuit 162, inverters 158, 159 are connected in series, and a connection between the input terminal of the inverter 158 and the output terminal of the inverter 159 is opened and closed by a switch SWR. Also, a comparator output OUT1–OUT7 is outputted from an inverter 161 branched from the output terminal of the inverter 158.

The switches SWQ, SWR are analog switches turned ON by an "H" input and turned OFF by an "L" input. And, because the switch SWQ is controlled by the clock signal CLK and the switch SWR is controlled by the clock signal CLK by way of an inverter 163, when the clock signal CLK is "H", the switches SWQ and SWR are opened and closed with mutually opposite phase.

When the clock signal CLK is "H", because the switch SWQ turns ON and the switch SWR goes OFF, a result of comparing the reference voltage V1 etc. and the analog voltage VIN is outputted as a comparator output OUT1 etc. through the inverter 161 from the differential circuit 160. On the other hand, in the period when the clock signal CLK is "L", because the switch SWQ turns OFF and the switch SWR comes ON, the preceding outputted result is held and continues to be outputted from the inverter 161.

Here, as the constant current circuit 155, the differential circuit 160 has two constant current sources 155A, 155B. Of these, the constant current source 155A is interposed between the sources of the N-channels 151, 152 and the ground potential. On the other hand, the constant current source 155B is connected to the sources of the N-channels 151, 152 by way of a switch which can be opened and closed by a setting signal CONT71 etc., specifically an N-channel 157. Because of this, in this differential circuit 160, when the setting signal CONT71 etc. is "H", because constant currents Ia, Ib flow respectively through both of the two constant current sources 155A, 155B, in total a constant current (first constant current) of Ia+Ib flows. When on the other hand the setting signal CONT71 etc. is "L", the constant current Ia (second constant current) flows through the constant current source 155A only. Accordingly, in this case, the constant current flowing through the differential circuit 160 can be decreased, and it becomes low consumed power. However, when the constant current flowing through the differential circuit 160 becomes small, because changing of the drain voltage of the N-channel 152 becomes slow, the time for a correct comparison result to be obtained reflecting a change in the analog voltage VIN (the time needed for comparison operation) becomes long. On the other hand, the time needed for this comparison operation becomes shorter the greater is the voltage difference between the analog voltage VIN and the reference voltage V1 etc.

Therefore, even using differential-type comparators 1–7 as in this Variant 3, A/D-conversion can be carried out in the same way as in Embodiment 6. In this variant, even while using differential-type comparators, whose consumed power is generally smaller than that of chopper-type comparators, it can be made an A/D converter circuit 600 with its consumed power further reduced.

(Seventh Embodiment)

Next, a parallel-type A/D converter circuit 700 directed to a seventh embodiment will be described, with reference to FIG. 31 through FIG. 34. The A/D converter circuit 700 of this Embodiment 7 is the same as Embodiment 6 in that it does not use setting comparators, but differs in that it is a 4-bit A/D converter circuit and uses 15 comparators 71–85, and in the point that it performs state-setting of the comparators with setting signals CONTG71 etc. group by group, with two comparators as one group, as in comparators 72 and 73, 74 and 75, and so on. Accordingly, the explanation will center on the different parts, and similar parts have been given the same numbers and their explanation will be omitted or simplified.

The A/D converter circuit 700 also is a circuit for converting an analog voltage VIN to a digital output DOUT at intervals of a predetermined period applied with a clock signal CLK, and has a comparison section 710, a data latch 320, an encoder 340 and a control circuit section 150 (see FIG. 1). To the comparison section 710 is inputted, besides a high standard voltage VRH, a low standard voltage VRL and the analog voltage VIN, a clock signal CLK from the control circuit section 150.

Figure 31:
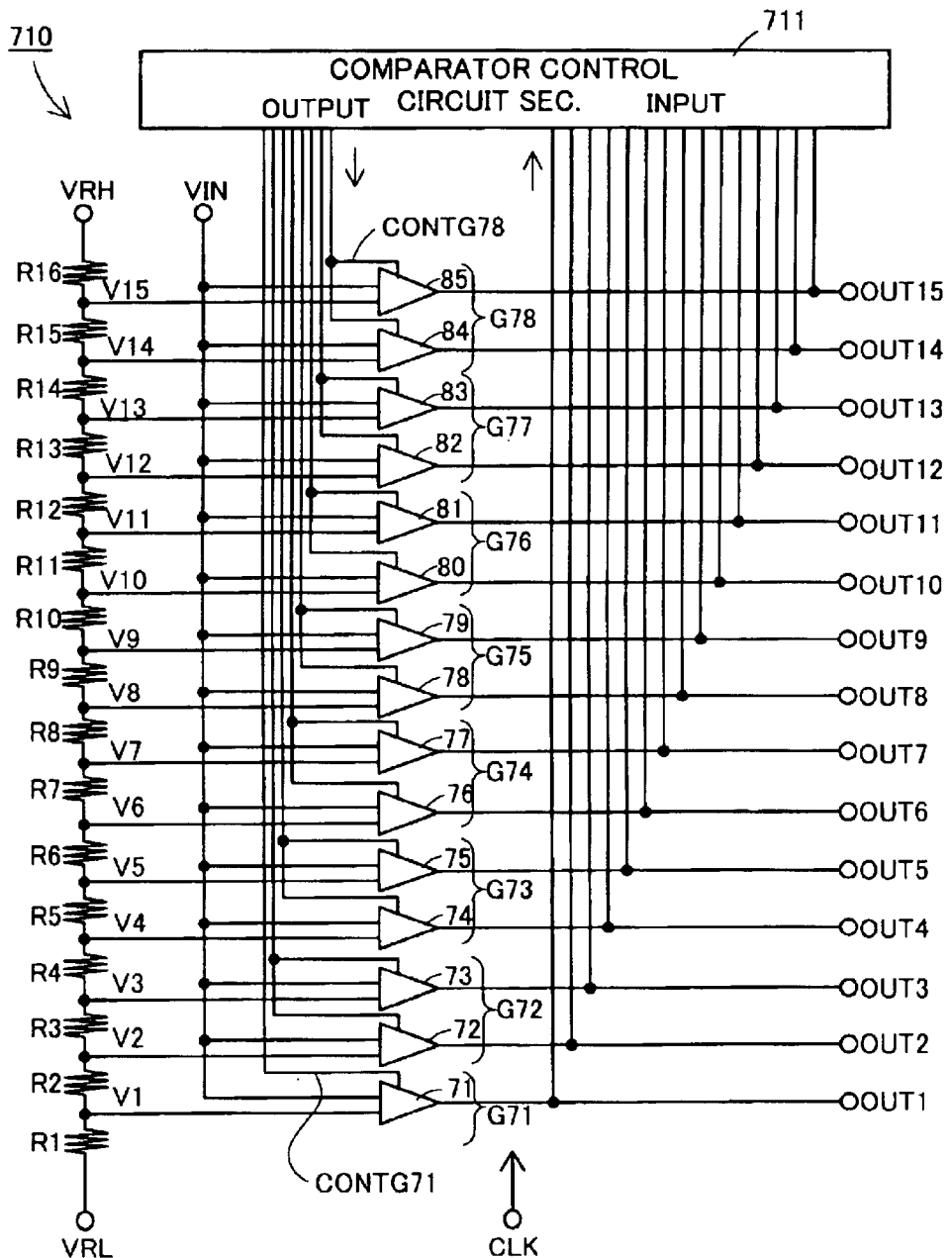
FIG. 31 is an explanatory view showing the outline of a comparison section, of an A/D converter circuit directed to Embodiment 7.

In the comparison section 710 shown in FIG. 31, 15 reference voltages V1–V15 are obtained by means of 16 identical voltage-dividing resistors R1–R16 connected in series between the high standard voltage VRH and the low standard voltage VRL. And, it has 15 chopper-type conversion comparators 71–85 and a comparator control circuit section 711.

The comparators 71–85 have the same circuit construction as the conversion comparators 71–77 (see FIG. 5, FIG. 25) in Embodiment 5, and the comparators 71–77 in Embodiment 6, and respectively refer exclusively to and correspond one-to-one with the 15 reference voltages V1–V15. These comparators 71–85 are set by setting signals CONTG71 etc. outputted from the comparator control circuit section 711 to either a normal operating state or a low power operating state.

And, the comparator outputs OUT1–OUT15, besides being inputted to the data latch 320, are each branched and inputted to the comparator control circuit section 711.

In FIG. 31, the connection lines between the clock signal CLK and the comparators are not shown, but as in Embodiment 5 (see FIG. 22) and Embodiment 6 (see FIG. 28), the clock signal CLK is inputted to each of the comparators 71–85.

The comparator control circuit section 711 performs predetermined logical processing on these inputted comparator outputs OUT1–OUT15 and outputs setting signals CONTG71–CONTG78 like those of Embodiments 5, 6. However, differently from Embodiments 5, 6, these setting signals CONTG71 etc., excepting the setting signal CONTG71, each state-set one group G72–G78 including two comparators. For example, the setting signal CONTG78 is inputted to the two comparators 84, 85 belonging to the group G78, and sets the states of these two comparators 84, 85 simultaneously. On the other hand, the setting signal CONTG71 is inputted to the one comparator 71 included in the group G71 and sets the state of this comparator 1. In this way, the comparators 1–15 are divided into eight groups G71–G78.

Now, because the comparators 71–85 have the same circuit construction as the conversion comparators 71–77 of Embodiment 5 (see FIG. 5, FIG. 25), in a normal operating state, in which the setting signal CONTG71 etc. is brought to the high level, the switch SWL is connected to the node N2, the switch SWM turns ON, and in the VIN fetching state a large through current flows and a relatively large power is consumed. On the other hand, in a low power operating state, in which the setting signal CONTG71 etc. is brought to the low level, the through current which flows in the VIN fetching state becomes relatively small, and the consumed power also can be made small.

However, like that explained in Embodiment 5, when the comparators 71 etc. are brought to the normal operating state, a sufficient comparison operation speed is obtained even when the voltage difference between the analog input voltage VIN and the reference voltage is small. On the other hand, when the comparators 71 etc. are brought to the low power operating state, although relatively the through current can be made small and the consumed power also can be made small, when the difference between the analog voltage VIN and the reference voltage is small, a sufficient comparison operation speed is not obtained.

In this connection, the setting signals CONTG71 etc. are obtained using the comparator outputs OUT1–OUT15 obtained by the comparators 71–85 in the last (1 cycle earlier) conversion. And, these are used for the state-setting of the comparators 71–85 for the next (1 cycle later than this) conversion.

Specifically, as shown in the tables of FIG. 32 and FIG. 33, the set states of the comparators 71–85 are decided in correspondence with the magnitude of the analog voltage VIN used in the preceding conversion. For example, when the analog voltage used in the preceding conversion was in the range of reference voltage V6–V7, the outputs (comparison results) of the comparators 71–85 at this point in time are, in rank from the lower-level comparators, the outputs (H, H, H, H, H, H, L, L, L, L, L, L, L, L, L), that is, '6' when expressed in output code (see FIG. 32).

Now, it will be supposed that the characteristic of the inputted analog voltage VIN is such that the range over which the analog voltage VIN can change in the period of 1 cycle is not greater than ⅛ (the reciprocal of the number of groups) of the maximum amplitude which can be converted by the A/D converter circuit 700. In this case, the analog voltage VIN to be compared in the next conversion is expected to be in the range of reference voltage V4–V9 ('4'-'8' in possible output code).

Also, it will be assumed that when the voltage difference between the analog voltage and the reference voltage is equal to or greater than ⅛ of the maximum amplitude, the comparators 71 etc. can perform correct comparison operation even when brought to the low power operating state. Considering this, it can be seen that whichever of the ranges (V5–V10) the analog voltage VIN of 1 cycle later takes a value in, the comparators 71, 72 and 8185, whose reference voltages are V1, V2 and V11–V14, can perform comparison operation correctly even when brought to the low power operating state. On the other hand, for the comparators 73–80 there is a possibility that if they are not brought to the normal operating state, they will not be able to perform comparison operation correctly. Now, as mentioned above, in this Embodiment 7, the comparators 71–85 are divided into 8 groups and set to the normal operating state or the low power operating state by the groups G71 etc. Therefore, when it is necessary for any of the comparators belonging to a group to be brought to the normal operating state, it is necessary for the group to which that comparator belongs to be brought to the normal operating state. When it is considered in this way, it can be seen that it is necessary for the comparators 72–81 belonging to the groups G72–G76 to be brought to the normal operating state. On the other hand it can be seen that the comparators 71 and 82–85 may be brought to the low power operating state.

Generalizing this, from the comparison results (the comparator outputs OUT1 etc.) obtained by the comparators 71 etc. 1 cycle ago in the clock signal CLK, the comparators 72–81 belonging to the specified group G74 to which the highest-level comparator 76 among the comparators 71–76 outputting "H" belongs, the groups G75, G76 one and two levels higher than this, and the groups G73, G72 one and two levels lower than the specified group G74 are brought to the normal operating state. On the other hand, it can be seen that the comparators 71, 82–85 belonging to the groups G1, G77, G78 other than this can be brought to the low power operating state.

The above relationship applies similarly within whichever of the reference voltage ranges V1-VRH the analog voltage VIN inputted 1 cycle earlier was. However, there may be times when the group or groups two levels higher, one and two levels higher, one and two levels lower or two levels lower than the specified group do not exist.

When the analog voltage VIN inputted 1 cycle earlier was in the range VRL-V1, the outputs of the comparators 71 etc. at this point in time are all "L". In this case, the analog voltage VIN compared by the comparators 71 etc. 1 cycle later than that is expected to be in the range of reference voltage VRL-V3.

Also, considering the voltage difference between the analog voltage and the reference voltage, it can be seen that whichever of the ranges (VRL-V3) the analog voltage VIN takes a value in, the comparators 75–85, whose reference voltages are V5–V15, can perform comparison operation correctly even when brought to the low power operating state. On the other hand, there is a possibility that if the comparators 71–74 are not brought to the normal operating state, they will not be able to perform comparison operation correctly. Also, considering that state-setting of the comparators 71 etc. is carried out group by group, it can be seen that it is necessary for the groups G71–G73 (the comparators 71–75) to be brought to the normal operating state. On the other hand, it can be seen that the groups G74–G78 (the comparators 76–85) may be brought to the low power operating state.

Thus, it can be seen that, in whichever of the ranges of low standard voltage VRL-high standard voltage VRH the value of the analog voltage VIN of the preceding conversion was, a relationship of setting states shown in the tables of FIG. 32 FIG. 34 is obtained, and in all the cases, the consumed power in the whole A/D converter circuit 700 can be suppressed.

Also, as will be understood by comparing with Embodiment 6, in this Embodiment 7, because the state-setting of the comparators is carried out by groups G71–G78, compared to when the state-setting is carried out for each comparator, a simpler comparator control circuit section 711 is sufficient.

In this way, in the A/D converter circuit 700 of this Embodiment 7, the comparators 71–85 are brought to either a normal operating state or a low power operating state by groups (groupings) G71–G78. Accordingly, the construction of the comparator control circuit section 711 for bringing the comparators 71 etc. to the normal operating state and the low power operating state becomes simple.

And, in this A/D converter circuit 700, the outputs OUT1 etc. of the comparators 71–85 obtained in the preceding conversion are used in the selection of the comparators 71 etc. for the present conversion. Furthermore, the comparators 71 etc. are divided into n=8 groups (groupings), and only the comparators belonging to 5 to 3 groups (groupings) are brought to the normal operating state in the present conversion, and the comparators belonging to the other groups (groupings) are brought to the low power operating state. Accordingly, the consumed power of the A/D converter circuit 700 can be greatly reduced.

(Fourth Variant)

In the above Embodiment 7, chopper-type comparators were used as the comparators 71–85 (see FIG. 5, FIG. 25), but instead of this, as in Variant 3 described above, differential-type comparators (see FIG. 30) can alternatively be used. When this is done, even while using differential-type comparators, which generally have smaller consumed power than chopper-type comparators, it is possible to make it an A/D converter circuit with its consumed power further reduced.

(Eighth Embodiment)

Next, a parallel-type A/D converter circuit 800 directed to 99 an eighth embodiment will be described, with reference to FIG. 35, FIG. 36. The A/D converter circuit 800 of this Embodiment 8 uses 7 setting comparators as in Embodiment 5, but differs in the point that it is a 4-bit A/D converter circuit and uses 15 conversion comparators. And, although unlike Embodiment 7 setting comparators are also used, like Embodiment 7, as in conversion comparators 72 and 73, 74 and 75 and so on, with two conversion comparators as one group, state-setting of the conversion comparators 71–85 is carried out with setting signals CONTG71 etc. Accordingly, the explanation will center on the parts differing from Embodiments 5 and 7, and similar parts have been given the same numbers and their explanation will be omitted or simplified.

The A/D converter circuit 800 also is a circuit for converting an analog voltage VIN to a digital output DOUT at intervals of a predetermined period applied with a clock signal CLK, and has a comparison section 810, a data latch 320, an encoder 340 and a control circuit section 150 (see FIG. 1). To the comparison section 810 is inputted, besides a high standard voltage VRH, a low standard voltage VRL and the analog voltage VIN, a clock signal CLK from the control circuit section 150.

Figure 35:
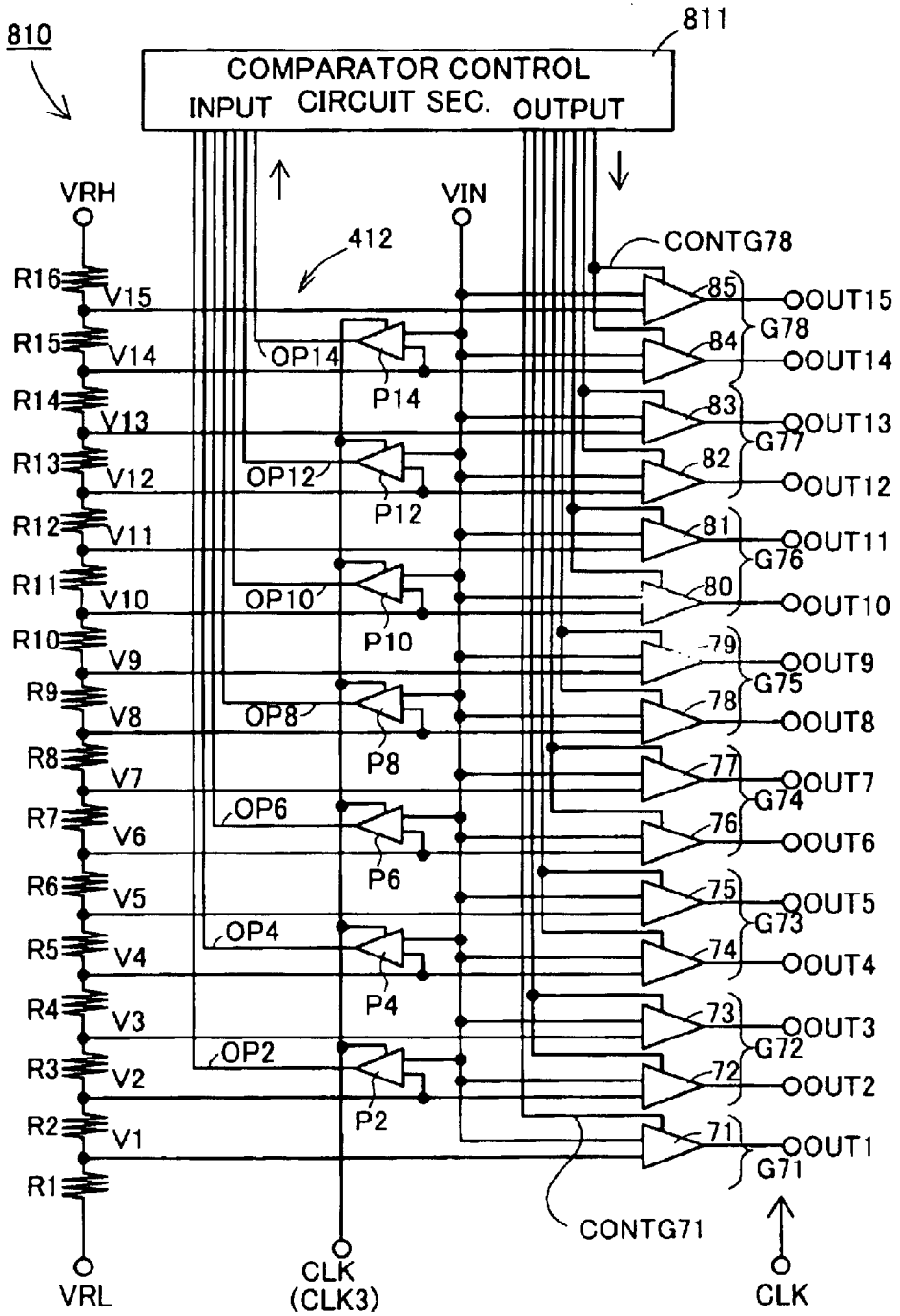
FIG. 35 is an explanatory view showing the outline of a comparison section, of an A/D converter circuit directed to Embodiment 8.

In the comparison section 810 shown in FIG. 35, 15 reference voltages V1–V15 are obtained by means of 16 identical voltage-dividing resistors R1–R16 connected in series between the high standard voltage VRH and the low standard voltage VRL. And, it has 15 chopper-type conversion comparators 71–85, an input information generating circuit section 412 made up of 7 differential-type setting comparators P2–P14, and a comparator control circuit section 811.

Of these, the setting comparators P2, P4 . . . P14 constituting the input information generating circuit section 412 have the same circuit construction as the setting comparators P1–P7 in Embodiment 5 (see FIG. 10), and refer respectively to, among the 15 reference voltages V1–v15, every other reference voltage V2, V4 . . . V14. These setting comparators P2 etc., every cycle of the inputted clock signal CLK, each make a comparison with the analog voltage VIN and update to either "H" or "L" and output a setting comparator output OP2, OP4 . . . OP14.

The comparator control circuit section 811 performs predetermined logical processing on these inputted setting comparator outputs OP2–OP14 and outputs setting signals CONTG71–CONTG78. The setting signals CONTG71 etc. are used for state-setting of the conversion comparators 71–85 in the next conversion, i.e. in the next cycle of the clock signal CLK.

The conversion comparators 71–85 have the same circuit construction as the conversion comparators 71–77 in Embodiment 5 (see FIG. 5, FIG. 25), and are set by the setting signals CONTG71 etc. outputted from the comparator control circuit section 811 to one of two states, a normal operating state in which they perform comparison operation as normal comparators and a low power operating state in which they can carry out comparison operation while having lower consumed power than in the normal operating state.

In this A/D converter circuit 800, depending on which of the ranges divided by the high standard voltage VRH, the low standard voltage VRL and the seven reference voltages V2, V4 . . . V14 the magnitude of the analog voltage VIN belongs to, the outputs OP2 etc. of the setting comparators P2 etc. become either "H" or "L". Consequently, the analog voltage VIN and the conversion comparator outputs OP2–OP14 of the setting comparators P2–P14 assume the relationship shown in the left half of the table shown in FIG. 36. These setting comparator outputs OP2 etc. are inputted to the comparator control circuit section 811.

In the comparator control circuit section 811, predetermined logical processing is carried out on these inputted setting comparator outputs OP2–OP14, and setting signals CONTG71–CONTG78 similar to those in Embodiment 7 are outputted. As in Embodiment 7, the conversion comparators 71–85 are divided into 8 groups G71–G78. The group G71 includes only the comparator 71, but the other groups G72–G78 all include two conversion comparators. Accordingly, by the setting signals CONTG71 etc., the 15 conversion comparators 71–85 have their states set the one or two included in each group at a time. The conversion comparators 71–85 and the setting comparators P2 etc. have the following relationship. That is, in the groups G72–G78 excluding the lowest-level group G71, to the reference voltages (grouping reference voltages) V2, V4, . . . , V14 to which the lowest-level conversion comparator among the conversion comparators belonging to each of the groups G72 etc. (the lowest-level first comparator in the group) 72, 74, . . . , 84 refer, the setting comparators P2 etc. are also referring. In this way, a correspondence relationship is formed between the 7 setting comparators P2 etc. and the 8 groups G1, G2 etc.

Now, because the conversion comparators 71–85 have the same circuit construction as the conversion comparators 71–77 of Embodiment 5 (see FIG. 25), when the setting signals CONTG71 etc. are made "H", they assume the normal operating state. On the other hand, when the setting signals CONTG71 etc. are made "L", they assume the low power operating state.

In this connection, the setting signals CONTG71 etc. are obtained using setting comparator outputs OP2–OP14 obtained a predetermined time past (for example 1 cycle earlier in the clock signal) by the setting comparators P2 etc. And these are used in the state-setting of the conversion comparators 71–85 1 cycle after that. By this means, the set states of the conversion comparators 71–85 are decided for each of the groups G71–G78 in correspondence with the magnitude of the analog voltage VIN inputted and compared by the setting comparators P2 etc. a predetermined time past.

For example, it will be supposed that the characteristic of the inputted analog voltage VIN is such that the range over which the analog voltage VIN can change in the period of 1 cycle of the clock signal CLK is not greater than ⅛ (the reciprocal of the number of groups) of the maximum amplitude which can be converted by the A/D converter circuit 400.

For example, when the analog voltage VIN inputted 1 cycle ago was in the range of reference voltage V6–V8, the outputs (comparison results) OP2 etc. of the setting comparators P2 etc. at this point in time become, as shown in the left side of the table of FIG. 21, in rank from the lower-level setting comparators, (H, H, H, L, L, L, L). Now, because the analog voltage VIN has the characteristic discussed above, at the point in time at which the analog voltage VIN is compared by the conversion comparators 71 etc., the values that this analog signal can take are expected to be confined to the range of reference voltage V4–V10.

Also, it will be assumed that when the voltage difference between the analog voltage and the reference voltage is equal to or greater than ⅛ (the reciprocal of the number of groups) of the maximum amplitude, the comparators 71 etc. can perform correct comparison operation even when brought to the low power operating state. Considering this, it can be seen that whichever of the ranges (V4–v10) the analog voltage VIN takes a value in, the conversion comparators 71, 72 and 82–85, whose reference voltages are V1, V2 and V12–V15, can perform comparison operation correctly even when brought to the low power operating state. On the other hand, for the comparators 73–81 there is a possibility that if they are not brought to the normal operating state, they will not be able to perform comparison operation correctly. Now, as mentioned above, in this Embodiment 8, the conversion comparators 71–85 are divided into 8 groups and set to the normal operating state or the low power operating state by the groups G71 etc. Therefore, when it is necessary for any of the conversion comparators belonging to a group to be brought to the normal operating state, it is necessary for the group to which that conversion comparator belongs to be brought to the normal operating state. When it is considered in this way, it can be seen that it is necessary for the groups G72–G76 (the comparators 72–81) to be brought to the normal operating state. On the other hand it can be seen that the groups G71, G77, G78 (the comparators 71, 82–85) may be brought to the low power operating state.

Generalizing this, from the comparison results (the setting comparator outputs OP2 etc.) obtained by the setting comparators P2 etc. a predetermined time past, the comparators 72–81 belonging to the specified group G74 to which belongs the conversion comparator 76 referring to the same reference voltage as the highest-level setting comparator P6 among the setting comparators P2, P4, P6 outputting "H", the groups G75, G76 one and two levels higher than this, and the groups G73, G72 one and two levels lower than the specified group G74 are brought to the normal operating state. On the other hand, it can be seen that the conversion comparators 71, 82–85 belonging to the groups G1, G77, G78 other than this can be brought to the low power operating state.

The above relationship applies similarly within whichever of the reference voltage ranges V2-VRH the analog voltage VIN inputted the predetermined time past was. However, there may be times when the group or groups two levels higher, one and two levels higher, one and two levels lower or two levels lower than the specified group do not exist.

When the analog voltage VIN inputted the predetermined time past was in the range VRL-V2, the outputs of the setting comparators P2 etc. at this point in time are all "L", i.e. are (L, L, L, L, L, L, L). In this case, the analog voltage VIN compared by the comparators 71 etc. after that is expected to be in the range of reference voltage VRL-V4.

Also, considering the voltage difference between the analog voltage and the reference voltage, it can be seen that whichever of the ranges (VRL-V4) the analog voltage VIN takes a value in, the conversion comparators 76–85, whose reference voltages are V6–V15, can perform comparison operation correctly even when brought to the low power operating state. On the other hand, there is a possibility that if the conversion comparators 71–75 are not brought to the normal operating state, they will not be able to perform comparison operation correctly. In this case, it can be seen that even considering that state-setting is carried out group by group it becomes the same result, and it is necessary for the groups G71–G73 (the conversion comparators 7175) to be brought to the normal operating state. On the other hand, it can be seen that the groups G74–G78 (the conversion comparators 76–85) may be brought to the low power operating state.

Thus, it can be seen that, in whichever of the ranges of low standard voltage VRL-high standard voltage VRH the value of the analog voltage VIN of the preceding conversion was, a relationship of setting states shown in the table of FIG. 36 is obtained, and in all the cases, the consumed power in the whole A/D converter circuit 800 can be suppressed.

Also, as will be understood by comparing with Embodiment 5, in this Embodiment 8, because the state-setting of the conversion comparators is carried out in groups G71–G78, compared to when the state-setting is carried out for each conversion comparator, a simpler comparator control circuit section 811 is sufficient. Furthermore, unlike Embodiment 5, in which the same number of setting comparators as conversion comparators (7) was used, because fewer setting comparators than conversion comparators are used, the construction of the comparison section 810 also becomes simple.

Thus the A/D converter circuit 800 of this Embodiment 8 has m=15 conversion comparators divided into n=8 groups (groupings) and 7 setting comparators. And the setting comparators refer to the same reference voltages V2, V4, . . . , V14 as the lowest-level conversion comparators 72, 74, . . . , 84 in the groups. Consequently, a correspondence relationship between the setting comparators P2 etc. and the groups G71 etc. is achieved. Accordingly, it is possible to select conversion comparators 71 etc. to be brought to the normal operating state or the low power operating state easily and appropriately group by group, on the basis of the comparison results of the setting comparators P2 etc. And because the states of the conversion comparators 71 etc. are selected group by group, the construction of the comparator control circuit section 811 becomes simple.

And, only the conversion comparators belonging to some of the groups, specifically 5 to 3 groups, are brought to the normal operating state in the present conversion, and the conversion comparators belonging to the other groups are brought to the low power operating state. Thus, the consumed power of the A/D converter circuit 800 can be greatly reduced.

In this Embodiment 8 also, similarly to that explained in Embodiment 5, the setting comparators P2 etc. (the input information generating circuit section 412) may alternatively be driven by a third clock signal CLK3, different from the clock signal CLK. As the third clock signal CLK3, one the same frequency as the clock signal CLK but having a waveform of opposite phase or a waveform shifted by ¼ period (see FIG. 11) or the like can be shown as an example.

In the above, the invention was described on the basis of Embodiments 1–8 and Variants 1–4, but the invention is not limited to these embodiments etc., and it is needless to say that it can be applied suitably altered within a range not deviating from its scope.

For example, in the A/D converter circuits 100 etc., if the amplitude of the inputted analog voltage VIN becomes large and the frequency high and the range over which the analog voltage VIN can change in the period of 1 cycle of the clock signal or in a predetermined time becomes too large, AD-conversion cannot be carried out exactly. This can be dealt with by increasing the number of comparators brought to the operating state, but then the effect of reducing the consumed power of the A/D converter circuit decreases. On the other hand, even if the analog signal cannot be exactly converted over all periods, as explained in Embodiment 2, by considering the characteristic of the inputted analog signal and the characteristics of the A/D converter circuit of the invention, it is also possible to utilize the results of AD-conversion only in necessary periods, while obtaining the merit that it is low in consumed power.

In the above Embodiment 1 etc., for the comparators brought to the resting state, the comparator circuits were constructed to output "H" or "L" forcibly using first setting signals CONT1A etc. and second setting signals CONT1B etc. (see FIG. 9, FIG. 10). However, as shown with a dashed line in FIG. 1, alternatively it may be constructed so that by information on the comparators brought to the operating state and comparators brought to the resting state being outputted from the comparison section 110 as a setting signal CONT, and this being inputted to the encoder 140, the outputs from the comparators brought to the resting state in the encoder 140 are ignored and necessary data is supplemented by the encoder 140 itself or the like to output the digital output DOUT. However, when they are made to output "H" or "L" forcibly as in Embodiment 1 etc., there is the merit that as the circuit construction of the data latch 120 and thereafter, the same circuit constructions as hitherto can be employed.

And, in the above Embodiment 1 etc., in the chopper-type comparator, turning OFF the switches SWA, SWC and turning ON the switch SWB, that is, bringing it to the comparing state (see FIG. 6) and holding this, was made to correspond to the resting state. However, besides this, alternatively the switch SWC may be held at OFF so that a through current does not flow through the inverter INV and the switches SWA, SWB may be held in their present states. Because there is also a slight consumption of power on switching ON/OFF of the switches SWA, SWB, which are analog switches, if this is done the power consumption can be reduced further.

FIG. 37 is a circuit block diagram of the AD converter circuit of the embodiment of the present invention. This is a parallel-type AD converter circuit in which 15 comparators CP1–CP15 are arranged in parallel as comparators for A/D conversion. Here, the comparators CP1–CP15 mentioned here refer to differential-type comparators.

An input terminal (VIN) in which input voltage VIN is inputted is connected to a (Vin) terminal, which is an input terminal of each of the comparators CP1–CP15. Reference voltages V1–V15 obtained by dividing an input voltage range from low voltage level VRL to high voltage level VRH to 16 equal portions are inputted to reference voltage terminals (Ref), which are the other input terminals. Output signals of the respective comparators CP1–CP15 are connected to the output terminals (OUT1)–(OUT15). The reference voltages V1–V15 are generated by divided resistors RF1–RF16 sandwiched by the input voltage ranges VRH, VRL.

The respective comparators CP1–CP15 compare input voltages VIN to the respective reference voltages V1–V15 and output comparison results as the output signals OUT1–OUT15. Thus, in which voltage range of those obtained by dividing to 16 equal portions from VRL-V1 to V15-VRH the input voltage VIN exists is identified as shown in FIG. 38. Because the respective voltage ranges are identified according to the output codes 0–15, a 4-bit digital signal can be outputted as an A/D conversion result by encoding the output codes 0–15.

Further, the respective comparators CP1–CP15 include bias current supply circuits B1–B15 so as to supply bias current to the comparators. The respective bias current supply circuits B1–B15 contain bias current setting terminals (Vb), which are connected to one side of a switch circuit provided independently on each of the switch sections SW-A, SW-B as bias voltage lines NB1–NB15. Further, in the bias voltage lines NB1–NB15, their adjacent wirings are connected to each other through resistor elements R1–R14, so that all the bias voltage lines NB1–NB15 are connected in series. The other ends of the respective switch circuits constituted of the switch sections SW-A, SW-B are gathered and independently connected to bias voltage terminals (VA), (VB).

In FIG. 37, another pair of comparators CP21–CP35 and bias current supply circuits B21–B35 is provided in parallel. The comparators CP21–CP35 are of differential-type comparators like the comparators CP1–CP15 and like the comparators CP1–CP15, the input voltage VIN and the reference voltage V1–V15 are inputted to the input terminals (Vin) and the reference voltage terminals (Ref) respectively. Their output signals are inputted to the bias voltage control circuit BC and control signals CTA, CTB for carrying out the open/close control of each switch circuit of the switch sections SW-A, SW-B are outputted based on a conversion table, which will be described later. Like the bias current supply circuits B1–B15, the bias current supply circuits B21–B35 supply the bias current to the respective comparators CP21–CP35. In the bias current supply circuits B21–B35, a common bias voltage V0 is set up at their bias current setting terminals (Vb) so that the same bias current is supplied to the comparators. The comparators CP21–CP35 function as a monitor for setting up the bias current with respect to the comparators CP1–CP15 for A/D conversion. Therefore, generally, the bias current to be supplied to the comparators CP21–CP35 is limited to the lowest current level necessary for allowing the monitor operation to be carried out.

Figure 39:
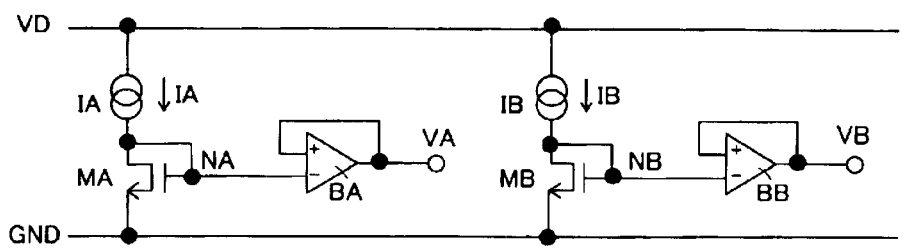
FIG. 39 is a circuit block diagram of a bias voltage generator circuit.

FIG. 39 is a circuit diagram of a generation circuit for the bias voltages VA, VB to be supplied to the bias voltage terminals (VA), (VB). The generation circuits of the bias voltages VA, VB have the same circuit structure. Current sources IA, IB are connected to drain terminals (NA), (NB) of NMOS transistors MA, MB in which their drain and gate terminals are connected to each other and their source terminals are connected to the ground voltage. Drain/gate terminals (NA), (NB) are biased to a predetermined voltage depending on the current values IA, IB supplied from the current sources IA, IB. This predetermined voltage is received by buffer circuits BA, BB, which output bias voltages VA, VB. In FIG. 39, the buffer circuits BA, BB are constituted as voltage follower circuits and the bias voltages VA, VB are equal to the predetermined voltages at the drain/gate terminals (NA), (NB).

Figure 40:
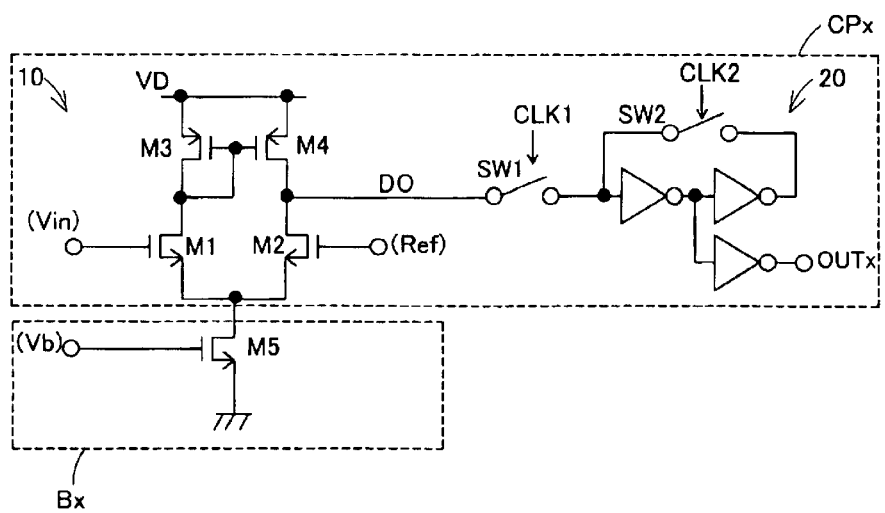
FIG. 40 is a circuit block diagram of a differential-type comparator.
Figure 41:
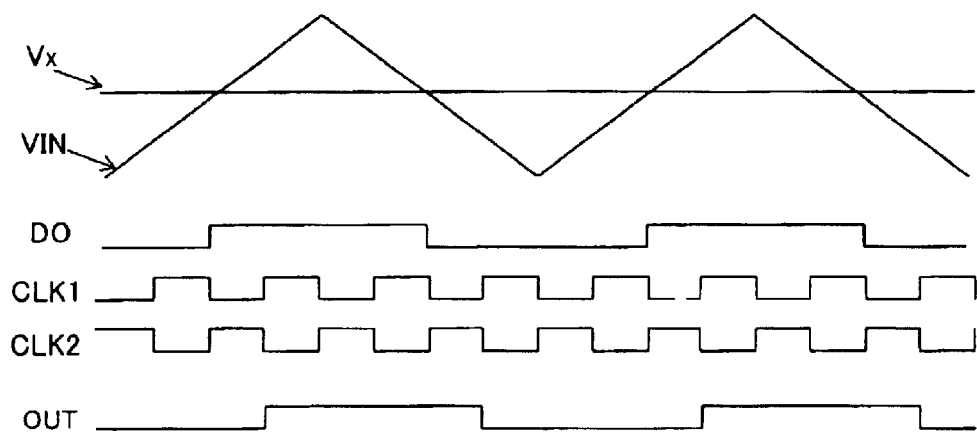
FIG. 41 is an operational waveform diagram of the differential-type comparator.

Specific circuit structures of a differential-type comparator CPx and bias current supply circuit Bx used in the A/D converter circuit of FIG. 37 and its circuit operation will be described with reference to FIG. 40 and FIG. 41 respectively.

The comparator CPx comprises a differential amplifier section 10 and a synchronizer section 20 for outputting its output signal synchronously with clock signals CLK1, CLK2. The differential amplifier section 10 is comprised of NMOS transistors M1, M2 which are differential pair transistors for executing differential comparison between the input terminal (Vin) and the reference voltage terminal (Ref) for differential comparison and PMOS transistors M3, M4 connected to the drain terminals of NMOS transistors M1, M2 as active load which is constructed as a current mirror circuit.

A comparison result signal DO from the differential amplifier section 10 is outputted from a connection joint DO between the transistor M2 and the transistor M4 and inputted to the synchronizer section 20. In the synchronizer section 20, the comparison result signal DO inputted through the switch circuit SW1 is latched by a latch section having 2-stage structured inverter gate constituted by turning ON the switch circuit SW2. The switch circuits SW1, SW2 are controlled by complementary clock signals CLK1, CLK2 and the switch circuit SW1 is turned ON by the clock signal CLK1 so that the comparison result signal DO is fetched in. Then, the switch circuit SW2 is turned ON by the clock signal CLK2 so that the comparison result signal DO is latched. Its output signal is outputted from the latch section through an output terminal (OUTX) via an inverter gate.

A bias current supply circuit Bx is provided with a NMOS transistor M5 which is connected between the connection point between the NMOS transistors M1 and M2 and the ground voltage. A gate terminal of the transistor M5 is connected to a bias current setting terminal (Vb). By turning ON the NMOS transistor M5 depending on a bias voltage of a predetermined voltage level from the bias current setting terminal (Vb), the predetermined bias current is supplied to the differential amplifier section 10. If the bias voltages VA, VB are applied to the gate terminal of the NMOS transistor M5, the NMOS transistor M5 and the NMOS transistors MA, MB in the generation circuit of the bias voltages VA, VB constitute a current mirror circuit, so that a bias current depending on a current value supplied from the respective current sources IA, IB is supplied from the NMOS transistor M5 to the differential amplifier section 10.

The circuit operation of the comparator CPx will be described based on the operation waveform of FIG. 41. The logical level of the comparison result signal DO is inverted depending on the relation between the reference voltage Vx to be set up at the reference voltage terminal (Ref) and the input voltage VIN to be inputted to the input terminal (Vin). That is, if the input voltage VIN is lower than the reference voltage Vx, a low-level voltage is outputted, and if the input voltage VIN is higher than the reference voltage Vx, a high-level voltage is outputted. The comparison result signal DO is fetched in by the synchronizer section 20 with the complementary clock signals CLK1, CLK2 and latched.

If it is assumed that the switch circuits SW1, SW2 are turned ON by the high-level signals of the clock signals CLK1, CLK2, the comparison result signal DO fetched in by the synchronizer section 20 because of high-level transition of the clock signal CLK1 is outputted as an in-phase signal from the output terminal (OUTX) through the 2-stage structured inverter gate. Because after that, the logical levels of the clock signals CLK1, CLK2 are inverted so that the logical level of the clock signal CLK2 becomes high level, the fetched-in comparison result signal DO is latched by the latch section. Therefore, it comes that the same comparison result signal DO is outputted to the output terminal (OUTX) in a period from the high-level transition of the clock signal C1 to a high-level period of the clock signal CLK2. A signal outputted from the output terminal (OUTX) is updated at every high-level transition of the clock signal CLK1. Consequently, A/D conversion operation synchronous with the clock signals CLK1, CLK2 is carried out.

Next, setting of the bias current supplied to the respective comparators CP1–CP15 will be described. Supply of the bias current is carried out by setting of the bias voltage onto the bias current supply circuits B1–B15. Here, setting of the bias voltage is executed when each switch circuit in the switch sections SW-A, SW-B is turned ON by control signals CTA, CTB outputted from the bias voltage control circuit BC. FIG. 42 shows a table which indicates this control.

If under the control of the bias current shown in FIG. 42, the A/D conversion operation is carried out at every predetermined cycle of a clock signal or the like, it is executed on such a presumption that the allowable voltage change range of the input voltage VIN between adjacent AD conversion operations is equal to the quantity of an output code of the output codes 0–15 (see FIG. 38). That is, this is carried out on a presumption that the voltage value of the input voltage VIN in the A/D conversion operation at some point of time causes a voltage change corresponding to the quantity of a comparator as compared to the input voltage VIN at the time of the A/D conversion operation executed in the A/D conversion operation a cycle before. Needless to say, this presumption can be turned to an appropriate condition by adjusting the voltage width to be set up as an output code or the cycle of the A/D conversion operation or the like appropriately because the input voltage VIN is an analog voltage signal which changes continuously.

If it is assumed that the input voltage VIN exists within the voltage range of voltage level V8–V9 at the time of the A/D conversion operation, it can be considered that a voltage level which may change as the input voltage VIN at a next conversion operation exists within voltage level V7–V10 which is expanded by the quantity of an output code.

Then, by setting the bias voltage directed to the comparators CP8–CP9 of the comparators CP7–CP10 provided for the voltage level V7–V10 on the bias voltage VB, a sufficient bias current can be supplied to the comparators CP8, CP9.

Contrary to this, for the comparators CP1–CP5 and CP12–CP15 provided for the voltage level VRL to V5 and V12 to VRH which may not change as the input voltage VIN at the next conversion operation, the bias current can be limited. The reason is that at the next conversion operation, the output signals OUT1–OUT5 and OUT12–OUT15 of the comparators CP1–CP5 and CP12–CP15 may not be inverted so that a rapid circuit operation does not have to be secured. By setting the bias voltage to the comparators CP1–CP5 and CP12–CP15 to a bias voltage VA lower than the bias voltage VB, the bias current to the comparators CP1–CP5 and CP12–CP15 can be turned to a limited current value. Current consumption at the comparators CP1–CP5 and CP12–CP15 can be reduced.

Here, the bias voltage is not set up directly from outside to the comparators CP6, CP7 and CP10, CP11. The bias voltage lines NB1–NB15 leading to the bias current setting terminals (Vb) of the respective bias current supply circuits B1–B15 are connected in series through the resistor elements RB1–RB15. Thus, the bias voltage to be set up for the comparators CP6, CP7 and CP10, CP11 turns to be a voltage value obtained by dividing the bias voltages VA, VB with the resistor elements RB5–RB7 and RB9–RB11. This circuit is actuated in a state in which an intermediate bias current is supplied.

As a result of the above-described bias current setting, a further limited current value is supplied to the comparators CP7, CP10 of the comparators CP7–CP10 existing within a voltage change range of the input voltage VIN in the A/D conversion operation period. However, in which voltage range the input voltage VIN exists in voltage change range V7–V10 can be determined with two comparators CP8, CP9 existing inward of the four comparators CP7–CP10. Therefore, a sufficient bias current only has to be supplied to the comparators CP8, CP9 of the comparators CP7–CP10.

This setting is carried out by providing with comparators CP21–CP35 having the same structure as the comparators CP1–CP15 and for outputting the same comparison result and then inputting output signals OUT21–OUT35 to the bias voltage control circuit BC. That is, based on the A/D conversion result at some point of time, supply of the bias current to the respective comparators CP1–CP15 in a next A/D conversion operation can be set up. This setting only has to be carried out in a cycle of each of the clock signals CLK1, CLK2 and its operation performance can be lower than the comparators CP1–CP15 for carrying out the A/D conversion operation. Therefore, the bias current to be supplied to the comparators CP21–CP35 can be limited, so that the comparators CP21–CP35 can execute low current consumption operation.

Figure 43:
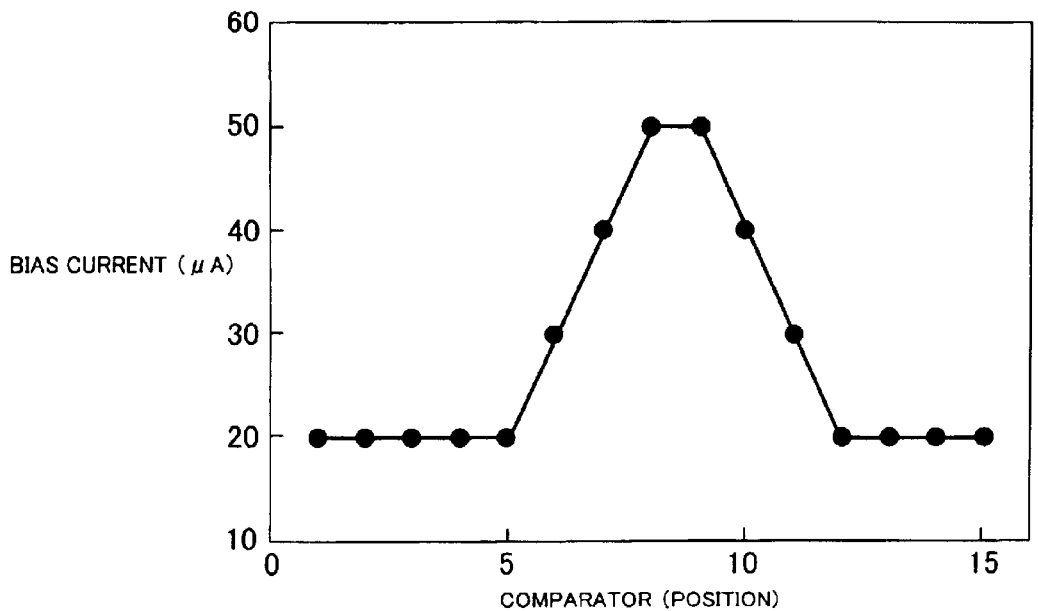
FIG. 43 is bias current of each comparator in case input voltage CIN is in a region of V8–V9.

The bias current to the respective comparators CP1–CP15 described above is shown in FIG. 43. In FIG. 43, it is assumed that the bias currents to be supplied from the bias voltages VA, VB are 20 $\mu$A, 50 $\mu$A respectively. This Figure indicates the type of the comparators CP1–CP15 on its abscissa axis and the bias current on its ordinate axis.

50 $\mu$A bias current is supplied to the comparators CP8, CP9 in which the bias voltage VB is set up. On the other hand, 20 $\mu$A bias current is supplied to the comparators CP1–CP5 and CP12–CP15 in which the bias voltage VA is set up. Because a voltage obtained by dividing the bias voltages VA, VB equally is set up on the comparators CP6, CP7 and CP10, CP11 in which no bias voltage is set up directly, the bias current is also divided equally. Therefore, 30 $\mu$A bias current is supplied to the comparators CP6, CP11 while 40 $\mu$A bias current is supplied to the comparators CP7, CP10.

Figure 44:
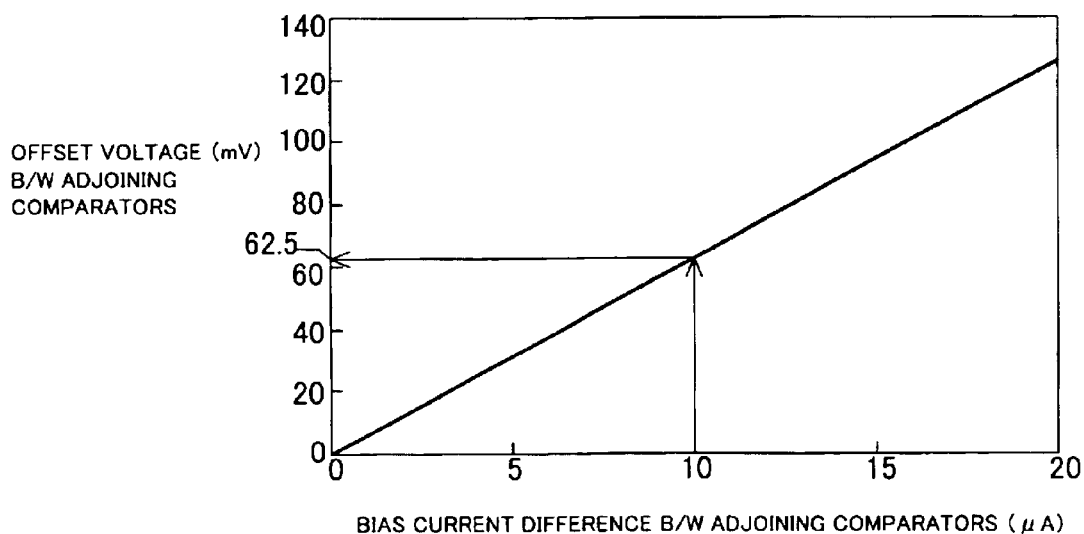
FIG. 44 shows relation of offset voltage with reference to bias current difference between comparators.

What must be noticed here is an existence of offset voltage caused from a difference of the bias current supplied to the comparators. It is generally known that if the bias current supplied to two comparators are different, offset voltage occurs between those comparators as shown in FIG. 44. This Figure indicates that the offset voltage increases corresponding to the difference in the bias current. If this offset voltage is increased over the quantity of an output code, no proper output code is outputted but miscode is produced.

According to the embodiment of FIG. 37, a voltage obtained by dividing input voltage range from the low voltage level VRL to the high voltage level VRH equally to 16 portions is a voltage range of an output code. For example, if VRH=2V and VRL=0.5V, the voltage range of an output code is (2−0.5)÷16≈94 mV. The offset voltage which generates no miscode needs to be less than 94 mV. As evident from FIG. 8, the bias current difference between adjacent comparators needs to be less than about 15 μA.

Thus, in an embodiment in which as comparators sandwiched by the comparators CP1–CP5, CP12–CP15 and CP8, CP9 in which the bias current is set to 20 μA and 50 μA, two comparators exist on each side as pairs of the comparators CP6, CP7 and CP10, CP11 (see FIG. 42), the bias current difference between adjacent comparators is 10 μA. As evident from FIG. 44, the offset voltage is 62.5 mV, which is an offset voltage of less than 94 mV, in which miscode is generated, but a miscode accompanying the A/D conversion operation is not generated.

If the quantity of the comparators in which no bias voltage is set up directly from outside is increased further from two, the bias current difference is further decreased, so that the offset voltage can be improved.

The voltage range corresponding to the quantity of an output code can be set appropriately by adjustment corresponding to the low voltage level VRL, the high voltage level VRH and the number of output codes thereby preventing occurrence of the miscode. A sufficient bias current is secured for comparators existing within a range of the voltage change quantity of the input voltage VIN in the A/D conversion operation period so as to maintain a conversion speed and the bias current is limited to comparators existing out of the voltage change range of the input voltage VIN. Low current consumption operation can be carried out with the comparators CP21–CP35 which execute low bias current operation. At the same time, occurrence of the offset voltage between the comparators can be suppressed, thereby preventing miscode in the A/D conversion operation.

Although in the above description, a case where the input voltage VIN is in a voltage level V8 to V9 at the A/D conversion operation time has been described as an example, needless to say, the same setting can be carried out for a case where it is on other voltage level.

Figure 45:
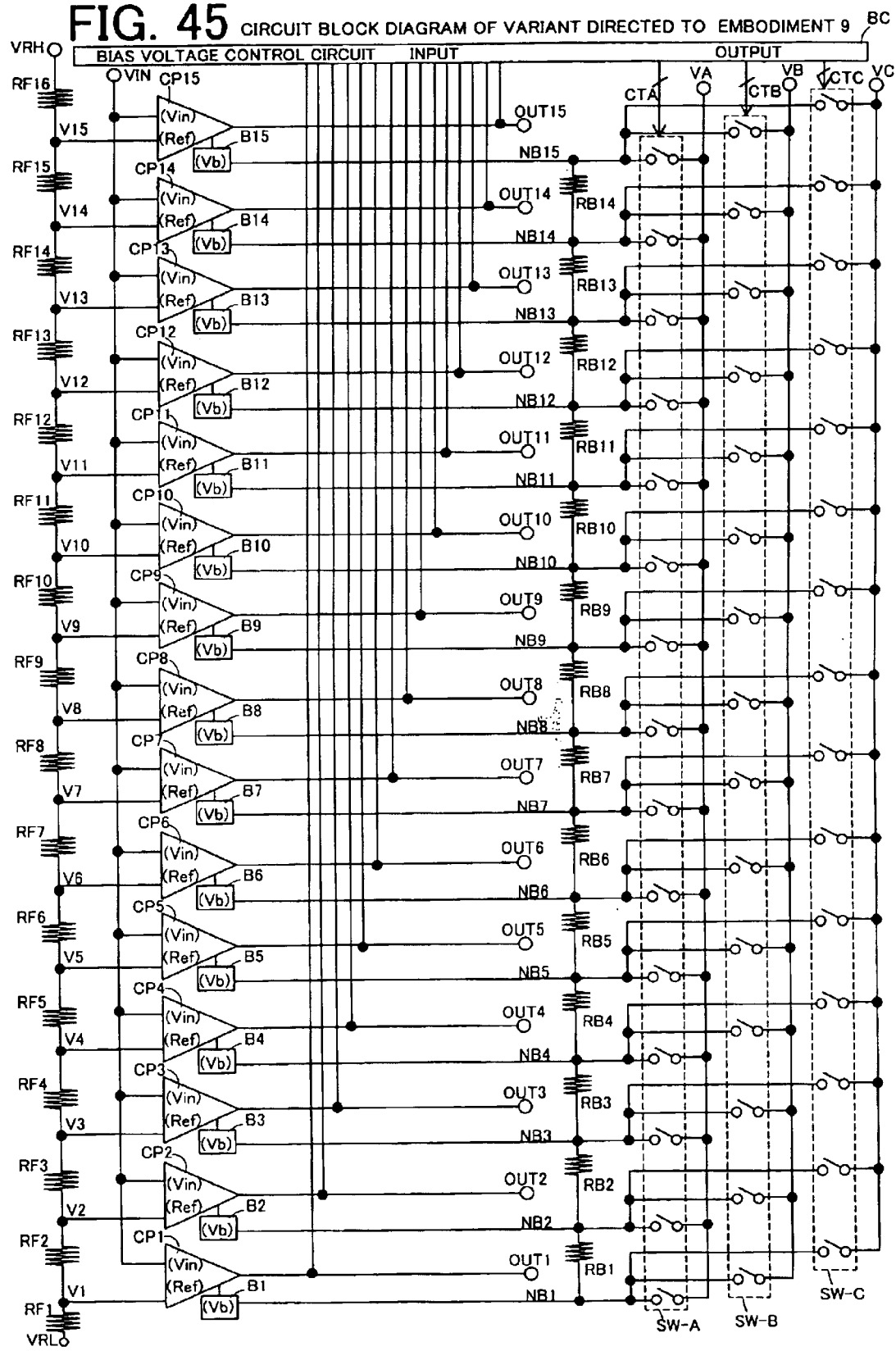
FIG. 45 is a circuit block diagram of a variant directed to the Embodiment 9.
Figure 46:
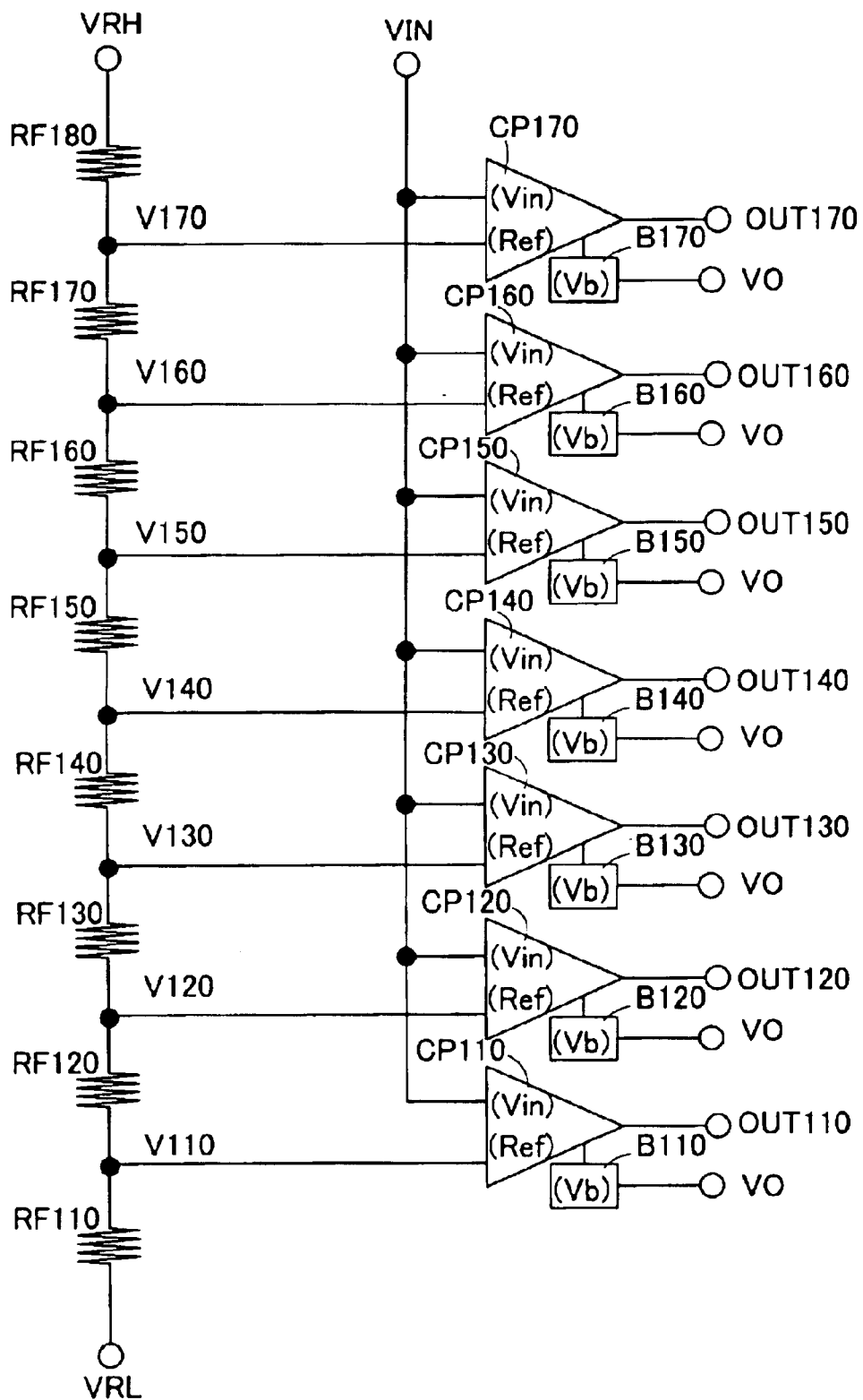
FIG. 46 is a circuit diagram of conventional A/D converter circuit.

FIG. 45 shows a modification of the A/D converter circuit of the embodiment of the present invention. This structure is achieved by excluding the comparators CP21–CP35 and the bias current supply circuits B21–B35 in FIG. 37. Instead of the output signals OUT21–OUT35 of the comparators CP21–CP35, output signals OUT1–OUT15 of the comparators CP1–CP15 are inputted into the bias voltage control circuit BC. Because in FIG. 37, as regards the comparators CP1–CP15 and the comparators CP21–CP35, the same input signals (input voltage VIN and reference voltages V1–V15) are inputted to comparators which are located within the same voltage change quantity at such a conversion velocity which secures a sufficient bias current, the same output signals are obtained and this modification is enabled. Further, a switch section SW-C which is controlled by a control signal CTC with respect to a third bias voltage VC is provided.

Because the switch section SW-C is provided as well as the switch sections SW-A, SW-B and the bias voltage VC is set up on bias voltage lines NB1–NB15 selected by the control signal CTC, three kinds of the bias voltages VA–VC can be set up. By setting up the respective bias voltages VA–VC on a bias voltage line and an intermediate bias voltage lines located up to a predetermined position from the bias voltage lines NB1, NB15 on both ends, four or more kinds of bias currents can be supplied to bias voltage lines in which the bias voltages VA–VC are not set up directly as well.

Further, because the comparators CP21–CP35 and the bias current supply circuits B21–B35 are not provided, lower power consumption operation is enabled. This modification enables reduction of the circuit size, which is very convenient.

As described in detail above, the resistor elements RB1–RB15 are connected in series between the bias current setting terminals (Vb) in the current supply circuit and A/D converter circuit of this embodiment. Thus, a voltage obtained by dividing the respective predetermined bias voltages VA, VB with the resistor elements RB1–RB15 is set up on the bias current setting terminals (Vb) in which the predetermined bias voltages VA, VB are not set up. The comparators CP1–CP15 sandwiched by the comparators CP1–CP15 which are comparators activated in a different condition can be supplied with an intermediate bias current between bias currents supplied by the predetermined bias voltages VA, VB.

The comparators CP8, CP9 which are first comparators performing comparison operation to a predetermined voltage region, which is a region in which the voltage changes at a next A/D conversion operation and includes the voltage value of the input voltage VIN, can maintain a normal comparison condition by the bias voltage VB, which is a first setting voltage so as to secure a rapid comparison operation. Because the comparators CP1–CP5 and CP12–CP15, which are second comparators performing comparison operation to voltage value out of the predetermined voltage region, do not have to maintain the normal comparison operation condition, the bias current can be reduced by the bias voltage VA, which is a second setting voltage, thereby achieving power saving condition.

While a sufficient bias current is secured for comparators located within a voltage change range of the input voltage VIN in the A/D conversion operation period to maintain the conversion speed, the bias current to comparators located out of the voltage change range of the input voltage VIN is limited. This enables low current consumption operation together with the comparators CP21–CP35 in which a low bias current operation is performed. At the same time, occurrence of the offset voltage between the comparators can be suppressed, thereby preventing miscode in the A/D conversion operation.

Here, the prevention of miscode in the A/D conversion operation can be achieved by setting the voltage range corresponding to the quantity of an output code through adjustment depending on the low voltage level VRL, high voltage level VRH, and number of output codes.

If the predetermined bias voltages VA, VB are set up on three or more bias current setting terminals (Vb) including its both ends, three or more kinds of the bias currents can be supplied to each of the comparators CP1–CP15. Further, if the predetermined bias voltages VA–VC are set up on four or more bias current setting terminals (Vb) including its both ends and bias current setting terminals (Vb) at intermediate position, four or more kinds of the bias currents can be supplied to each of the comparators CP1–CP15.

Further, the setting of the bias voltages VA–VC can be carried out by controlling the switch sections according to the control signals CTA-CTC.

Further, the offset voltage between the adjacent comparators CP1–CP15 can be set smaller as compared to a voltage resolution in the A/D converter circuit, no conversion error is generated in the A/D conversion operation.

In the meantime, the present invention is not restricted to the above-described embodiments, and needless to say, the present invention may be improved or modified within a scope not departing from the gist of the present invention.

For example, although in this embodiment, an A/D converter circuit has been described as an example of the function circuit, the present invention is not restricted to this example. For example, the present invention, according to which a bias current capable of securing a sufficient circuit operation is supplied to only a circuit unit expected to be activated at a next operation while the bias current to a circuit unit not expected to be activated is limited to perform low current consumption operation can be applied to such a function circuit in which a next operation condition is determined depending on a current operation condition. A circuit unit not related directly to the circuit operation can be activated under low current consumption while maintaining its circuit operation performance.

Although an example in which the bias current is set up by two or three kinds of the bias voltages VA–VC has been described, it is permissible to set up four or more kinds of the bias voltages by providing with further switch sections.

Although an example in which two comparators exist between comparators set up by the bias voltages VA, VB has been described, it is permissible to set up the number of the comparators appropriately and adjust the bias current difference depending on a offset voltage accompanying a bias current difference and further, depending on a voltage range corresponding to the quantity of an output code corresponding to the low voltage level VRL, high voltage level VRH and the number of output codes. Consequently, the offset voltage between the comparators can be adjusted.

The present invention enables provision of an A/D converter circuit including a parallel-type A/D conversion section having plural comparators, specifically a current supply circuit and an A/D converter circuit capable of reducing bias current for comparators whose comparison condition does not change while securing a necessary bias current for comparators whose comparison condition changes so as to maintain the circuit performance upon A/D conversion operation.

What is claimed is:

1. An A/D converter circuit, which is a parallel-type A/D converter circuit for converting an inputted analog voltage to a digital value on the basis of a first clock signal using multiple first comparators, the multiple first comparators being constructed so that for each either of a normal operating state and a low consumed power state can be selected by means of a control signal, comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the normal operating state and holds the remainder of the first comparators in the low consumed power state.

2. An A/D converter circuit, which is a parallel-type A/D converter circuit for converting an inputted analog voltage to a digital value on the basis of a first clock signal using multiple first comparators, the multiple first comparators being constructed so that for each either of an operating state and a resting state can be selected by means of a control signal, comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the operating state and holds the remainder of the first comparators in the resting state.

3. An A/D converter circuit according to claim 2, wherein the comparator control circuit section uses the second clock signal which while synchronized with the first clock signal has a different phase from this or a frequency an integer multiple of the first clock signal.

4. An A/D converter circuit according to claim 2, comprising an input information generating circuit section, having q second comparators operating under the first clock signal or second clock signal and each referring to one of q (q is a natural number such that q>3) reference voltages and respectively comparing the analog voltage inputted the predetermined time past with the reference voltages, which outputs the comparison results as the input information signal.

5. An A/D converter circuit according to claim 4, having q of the first comparators each referring to one of the q reference voltages and respectively comparing the present analog voltage and the reference voltages.

6. An A/D converter circuit according to claim 4, having q of the first comparators each referring to one of the q reference voltages and respectively comparing the present analog voltage and the reference voltages, wherein the comparator control circuit section, when it has inputted an input information signal indicating that at least one second comparator having determined that the analog voltage inputted the predetermined time past is larger than its reference voltage exists, brings to the operating state the specified first comparator which refers to the same reference voltage as the reference voltage to which the highest-level second comparator among the second comparators having made the above determination refers, and in a predetermined case at least one of the first comparators adjacent to this specified first comparator, and holds the remaining first comparators in the resting state, and when it has inputted an input information signal indicating that a second comparator having determined that the analog voltage inputted the predetermined time past is larger than its reference voltage does not exist, brings the lowest-level first comparator to the operating state, and holds the remaining first comparators in the resting state.

7. An A/D converter circuit according to claim 6, wherein the predetermined case is the case where there exists at least one higher-level first comparator than the specified first comparator.

8. An A/D converter circuit according to claim 4, wherein the input information generating circuit section, using the second clock signal, generates the input information signal generated on the basis of the analog voltage inputted a shorter time past than 1 cycle of the first clock signal.

9. An A/D converter circuit according to claim 2, having the first comparators, which are m of the first comparators each referring to one of m (m is a natural number such that m>7) reference voltages, divided into n (n is a natural number such that n>3, m≧n) groupings each including int(m/n) or int(m/n)+1 first comparators in rank from low-level to high-level or from high-level to low-level (where int(a) is a function taking out the integer part of a real number a), and the n−1 second comparators, which each refer to, of the m reference voltages, one of the n−1 grouping reference voltages to which refer, among the first comparators belonging to the n−1 groupings excluding the lowest-level grouping, the lowest-level first comparators in the groupings, each positioned at the lowest level within its grouping, and which operate under the first clock signal or second clock signal and with timing determined by this clock signal respectively compare the inputted analog voltage and the grouping reference voltages and make the comparison results the input information signal, wherein the comparator control circuit section, on the basis of the comparison results of the n−1 second comparators, which is the input information signal, brings the first comparators to either the operating state or the resting state by the groupings.

10. An A/D converter circuit according to claim 2, having the first comparators, which are m of the first comparators each referring to one of m (m is a natural number such that m>7) reference voltages, divided into n (n is a natural number such that n>3, m≧2n) groupings each including int(m/n) or int(m/n)+1 first comparators in rank from low-level to high-level or from high-level to low-level (where int(a) is a function taking out the integer part of a real number a), and the n−1 second comparators, which each refer to, of the m reference voltages, one of the n−1 grouping reference voltages to which refer, among the first comparators belonging to the n−1 groupings excluding the lowest-level grouping, the lowest-level first comparators in the groupings, each positioned at the lowest level within its grouping, and which operate under the first clock signal or second clock signal and with timing determined by this clock signal respectively compare the inputted analog voltage and the grouping reference voltages and make the comparison results the input information signal, wherein the comparator control circuit section, when the comparison results indicate that at least one second comparator having determined that the analog voltage is larger than its grouping reference voltage exists, brings to the operating state the first comparators belonging to, of the above-mentioned groupings, the specified grouping to which belongs the first comparator referring to the same reference voltage as the grouping reference voltage to which the highest-level second comparator among the second comparators having made the above determination refers, and when a grouping one level higher than this specified grouping exists, this grouping one level higher, and when a grouping one level lower than this specified grouping exists, this grouping one level lower, and holds the first comparators belonging to the remaining groupings in the resting state, and when the comparison results indicate that a second comparator having determined that the analog voltage is larger than its grouping reference voltage does not exist, brings to the operating state the first comparators belonging to the lowest-level grouping and the grouping one level higher than the lowest level, and holds the first comparators belonging to the remaining groupings in the resting state.

11. An A/D converter circuit according to claim 4, wherein the second comparators are all differential-type comparators which output a comparison result under the first clock signal or second clock signal.

12. An A/D converter circuit according to claim 2, wherein the multiple first comparators are all chopper-type comparators, and the resting state includes a state in which, among switch devices included in this chopper-type comparator, a short-circuiting switch device used for causing an intrinsic voltage of a logic device to arise by short-circuiting its input terminal and its output terminal is open.

13. An A/D converter circuit according to claim 2, wherein the multiple first comparators are all differential-type comparators, and the resting state includes a state in which a current flowing through a constant current source included in this differential-type comparator is cut off.

14. An A/D converter circuit, which is a parallel-type A/D converter circuit for converting an inputted analog voltage to a digital value on the basis of a clock signal using multiple comparators, the multiple comparators being constructed so that for each either of a normal operating state and a low consumed power state can be selected by means of a control signal, comprising a comparator control circuit section for, in accordance with an input information signal generated on the basis of the analog voltage used in the preceding conversion, outputting the control signal, which, of the multiple comparators, brings some of the comparators to the normal operating state and holds the remainder of the comparators in the low consumed power state in the present conversion.

15. An A/D converter circuit, which is a parallel-type A/D converter circuit for converting an inputted analog voltage to a digital value on the basis of a clock signal using multiple comparators, the multiple comparators being constructed so that for each either of an operating state and a resting state can be selected by means of a control signal, comprising a comparator control circuit section for, in accordance with an input information signal generated on the basis of the analog voltage used in the preceding conversion, outputting the control signal, which, of the multiple comparators, brings some of the comparators to the operating state and holds the remainder of the comparators in the resting state in the present conversion.

16. An A/D converter circuit according to claim 15, which uses the outputs of the multiple comparators in the preceding conversion also as the input information signal.

17. An A/D converter circuit according to claim 15,
having p of the comparators, each referring to one of p (p is a natural number such that p>3) reference voltages,
wherein the comparator control circuit section,
when at least one comparator having determined in the preceding conversion that the inputted analog voltage was larger than its reference voltage exists,
brings to the operating state the specified comparator which is at the highest level among the comparators having made the above determination and, in a predetermined case, at least one of the comparators adjacent to this specified comparator,
and holds the remaining comparators in the resting state,
and when a comparator having determined in the preceding conversion that the inputted analog voltage was larger than its reference voltage does not exist,
brings to the operating state the lowest-level comparator,
and holds the remaining comparators in the resting state.

18. An A/D converter circuit according to claim 17,
wherein the predetermined case is the case where there exists at least one higher-level comparator than the specified comparator which is at the highest level.

19. An A/D converter circuit according to claim 15,
having m of the comparators each referring to one of m (m is a natural number such that m>7) reference voltages,
wherein when the comparators are divided into n (n is a natural number such that n>3, m≧2n) groupings each including int(m/n) or int(m/n)+1 comparators in rank from low-level to high-level or from high-level to low-level (where int(a) is a function taking out the integer part of a real number a),
the comparator control circuit section brings the comparators to either of the operating state and the resting state by the groupings.

20. An A/D converter circuit according to claim 15,
having m of the comparators each referring to one of m (m is a natural number such that m>7) reference voltages,
wherein when the comparators are divided into n (n is a natural number such that n>3, m≧2n) groupings each including int(m/n) or int(m/n)+1 comparators in rank from low-level to high-level or from high-level to low-level (where int(a) is a function taking out the integer part of a real number a),
the comparator control circuit section,
when at least one comparator having determined in the preceding conversion that the inputted analog voltage was larger than its reference voltage exists,
brings to the operating state the comparators belonging to the specified grouping to which belongs the highest-level comparator among the comparators having made the above determination and at least one of the groupings adjacent to this specified grouping,
and holds the comparators belonging to the remaining groupings in the resting state,
and when a comparator having determined in the preceding conversion that the inputted analog voltage was larger than its reference voltage does not exist,
brings to the operating state the comparators belonging to the lowest-level grouping or the lowest-level grouping and the grouping one level higher than the lowest level,
and holds the comparators belonging to the remaining groupings in the resting state.

21. AN A/D converter circuit according to claim 15,
wherein the multiple comparators are all chopper-type comparators,
and the resting state includes bringing to an open state, among switch devices included in this chopper-type comparator, a short-circuiting switch device used for causing an intrinsic voltage of a logic device to arise by short-circuiting its input terminal and its output terminal.

22. An A/D converter circuit according to claim 15,
wherein the multiple comparators are all differential-type comparators,
and the resting state includes a state in which a current flowing through a constant current source included in this differential-type comparator is cut off.

23. An A/D converter circuit,
which is a parallel-type A/D converter circuit for converting an inputted analog voltage to a digital value on the basis of a first clock signal using multiple first comparators,
the multiple first comparators being constructed so that for each either of a normal operating state and a low power operating state can be selected by means of a control signal,
comprising a comparator control circuit section for, in accordance with an input information signal generated on the basis of the analog voltage inputted a predetermined time past using the first clock signal or a second clock signal different from this, outputting the control signal, which, of the multiple first comparators, brings some of the first comparators to the normal operating state and holds the remainder of the first comparators in the low power operating state.

24. An A/D converter circuit according to claim 23,
wherein the comparator control circuit section uses the second clock signal which while synchronized with the first clock signal has a different phase from this or a frequency an integer multiple of the first clock signal.

25. An A/D converter circuit according to in claim 23,
comprising an input information generating circuit section, having q second comparators operating under the first clock signal or second clock signal and each referring to one of q (q is a natural number such that q>3) reference voltages and respectively comparing the analog voltage inputted the predetermined time past with the reference voltages, which outputs the comparison results as the input information signal.

26. An A/D converter circuit according to claim 25,
having q of the first comparators each referring to one of the q reference voltages and respectively comparing the present analog voltage and the reference voltages.

27. An A/D converter circuit according to claim 25,
having q of the first comparators each referring to one of the q reference voltages and respectively comparing the present analog voltage and the reference voltages,
wherein the comparator control circuit section,
when it has inputted an input information signal indicating that at least one second comparator having determined that the analog voltage inputted the predetermined time past is larger than its reference voltage exists,
of the q first comparators,
brings to the normal operating state the specified first comparator which refers to the same reference voltage as the reference voltage to which the highest-level second comparator among the second comparators having made the above determination refers, and when a first comparator one level higher than this specified first comparator exists, this first comparator one level higher, and when a first comparator two levels higher than the specified first comparator exists, this first comparator two levels higher, and when a first comparator one level lower than the specified first comparator exists, this first comparator one level lower, and brings the remaining first comparators to the low power operating state, and when it has inputted an input information signal indicating that a second comparator having determined that the analog voltage inputted the predetermined time past is larger than its reference voltage does not exist, brings to the normal operating state the lowest-level first comparator and the first comparator one level higher than the lowest-level, and brings the remaining first comparators to the low power operating state.

28. An A/D converter circuit according to claim 25, wherein the input information generating circuit section, using the second clock signal, generates an input information signal generated on the basis of the analog voltage inputted a shorter time past than 1 cycle of the first clock signal.

29. An A/D converter circuit according to in claim 23, having the first comparators, which are m of the first comparators each referring to one of m (m is a natural number such that m>7) reference voltages, divided into n (n is a natural number such that n>3, m≧2n) groupings each including int(m/n) or int(m/n)+1 first comparators in rank from low-level to high-level or from high-level to low-level (where int(a) is a function taking out the integer part of a real number a), and the n−1 second comparators, which each refer to, of the m reference voltages, one of the n−1 grouping reference voltages to which refer, among the first comparators belonging to the n−1 groupings excluding the lowest-level grouping, the lowest-level first comparators in the groupings, each positioned at the lowest level within its grouping, and which operate under the first clock signal or second clock signal and with timing determined by this clock signal respectively compare the inputted analog voltage and the grouping reference voltages and make the comparison results the input information signal, wherein the comparator control circuit section, on the basis of the comparison results of the n−1 second comparators, which is the input information signal, brings the first comparators to either the normal operating state or the low power operating state by the groupings.

30. An A/D converter circuit according to in claim 23, having the first comparators, which are m of the first comparators each referring to one of m (m is a natural number such that m>7) reference voltages, divided into n (n is a natural number such that n>3, m≧2n) groupings each including int(m/n) or int(m/n)+1 first comparators in rank from low-level to high-level or from high-level to low-level (where int(a) is a function taking out the integer part of a real number a), and the n−1 second comparators, which each refer to, of the m reference voltages, one of the n−1 grouping reference voltages to which refer, among the first comparators belonging to the n−1 groupings excluding the lowest-level grouping, the lowest-level first comparators in the groupings, each positioned at the lowest level within its grouping, and which operate under the first clock signal or second clock signal and with timing determined by this clock signal respectively compare the inputted analog voltage and the grouping reference voltages and make the comparison results the input information signal, wherein the comparator control circuit section, when the comparison results indicate that at least one second comparator having determined that the analog voltage is larger than its grouping reference voltage exists, brings to the normal operating state the first comparators belonging to, of the above-mentioned groupings, the specified grouping to which belongs the first comparator referring to the same reference voltage as the grouping reference voltage to which the highest-level second comparator among the second comparators having made the above determination refers, and when a grouping one level higher than this specified grouping exists, this grouping one level higher, and when a grouping two levels higher than this specified grouping exists, this grouping two levels higher, and when a grouping one level lower than this specified grouping exists, this grouping one level lower, and when a grouping two levels lower than this specified grouping exists, this grouping two levels lower, and holds the first comparators belonging to the remaining groupings in the low power operating state, and when the comparison results indicate that a second comparator having determined that the analog voltage is larger than its grouping reference voltage does not exist, brings to the normal operating state the first comparators belonging to the lowest-level grouping and the groupings one and two levels higher than the lowest level, and holds the first comparators belonging to the remaining groupings in the low power operating state.

31. An A/D converter circuit according to claim 25, wherein the second comparators are all differential-type comparators which output a comparison result under the first clock signal or the second clock signal.

32. An A/D converter circuit according to claim 23, wherein the multiple first comparators are all-chopper-type comparators, and this chopper-type comparator includes a logic device constructed so that it is possible to select at least either of a normal state, in which when an intrinsic voltage is made to arise by its own input terminal and output terminal being short-circuited a relatively large through current flows, and a low power state, in which the through current which flows when the intrinsic voltage is made to arise is relatively smaller than in the normal state and consequently the consumed power is lower than in the normal state, and the low power operating state includes the low power state being selected for the logic device of this chopper-type comparator.

33. An A/D converter circuit according to claim 23, wherein the multiple first comparators are all differential-type comparators, and this differential-type comparator is constructed so that it is possible to select either of a normal state, in which a first constant current flows through a differential circuit included in this comparator, and a low power state, in which a second constant current relatively smaller than the first constant current flows through the differential circuit and consequently the consumed power is lower than in the normal state, and the low power operating state includes the low power state being selected for this differential-type comparator.

34. An A/D converter circuit, which is a parallel-type A/D converter circuit for converting an inputted analog voltage to a digital value on the basis of a clock signal using multiple comparators, the multiple comparators being constructed so that for each either of a normal operating state and a low power operating state can be selected by means of a control signal, comprising a comparator control circuit section for, in accordance with an input information signal generated on the basis of the analog voltage used in the preceding conversion, outputting the control signal, which, of the multiple comparators, brings some of the comparators to the normal operating state and holds the remainder of the comparators in the low power operating state in the present conversion.

35. An A/D converter circuit according to claim 34, which uses the outputs of the multiple comparators in the preceding conversion also as the input information signal.

36. An A/D converter circuit according to in claim 34, having p of the comparators, each referring to one of p (p is a natural number such that p>3) reference voltages, wherein the comparator control circuit section, when at least one comparator having determined in the preceding conversion that the inputted analog voltage was larger than its reference voltage exists, brings to the normal operating state the specified comparator which is at the highest level among the comparators having made the above determination, and when a comparator one level higher than this specified comparator exists, this comparator one level higher, and when a comparator two levels higher than this specified comparator exists, this comparator two levels higher, and when a comparator one level lower than this specified comparator exists, this comparator one level lower, and brings the remaining comparators to the low power operating state, and when a comparator having determined in the preceding conversion that the inputted analog voltage was larger than its reference voltage does not exist, brings to the normal operating state the lowest-level comparator and the comparator one level higher than the lowest-level, and brings the remaining comparators to the low power operating state.

37. An A/D converter circuit according to in claim 34, having m of the comparators each referring to one of m (m is a natural number such that m>7) reference voltages, wherein when the comparators are divided into n (n is a natural number such that n>3, m≧2n) groupings each including int(m/n) or int(m/n)+1 comparators in rank from low-level to high-level or from high-level to low-level (where int(a) is a function taking out the integer part of a real number a), the comparator control circuit section brings the comparators to either of the normal operating state and the low power operating state by the groupings.

38. An A/D converter circuit according to claim 34, having m of the comparators each referring to one of m (m is a natural number such that m>7) reference voltages, wherein when the comparators are divided into n (n is a natural number such that n>3, m≧2n) groupings each including int(m/n) or int(m/n)+1 comparators in rank from low-level to high-level or from high-level to low-level (where int(a) is a function taking out the integer part of a real number a), the comparator control circuit section, when at least one comparator having determined in the preceding conversion that the inputted analog voltage was larger than its reference voltage exists, brings to the normal operating state the comparators belonging to the specified grouping to which belongs the highest-level comparator among the comparators having made the above determination, and when a grouping one level higher than this specified grouping exists, this grouping one level higher, and when a grouping two levels higher than this specified grouping exists, this grouping two levels higher, and when a grouping one level lower than this specified grouping exists, this grouping one level lower, and when a grouping two levels lower than this specified grouping exists, this grouping two levels lower, and brings the comparators belonging to the remaining groupings to the low power operating state, and when a comparator having determined in the preceding conversion that the inputted analog voltage was larger than its reference voltage does not exist, brings to the normal operating state the comparators belonging to the lowest-level grouping and the grouping one level higher than the lowest level, or the lowest-level grouping and the groupings one and two levels higher than the lowest level, and brings the comparators belonging to the remaining groupings to the low power operating state.

39. An A/D converter circuit according to claim 34, wherein the multiple comparators are all chopper-type comparators, and this chopper-type comparator includes a logic device constructed so that it is possible to select at least either of a normal state, in which when an intrinsic voltage is made to arise by its own input terminal and output terminal being short-circuited a relatively large through current flows, and a low power state, in which the through current which flows when the intrinsic voltage is made to arise is relatively smaller than in the normal state and consequently the consumed power is lower than in the normal state, and the low power operating state includes the low power state being selected for the logic device of this chopper-type comparator.

40. An A/D converter circuit according to claim 34, wherein the multiple comparators are all differential-type comparators, and this differential-type comparator is constructed so that it is possible to select either of a normal state, in which a first constant current flows through a differential circuit included in this comparator, and a low power state, in which a second constant current relatively smaller than the first constant current flows through the differential circuit and consequently the consumed power is lower than in the normal state, and the low power operating state includes the low power state being selected for this differential-type comparator.

41. An A/D converter circuit including a parallel-type A/D conversion section provided with plurality of comparators, the A/D converter circuit comprising:

bias current supply sections for supplying bias current the bias current supply sections being provided for each of the plurality of comparators;

bias current setting terminals being provided for each of the bias current supply sections, bias voltage at the bias current setting terminals being set for adjusting the bias current; and resistor elements for connecting adjoining bias current setting terminals.

42. An A/D converter circuit according to claim 41, wherein, out of three or more of the bias current setting terminals connected in series by the resistor elements, predetermined bias voltage is set for bias current setting terminals located within predetermined distance from both ends including at least two bias current setting terminals of both ends.

43. An A/D converter circuit according to claim 41, wherein, out of four or more of the bias current setting terminals connected in series by the resistor elements, predetermined bias voltage is set for bias current setting terminals located within predetermined distance from both ends including at least two bias current setting terminals of both ends, and a bias current setting terminal at intermediate position.

44. An A/D converter circuit according claim 41 further comprising switch sections for controlling setting/non-setting of the bias voltage with respect to each of the bias current setting terminals.

45. An A/D converter circuit according to claims 41, wherein there are provided two or more types of the bias voltage different in their voltage values, and the switch sections are provided for each type of the bias voltage.

46. An A/D converter circuit according to claim 41, wherein in case two of the bias current setting terminals to which two types of the bias voltage different in their voltage values are set respectively and the bias current setting terminals at intermediate position are connected in series by the resistor elements, offset voltage derived from bias current difference of adjoining comparators set by the two types of the bias voltage and equally divided voltages divided by the resistor elements with reference to the bias current setting terminals at the intermediate position is small compared with inherent voltage resolution of the A/D converter circuit.

47. An A/D converter circuit according to claim 41, wherein in case two of the bias current setting terminals to which two types of the bias voltage different in their voltage values are set respectively and the bias current setting terminals at intermediate position are connected in series by the resistor elements, offset voltage derived from the bias current difference between the comparators set by two types of the bias voltage different in their voltage values is large compared with inherent voltage resolution of the A/D converter circuit.

48. An A/D converter circuit according to claim 41, wherein, the plurality of comparators are classified into at least first comparators, predetermined number of intermediate comparator adjoining to the first comparators, and second comparators, first setting voltage is set for the bias current setting terminals of the first comparators that operate comparison operation relating to reference voltages within predetermined voltage region including a voltage value of input voltage, and second setting voltage is set for the bias current setting terminals of the second comparators.

49. An A/D converter circuit according to claim 41, wherein, the predetermined number of intermediate comparators is number that offset voltage derived from the bias current difference set between the bias current setting terminals of the intermediate comparators due to divided voltages between the first setting voltage and the second setting voltage divided by the resistor elements that connects the bias current setting terminals of the first and second comparators in series is small compared with inherent voltage resolution of the A/D converter circuit.

* * * * *